United States Patent
Tagawa et al.

(10) Patent No.: US 10,670,967 B2
(45) Date of Patent: *Jun. 2, 2020

(54) RESIST PATTERNING METHOD, LATENT RESIST IMAGE FORMING DEVICE, RESIST PATTERNING DEVICE, AND RESIST MATERIAL

(71) Applicant: OSAKA UNIVERSITY, Osaka (JP)

(72) Inventors: Seiichi Tagawa, Suita (JP); Akihiro Oshima, Suita (JP)

(73) Assignee: OSAKA UNIVERSITY, Osaka (JP)

(*) Notice: Subject to any disclaimer, the term of this patent is extended or adjusted under 35 U.S.C. 154(b) by 150 days.

This patent is subject to a terminal disclaimer.

(21) Appl. No.: 15/956,214

(22) Filed: Apr. 18, 2018

(65) Prior Publication Data

US 2018/0231892 A1 Aug. 16, 2018

Related U.S. Application Data

(63) Continuation of application No. 14/769,410, filed as application No. PCT/JP2014/054068 on Feb. 20, 2014, now Pat. No. 9,977,332.

(30) Foreign Application Priority Data

Feb. 20, 2013 (JP) .................................. 2013-031125
Oct. 8, 2013 (JP) .................................. 2013-211479

(51) Int. Cl.
*G03F 7/20* (2006.01)
*G03F 7/38* (2006.01)
*G03F 7/32* (2006.01)

(52) U.S. Cl.
CPC ............ *G03F 7/2022* (2013.01); *G03F 7/203* (2013.01); *G03F 7/2032* (2013.01); *G03F 7/32* (2013.01); *G03F 7/38* (2013.01)

(58) Field of Classification Search
CPC .......... G03F 7/20; G03F 7/2004; G03F 7/2022
See application file for complete search history.

(56) References Cited

U.S. PATENT DOCUMENTS

| | | | |
|---|---|---|---|
| 5,286,612 A | 2/1994 | Telfer | |
| 5,330,882 A | 7/1994 | Kawaguchi et al. | |
| 5,453,345 A | 9/1995 | Grasshoff et al. | |
| 5,578,424 A | 11/1996 | Grasshoff et al. | |
| 9,005,871 B2 | 4/2015 | Yamato et al. | |
| 9,977,352 B2 * | 5/2018 | Nagasaka | ........... G03F 7/70883 |
| 2006/0269879 A1 | 11/2006 | Elian et al. | |
| 2011/0300484 A1 | 12/2011 | Yamato et al. | |

FOREIGN PATENT DOCUMENTS

| | | |
|---|---|---|
| JP | H04-278955 A | 10/1992 |
| JP | H04-363014 A | 12/1992 |
| JP | H05-021331 A | 1/1993 |
| JP | H05-144693 A | 6/1993 |
| JP | H06-053106 A | 2/1994 |
| JP | H08-503081 A | 4/1996 |
| JP | H08-222501 A | 8/1996 |
| JP | H09-251210 A | 9/1997 |
| JP | H10-198036 A | 7/1998 |
| JP | H11-031658 A | 2/1999 |
| JP | 2002-174894 A | 6/2002 |
| JP | 2003-255532 A | 9/2003 |
| JP | 2003-330168 A | 11/2003 |
| JP | 2005-150182 A | 6/2005 |
| JP | 2007-093866 A | 4/2007 |
| JP | 2007-248843 A | 9/2007 |
| JP | 2008-543033 A | 11/2008 |
| JP | 2009-258593 A | 11/2009 |
| JP | 2010-079270 A | 4/2010 |
| JP | 2010-151999 A | 7/2010 |
| TW | 201033167 A1 | 9/2010 |

OTHER PUBLICATIONS

International Search Report; PCT/JP2014/054068; dated Apr. 1, 2014.
Toshiba Technology Publication, vol. 13-29, Issue No. 95-3963.
An Office Action issued by the Taiwanese Patent Office dated Mar. 15, 2016, which corresponds to Taiwanese Patent Application No. 103105690 and is related to Appl. No. 14/769,410.

* cited by examiner

*Primary Examiner* — Kathleen Duda
(74) *Attorney, Agent, or Firm* — Studebaker & Brackett PC

(57) ABSTRACT

A resist patterning method according to the present invention includes: a resist layer forming step S101 of forming a resist layer (12) on a substrate (11); an activating step S103 of activating the resist layer by irradiation with an activating energy beam; a decay inhibiting step S105 of inhibiting decay of the activity of the resist layer; a latent pattern image forming step S107 of forming a latent pattern image in the activated resist layer by irradiation with a latent image forming energy beam; and a developing step S110 of developing the resist layer.

19 Claims, 40 Drawing Sheets

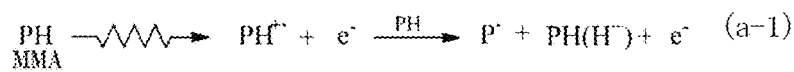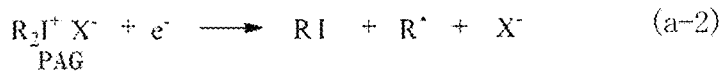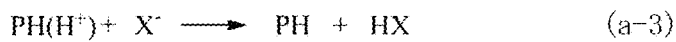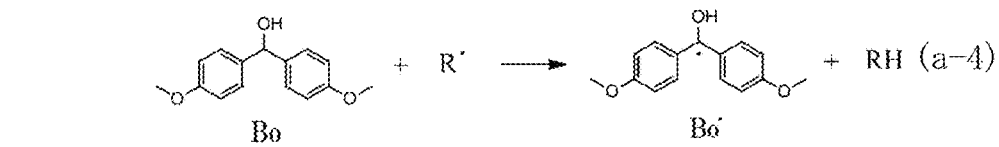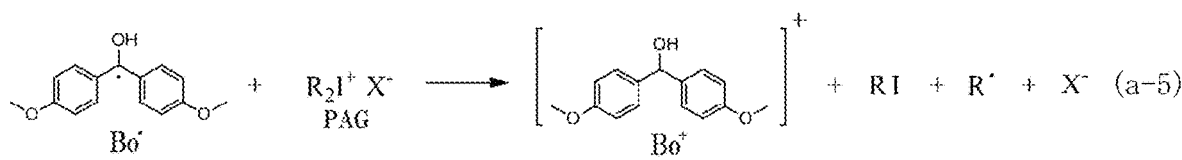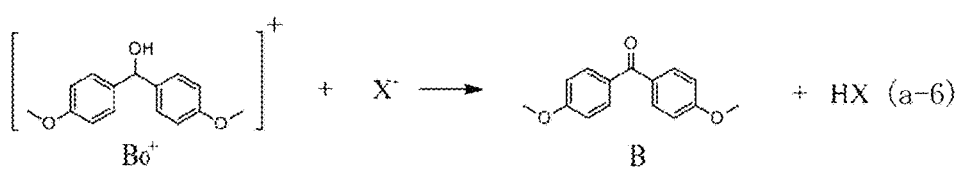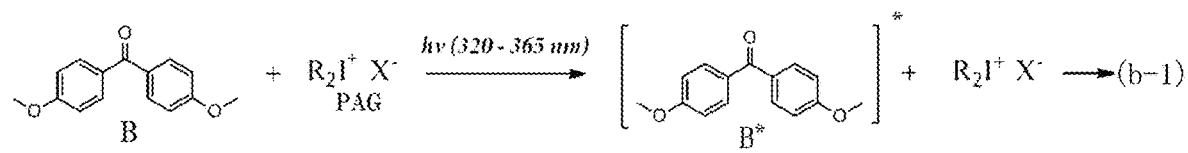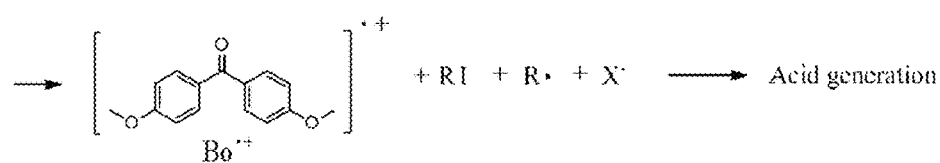
FIG. 21
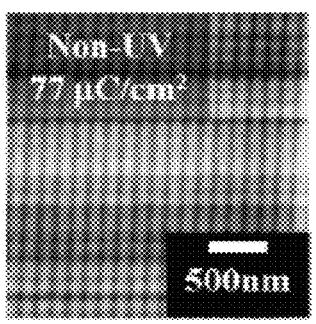 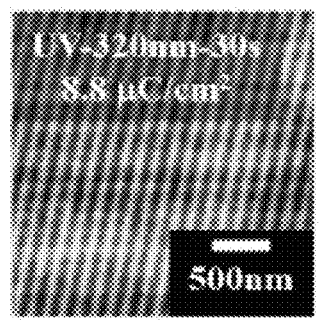 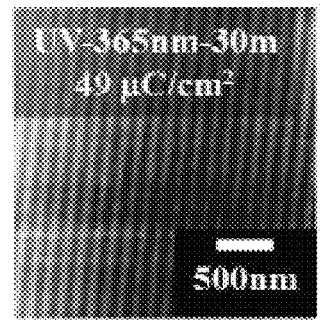
FIG. 22A  FIG. 22B  FIG. 22C

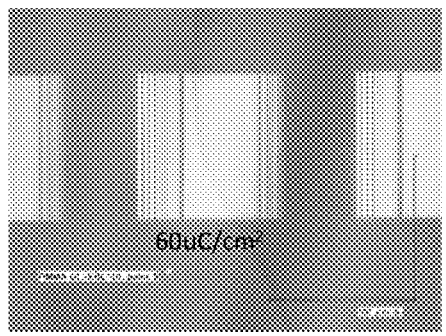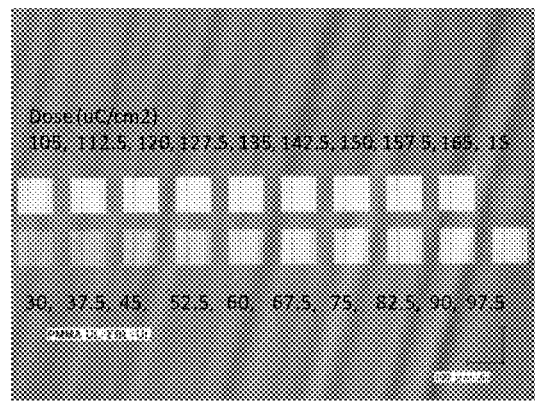
FIG. 29A
FIG. 29B
FIG. 29C

RESIST PATTERNING METHOD, LATENT RESIST IMAGE FORMING DEVICE, RESIST PATTERNING DEVICE, AND RESIST MATERIAL

TECHNICAL FIELD

The present invention relates to resist patterning methods, latent resist image forming devices, resist patterning devices, and resist materials.

BACKGROUND ART

There has been a demand for a finer pattern in an exposure process by a semiconductor device as circuit density and circuit speed are increased. As a main technique to achieve a finer pattern, decreasing the wavelength of an exposure source has been desired. For example, a technique using extreme ultraviolet light (EUV, wavelength: 13.5 nm) has undergone much development as being promising in production of next-generation semiconductor devices. However, it is difficult to develop a light source device with a high power (100 W) needed to apply the device to mass production; devices that have been developed so far have a power not more than 10 W and take time to complete exposure for forming a latent pattern image. Meanwhile, an electron beam direct writing method uses an electron beam (EB) having a small beam diameter and therefore allows formation of a fine pattern with high dimensional precision but takes more time to write a more complicated and larger-area pattern. As described above, the problem with the exposure techniques using extreme ultraviolet light or an electron beam is that the throughput is low while a fine pattern can be formed.

To solve the problem, improvement in the sensitivity of resist materials is being promoted with an aim to reduce exposure time as much as possible. For example, a resist composition disclosed in Patent Literature 1 is composed of a specified resin and a specified compound, and thus improved in sensitivity and resolution.

CITATION LIST

Patent Literature

[Patent Literature 1]
Japanese Patent Application Laid-Open Publication No. 2002-174894

SUMMARY OF INVENTION

Technical Problem

However, there is a trade-off between three important properties of a resist, that is, the sensitivity, the resolution, and the line width roughness (LWR); when the sensitivity of a resist is increased, the resolution decreases and the LWR increases. Thus, there is a limit to increasing the sensitivity of a resist without decreasing the resolution and without increasing the line width roughness, preventing the problem of low throughput from being sufficiently solved.

The present invention has been made in view of the problems noted above and aims to provide a resist patterning method, a latent resist image forming device, and a resist patterning device that can solve the trade-off and achieve an increased resist sensitivity. The present invention also aims to provide a high-sensitivity resist material.

Solution to Problem

A resist patterning method according to the present invention includes: a resist layer forming step of forming a resist layer on a substrate; an activating step of activating the resist layer by irradiation with an activating energy beam; a decay inhibiting step of inhibiting decay of the activity of the resist layer; a latent pattern image forming step of forming a latent pattern image in the activated resist layer by irradiation with a latent image forming energy beam; and a developing step of developing the resist layer.

A resist patterning method according to the present invention includes: a resist layer forming step of forming a resist layer on a substrate; an activating step of activating the resist layer by irradiation with an activating energy beam; a latent pattern image forming step of forming a latent pattern image in the activated resist layer by irradiation with a latent image forming energy beam while the resist layer is in an activated state; and a developing step of developing the resist layer.

In an embodiment, in the decay inhibiting step, an atmosphere surrounding the activated resist layer is an inert gas atmosphere, an active gas atmosphere, or a vacuum atmosphere.

In an embodiment, the resist patterning method according to the present invention further includes a conveying step of conveying the substrate from a location where the activating step is performed to a location where the latent pattern image forming step is performed.

In an embodiment, the activating step and the latent pattern image forming step are performed at the same time.

In an embodiment, the activating step includes an area irradiating step of applying the activating energy beam over an area within the resist layer and/or a pattern shape irradiating step of applying the activating energy beam in a pattern shape within the resist layer, the latent pattern image forming step includes an area irradiating step of applying the latent image forming energy beam over an area within the resist layer and/or a pattern shape irradiating step of applying the latent image forming energy beam in a pattern shape within the resist layer, in a situation in which the activating step includes the area irradiating step, the latent pattern image forming step includes at least the pattern shape irradiating step among the area irradiating step and the pattern shape irradiating step, and in a situation in which the activating step includes the pattern shape irradiating step, the latent pattern image forming step includes at least the area irradiating step among the area irradiating step and the pattern shape irradiating step.

A resist patterning method according to the present invention includes: a resist layer forming step of forming a resist layer on a substrate; a stable substance producing step of producing a stable substance in the resist layer by irradiation with an activating energy beam; a latent pattern image forming step of forming a latent pattern image in the resist layer including the stable substance by irradiation with a latent image forming energy beam; and a developing step of developing the resist layer.

In an embodiment, the resist patterning method according to the present invention further includes a transforming step of transforming the stable substance in the resist layer.

A latent resist image forming device according to the present invention is a latent resist image forming device including an activating device and a latent pattern image forming section, the activating device having an activating chamber for accommodating a resist layer and an activating energy source that emits an energy beam for activating the resist layer in the activating chamber, the latent pattern image forming section having a latent image forming chamber for accommodating the resist layer and a latent image forming energy source that emits an energy beam for forming a latent pattern image in the resist layer in the latent image forming chamber.

In an embodiment, the energy beam emitted from one of the activating energy source and the latent image forming energy source is applied over an area within the resist layer, and the energy beam emitted from the other of the activating energy source and the latent image forming energy source is applied in a pattern shape within the area of the resist layer.

In an embodiment, the latent image forming energy source and the activating energy source are a single energy source, or the latent image forming energy source and the activating energy source are different energy sources.

In an embodiment, an environment surrounding the resist layer is adjusted so as to inhibit decay of the activity of the resist layer in at least one of the activating chamber and the latent image forming chamber.

In an embodiment, the latent resist image forming device according to the present invention further includes a conveying device that conveys the substrate from the activating chamber to the latent image forming chamber.

In an embodiment, the latent image forming chamber and the activating chamber are a single chamber.

In an embodiment, at least one of the activating energy source and the latent image forming energy source includes an ion beam irradiation section, an electron beam irradiation section, or an electromagnetic wave irradiation section.

A resist patterning device according to the present invention includes the above-described latent resist image forming device and a developing device that develops the resist layer having the latent pattern image formed by the latent resist image forming device.

A resist material according to the present invention includes a resist composition containing a base resin and a sensitizer precursor. The resist composition produces a sensitizer when irradiated with a first energy beam but does not produce the sensitizer when irradiated with a second energy beam for promoting a resist reaction that is caused by the sensitizer.

In an embodiment, the base resin includes a methyl methacrylate resin.

In an embodiment, the resist composition further contains an acid generator.

In an embodiment, the acid generator and the sensitizer precursor may be a single substance.

In an embodiment, the resist composition further contains a quencher.

In an embodiment, the quencher does not react with the sensitizer.

BRIEF DESCRIPTION OF DRAWINGS

FIGS. 16A-16C are schematic illustrations showing concentration changes of an acid, a sensitizer, and a quencher in an embodiment of a resist material according to the present invention in which FIG. 16A shows the concentrations immediately after irradiation with an activating energy beam, FIG. 16B shows the concentrations after neutralization between the acid produced by the irradiation with the activating energy beam and the quencher, and FIG. 16C shows the concentrations after irradiation with a latent image forming energy beam.

FIGS. 17A-17C are schematic illustrations showing concentration changes of an acid, a sensitizer, and a quencher in an embodiment of the resist material according to the present invention in which FIG. 17A shows the concentrations immediately after irradiation with an activating energy beam, FIG. 17B shows the concentrations after neutralization between the acid produced by the irradiation with the activating energy beam and the quencher, and FIG. 17C shows the concentrations after irradiation with a latent image forming energy beam.

FIGS. 18A-18C are schematic illustrations showing concentration changes of an acid, a sensitizer, and a quencher in an embodiment of the resist material according to the present invention in which FIG. 18A shows the concentrations immediately after irradiation with an activating energy beam, FIG. 18B shows the concentrations after neutralization between the acid produced by the irradiation with the activating energy beam and the quencher, and FIG. 18C shows the concentrations after irradiation with a latent image forming energy beam.

FIGS. 20A-20C are schematic illustrations showing concentration changes of an acid, a sensitizer, and a quencher in an embodiment of the resist material according to the present invention in which FIG. 20A shows the concentrations immediately after irradiation with an activating energy beam, FIG. 20B shows the concentrations after neutralization between the acid produced by the irradiation with the activating energy beam and the quencher, and FIG. 20C shows the concentrations after irradiation with a latent image forming energy beam.

FIG. 21 shows equations of chemical reactions in the present embodiment.

FIGS. 22A-22C are diagrams showing results of developing in the present embodiment.

FIGS. 25A-25C are schematic illustrations showing concentration changes of an acid, a sensitizer, and a quencher in the present embodiment in which FIG. 25A shows the concentrations immediately after irradiation with an activating energy beam, FIG. 25B shows the concentrations after neutralization between the acid produced by the irradiation with the activating energy beam and the quencher, and FIG. 25C shows the concentrations after irradiation with a latent image forming energy beam.

FIGS. 29A-29C are diagrams showing results of developing in Examples 4 to 6.

DESCRIPTION OF EMBODIMENTS

Hereinafter, embodiments of a resist patterning method, a latent resist image forming device, a resist patterning device, and a resist material according to the present invention will be described with reference to the drawings. It should be noted that the present invention is not limited to the following embodiments.

Figure 2:
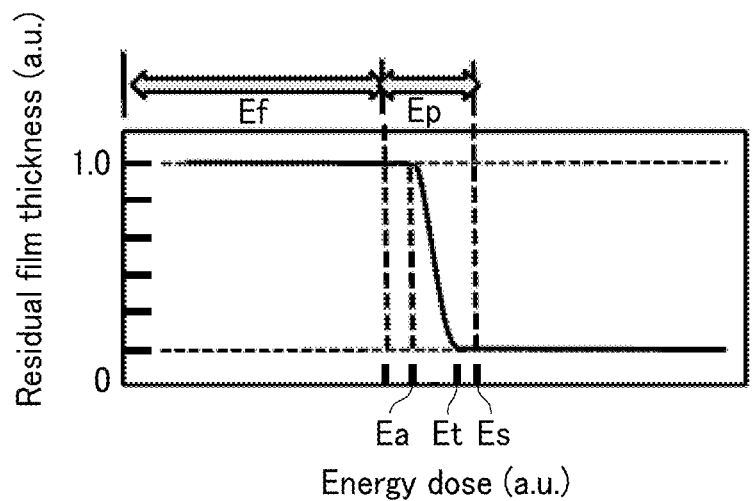
FIG. 2 is a diagram showing an energy dose-residual film rate curve in the resist patterning method of the present embodiment.
Figure 3:
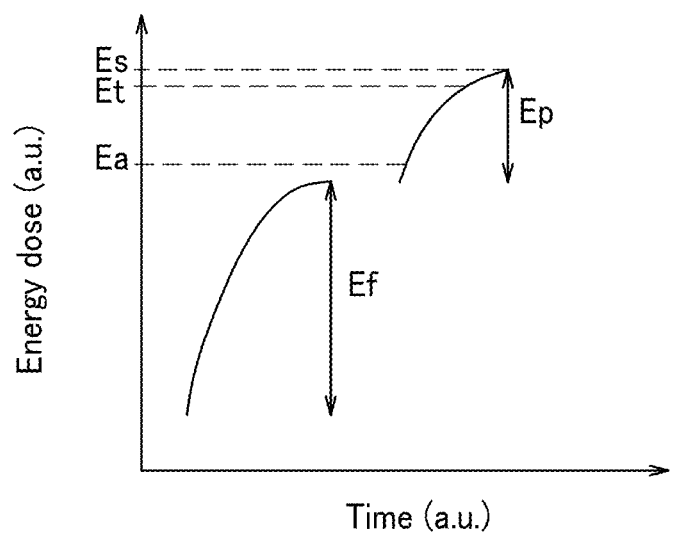
FIG. 3 is a diagram showing an energy dose-time curve in the resist patterning method of the present embodiment.

A resist patterning method according to an embodiment of the present invention will be described with reference to FIGS. 1A-3. FIGS. 1A-1E are schematic illustrations showing processes of the resist patterning method of the present embodiment. FIG. 2 is a diagram showing an energy dose-residual film rate curve in the resist patterning method of the present embodiment. FIG. 3 is a diagram showing an energy dose-time curve in the resist patterning method of the present embodiment. The resist patterning method of the present embodiment is performed through Steps S101 to S110.

Figure 1A:
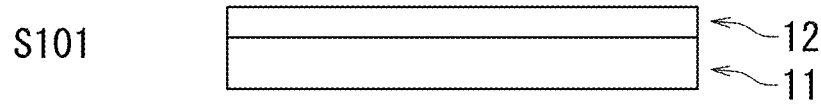
FIGS. 1A-1E are schematic illustrations showing processes of a resist patterning method of the present embodiment.

First, in a resist layer forming step (S101), a resist layer 12 is formed on a substrate 11 as shown in FIG. 1A. Specifically, the substrate 11 (e.g., wafer) is prepared, and a resist solution is applied onto the substrate 11 and pre-baked to form the resist layer 12. Resists are classified into positive resists in which a portion of the resist that is exposed to light becomes soluble in a developing solution and negative resists in which a portion of the resist that is exposed to light becomes insoluble in a developing solution. In the present embodiment, a positive resist will be described for example. The resist may be: a chemically amplified resist having a composition containing an acid generator that generates an acid upon exposure to light, a base material whose solubility to a developing solution is changed by the action of the acid, and a quencher that inhibits diffusion of the acid; or a non-chemically amplified resist having a composition containing no acid generator.

As shown in FIG. 2, in the case of a chemically amplified positive resist, a latent image is formed in the resist layer 12 and a portion having the latent image starts to be dissolved in the developing solution once the dose of the energy applied to the resist exceeds a threshold value Ea (hereinafter, referred to as latent image forming energy dose). Once the energy dose is further increased to exceed a threshold value Et (hereinafter, referred to as required energy dose), the portion having the latent image is removed by being completely dissolved in the developing solution.

Figure 1B:
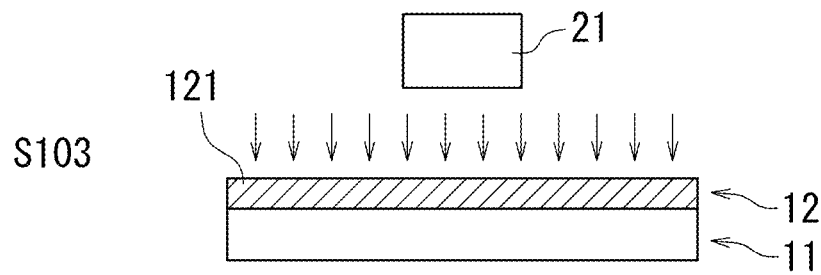

Next, in an activating step (S103), the resist layer 12 is activated by irradiation with an activating energy beam as shown in FIG. 1B. The irradiation with the activating energy beam excites or ionizes a component of the resist layer 12 to produce an active substance. An active substance A and an active substance B are produced in the resist layer 12. Alternatively, only the active substance B is produced in the resist layer 12. The active substance A is an active substance that becomes an acid or an acid precursor. The active substance B is an active substance, such as a sensitizer, other than the active substance that becomes an acid precursor. Depending on the type of the resist (positive or negative), the active substance A gives rise to polarity conversion, cross-linking, decomposition reaction, or the like in the base material of the resist to change the solubility in the developing solution. A certain amount of the active substance A is required to form a resist pattern in developing. The active substance A is for example a cation, an anion, or an acid. The active substance B is for example a radical or a decomposition product.

The activating step is performed for example in vacuo or in an inert atmosphere. The activating energy beam is emitted from an activating energy source 21 so as to irradiate the resist layer 12 from above. Herein, the activating energy beam is applied over an area within the resist layer 12. As shown in FIG. 1B, the activating energy beam is applied over the entire area within the resist layer 12. Alternatively, the activating energy beam may be applied to a part of the entire area within the resist layer 12. The activating energy beam is for example electromagnetic waves such as visible light, ultraviolet (UV), deep ultraviolet (DUV), EUV, and X-rays. Alternatively, the activating energy beam may be an electron beam or an ion beam.

As shown in FIG. 2, in the activating step (S103), an activating energy beam dose Ef is a dose smaller than the latent image forming energy dose Ea. That is, the active substance A is produced in a smaller amount in the activating step (S103) than an amount thereof required to form a resist pattern in the developing. Accordingly, at the stage of the activating step (S103), the resist layer 12 is not dissolved in the developing solution, and a resist pattern is not formed.

Figure 1C:
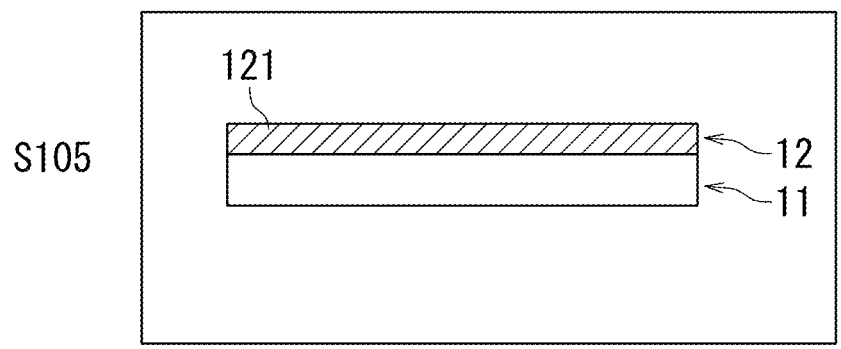

The activating step is followed by a decay inhibiting step (S105) in which decay of the activity of the resist layer 12 is inhibited as shown in FIG. 1C. Specifically, decay of the active substances A and B in the resist layer 12 produced by the activation in the activating step (S103) is inhibited by controlling a surrounding environment and refraining from pre-baking until the later-described latent pattern image forming step (S107) is performed.

For example, the environment surrounding the resist layer 12 is an atmosphere that can control decay of the active substances A and B. The atmosphere that can control decay of the active substances A and B may be a basic substance-free inert gas atmosphere or a vacuum atmosphere. Alternatively, a topcoat film that insulates basic substances and/or oxygen may be provided. In the case of the inert gas atmosphere, nitrogen gas, helium gas, or argon gas is used as the inert gas, for example, and the inert gas can be used under reduced or increased pressure. In the case of the vacuum atmosphere, at least an area surrounding the resist layer 12 is under vacuum. Preferably, the area surrounding the resist layer 12 is at a vacuum of no greater than 1 Pa. In an inert gas atmosphere environment or a vacuum atmosphere environment, decay of the active substance B produced in the resist layer 12 is inhibited.

Alternatively, the environment surrounding the resist layer 12 may be an atmosphere or a liquid that can promote the activity of the resist layer 12. An active gas atmosphere is used as the atmosphere that can promote the activity. When a chemically amplified positive resist is used, for example, a reactive gas for shifting the absorption wavelength is used as the active gas atmosphere, for example. A reactive liquid for shifting the absorption wavelength is used as the active liquid that can promote the activity, for example. The active substance B produced in the resist layer 12 reacts with the active gas or the active liquid and is transformed into an active substance α or a stable substance α1 in the later-described latent pattern image forming step (S107). The active substance α or the stable substance α1 can function as a sensitizer as in the case of the active substance B. The active substance α is for example an aromatic compound radical or an iodine compound radical. The stable substance α1 is for example an aromatic compound or an iodine compound. When the active liquid is used to promote the activity, the active liquid may be removed from the resist layer 12 before the latent pattern image forming step (S107) is performed, or the latent pattern image forming step (S107) may be performed without removing the active liquid.

In addition, controlling the temperature of the resist layer 12 may be employed as a way of controlling the environment. The active substances decay once the temperature of the resist layer 12 exceeds a threshold temperature. Decay of the activity of the resist layer 12 can therefore be inhibited by maintaining the temperature of the resist layer 12 at a temperature equal to or lower than the threshold temperature. For example, the temperature of the resist layer 12 is decreased to a temperature equal to or lower than the threshold temperature by performing rapid cooling in the decay inhibiting step (S105) after the activating step (S103). The threshold temperature is for example 30° C. Alternatively, the activating step (S103) may be performed at a temperature equal to or lower than the predetermined temperature, and the temperature of the resist layer 12 may be maintained at the temperature that is equal to or lower than the threshold temperature in the decay inhibiting step (S105).

The active substances may change to lead to decay of the activity if the resist layer 12 is irradiated with an unexpected energy beam before the latent pattern image forming step (S107) is performed. In the decay inhibiting step (S105), therefore, the resist layer 12 is placed in an environment that prevents such energy beam irradiation.

Furthermore, the active substances decay with time, and therefore decay of the activity of the resist layer 12 can be inhibited also by controlling the length of time between the activating step (S103) and the later-described latent pattern image forming step (S107). Preferably, the time between the activating step and the later-described latent pattern image forming step is within 60 minutes. The control of the temperature, the illuminance, or the time may be performed at the same time as the control of the environment surrounding the resist layer 12.

Figure 1D:
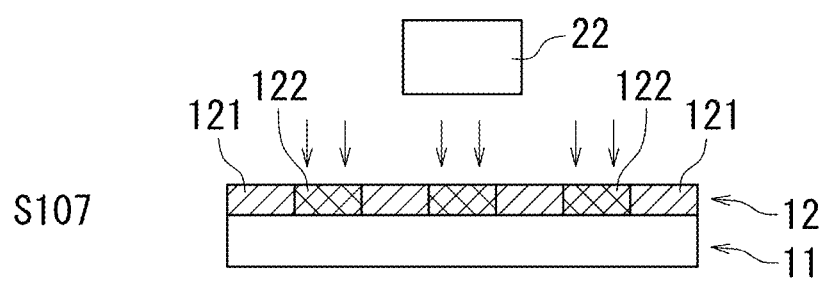

The decay inhibiting step (S105) is followed by the latent pattern image forming step (S107) as shown in FIG. 1D. In the latent pattern image forming step, a latent pattern image is formed in the activated resist layer 12 by irradiation with the latent image forming energy beam. Specifically, the latent image forming energy beam is a beam that transforms the active substance B and the active substance α/stable substance α1 into the active substance A. The active substance B and the active substance α/stable substance α1 are transformed into the active substance B and the active substance A or an active substance A' (an active substance having a different structure from the active substance A) in a portion of the resist layer 12 irradiated with the latent image forming energy beam. Alternatively, the latent image forming energy beam may be a beam that transforms the active substance B and the active substance α/stable substance α1 into the active substance A, and produces the active substance A or the active substance A' in the resist layer 12. In this case, the active substance A or the active substance A' are produced, and the active substance B and the active substance α/stable substance α1 are transformed into the active substance B and the active substance A or the active substance A' in the portion of the resist layer 12 irradiated with the latent image forming energy beam. As shown in FIG. 2, in the latent pattern image forming step (S107), a latent image forming energy beam dose Ep is a dose smaller than the latent image forming energy dose Ea, and the sum of the latent image forming energy beam dose Ep and the activating energy beam dose Ef exceeds the required energy dose Et. In other words, in the latent pattern image forming step (S107), the amount of the active substance A obtained through the transformation from the active substance B and the active substance α/stable substance α1 is smaller than the amount required to form a resist pattern in the developing if the active substance A is not produced in the activating step (S103). However, the sum of the amount of the active substance A produced in the activating step (S103) and the amount of the active substance A obtained in the latent pattern image forming step (S107) exceeds the amount required to form a resist pattern in the developing.

The latent image forming energy beam is emitted from the latent image forming energy source 22 so as to irradiate the resist layer 12 from above. The latent image forming energy source 22 and the activating energy source 21 may be a single energy source or different energy sources. In this step, the latent image forming energy beam is applied in a pattern shape within the area of the resist layer 12 irradiated with the activating energy beam. The latent image forming energy beam can be selected according to the resolution of the pattern to form. For example, the latent image forming energy beam may be electromagnetic waves such as UV, DUV, EUV, and X-rays, or an electron beam, or an ion beam. The latent pattern image forming step is performed for example in a vacuum atmosphere, an active gas atmosphere, or an inert atmosphere. As described above, the resist layer 12 has first exposed portions 121 irradiated with only the activating energy beam and second exposed portions 122 irradiated with both the activating energy beam and the latent image forming energy beam (see FIG. 1D).

Figure 1E:
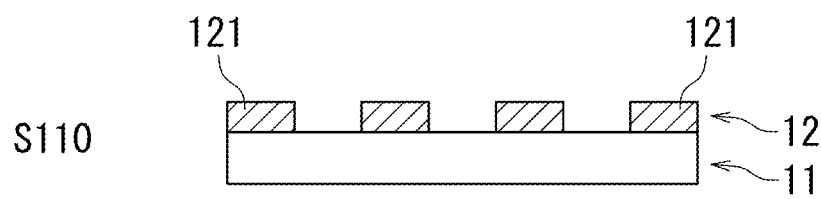

The latent pattern image forming step is followed by a developing step (S110) as shown in FIG. 1E. The resist layer 12 is developed in the developing step. The resist layer 12 is for example developed by putting the substrate 11 in a developing solution bath after performing the pre-baking. In the present embodiment, the dose Ef to the first exposed portions 121 of the resist layer 12 is smaller than the latent image forming energy dose Ea. Since the amount of the active substance A produced in the first exposed portions 121 is smaller than the amount required to form the resist pattern, the first exposed portions 121 are not dissolved in the developing solution. On the other hand, an energy dose Es (i.e., Ef+Ep) to the second exposed portions 122 of the resist layer 12 is larger than the required energy dose Et.

Since the total amount of the active substance A produced and the active substance A obtained through the transformation in the first exposed portions 121 is larger than the amount required to form the resist pattern, the second exposed portions 122 are dissolved in the developing solution. A predetermined resist pattern is formed on the substrate 11 as described above.

The resist patterning method of the present embodiment has been described with reference to FIGS. 1A-1E and 2. In the present embodiment, the active substance A is produced in the resist layer 12 by the irradiation with the activating energy beam before the formation of the latent pattern image by the irradiation with the latent image forming energy beam. Since the amount of the active substance A to be produced in the latent pattern image forming step can be reduced, the time of the irradiation with the latent image forming energy beam can be shortened, or an inexpensive, low-power light source can be used as the light source of the latent image forming energy beam. For example, when EUV is used as the latent image forming energy beam and applied in a pattern shape to the resist layer 12 to form a latent pattern image, high throughput can be achieved even with a low-power light source since the time of the EUV irradiation can be shortened according to the present embodiment. Thus, according to the present embodiment, the trade-off can be solved, and the sensitivity of the resist layer 12 can be increased while the resolution of the pattern can be maintained. In addition, the throughput in the exposure process can be improved, and significant cost reduction for the exposure system can be achieved. Furthermore, the lives of consumable parts of the light source device and the exposure device can be extended, and the maintenance cost and the operation cost can also be significantly reduced since a low-power light source can be used.

In the present embodiment, the decay inhibiting step of inhibiting decay of the activity of the resist layer 12 is performed between the activating step and the latent pattern image forming step. If decay of the activity is not inhibited, the energy is dissipated with time after the activating step, and the amount of the active substances in the resist layer 12 is decreased. Accordingly, in the latent pattern image forming step, it is necessary to resupply to the resist layer an energy for producing the active substance to make up for the amount decreased. In the present embodiment, on the contrary, decay of the activity of the resist layer 12 is inhibited to maintain the active substances in the resist layer 12. Accordingly, less energy needs to be supplied to the resist layer 12 in the latent pattern image forming step. As a result, the sensitivity of the resist layer 12 can be improved, the exposure time can be shortened, and the throughput in the exposure process can be further improved.

In the present embodiment, the activating energy beam is applied over an area within the resist layer 12 in the activating step, and the latent image forming energy beam is applied in a pattern shape within the resist layer 12 in the latent image forming step. However, the present invention is not limited to the embodiment. The activating energy beam may be applied in a pattern shape within the resist layer 12 in the activating step, and then the latent image forming energy beam may be applied over an area within the resist layer 12 in the latent image forming step as long as the sum of the activating energy beam dose Ef and the latent image forming energy beam dose Ep is larger than the required energy dose Et. In this case, the activating energy beam can be selected according to the resolution of the pattern to form. For example, the activating energy beam may be electromagnetic waves such as UV, DUV, EUV, and X-rays, or an electron beam. The latent image forming energy beam may be for example electromagnetic waves such as visible light, UV, DUV, and EUV, or an electron beam, or an ion beam.

Figure 4:
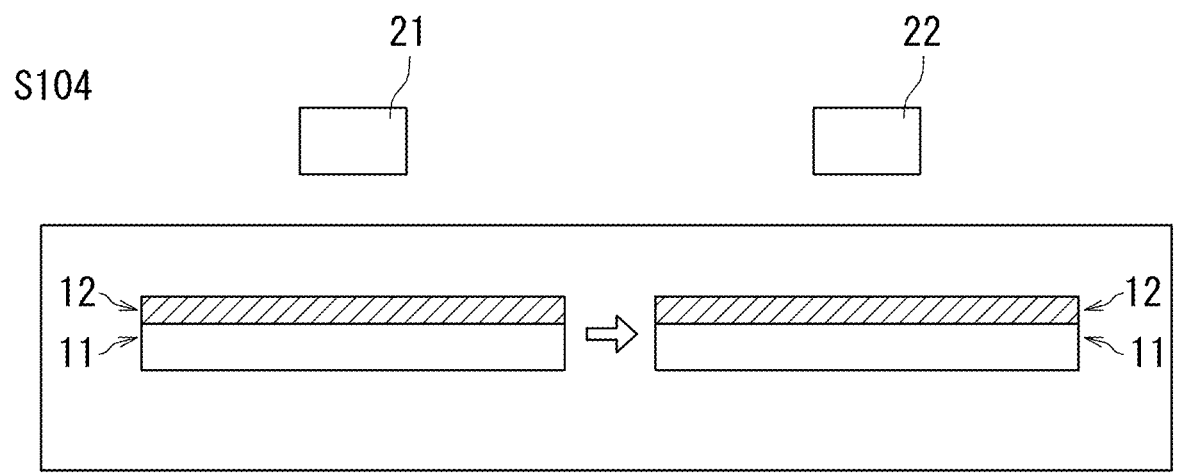
FIG. 4 is a diagram illustrating a process in a resist patterning method according to another embodiment of the present invention.

FIG. 4 is a diagram illustrating a process in a resist patterning method according to another embodiment of the present invention. Hereinafter, the resist patterning method of the present embodiment will be described with reference to FIGS. 4 and 1A-1E. The present embodiment has similar steps to the embodiment described with reference to FIGS. 1A-3 except for further including a conveying step (S104). Accordingly, the illustration is limited to that needed to describe the present embodiment.

The conveying step is performed between the activating step and the latent pattern image forming step. In the conveying step, the substrate 11 is conveyed from a location where the activating step is performed to a location where the latent pattern image forming step is performed. The conveying step is for example performed by a conveying means such as a stage that moves between the location where the activating step is performed and the location where the latent pattern image forming step is performed. As shown in FIG. 4, the conveying step may be performed at the same time as the decay inhibiting step. In this case, decay of the activity of the resist layer 12 can be suitably inhibited even while the resist layer 12 is being conveyed.

The resist patterning method of the present embodiment has been described with reference to FIGS. 1A-1E and 4. Since the present embodiment further includes the conveying step, the substrate 11 can be conveyed to an appropriate location in a configuration in which the location where the activating step is performed and the location where the latent pattern image forming step is performed are different.

Figure 5:
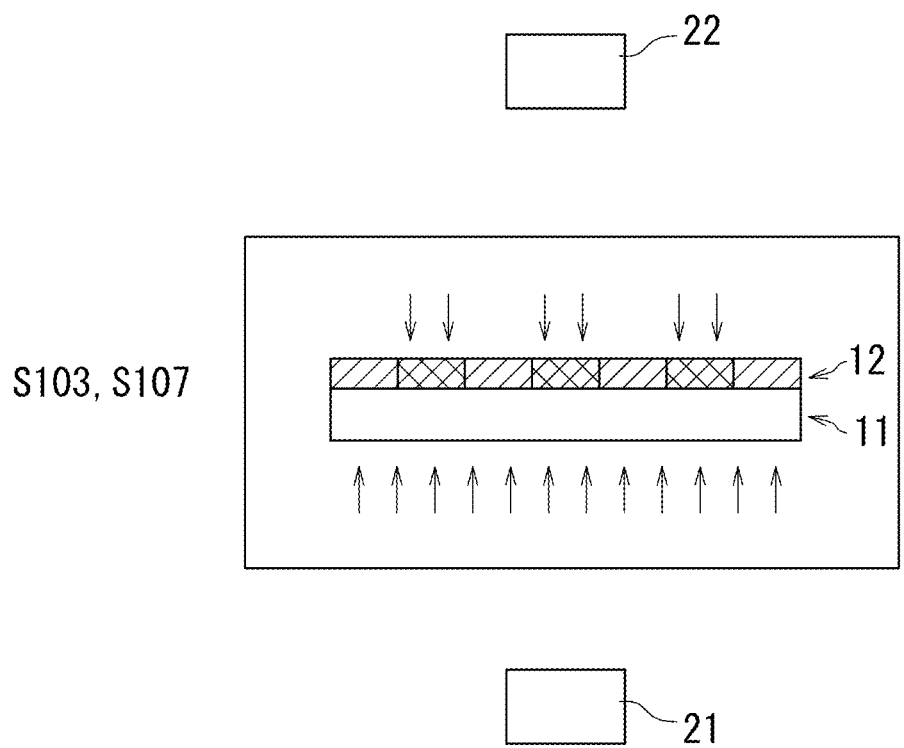
FIG. 5 is a diagram illustrating processes in a resist patterning method according to yet another embodiment of the present invention.

FIG. 5 is a diagram illustrating processes in a resist patterning method according to yet another embodiment of the present invention. Hereinafter, the resist patterning method of the present embodiment will be described with reference to FIGS. 5 and 1A-1E. The resist patterning method of the present embodiment includes the resist layer forming step (S101), the activating step (S103), the decay inhibiting step (S105), the latent pattern image forming step (S107), and the developing step (S110). In the present embodiment, the activating step and the latent image forming step are performed at the same time. The resist layer forming step and the developing step are performed in the same manner as in the embodiment described with reference to FIGS. 1A-3. Accordingly, the illustration is limited to that needed to describe the present embodiment.

In the present embodiment, the activating energy beam is emitted from the activating energy source 21 so as to pass through the substrate 11 and irradiate the resist layer 12 from below. The latent image forming energy beam is emitted from the latent image forming energy source 22 so as to irradiate the resist layer 12 from above. A beam capable of passing through the substrate 11 is used as the activating energy beam. In a configuration in which the substrate 11 is light transmissive, the activating energy beam may be electromagnetic waves such as visible light, UV, DUV, EUV, and X-rays. In particular, X-rays are suitable because they have a good penetration power and thus efficiently reach the resist layer 12.

According to the present embodiment, the time between the completion of the activating step and the initiation of the latent image forming step can be saved. As a result, the throughput in the exposure process can be further improved, and decay of the activity of the resist layer 12 with time can be effectively inhibited. The latent image forming energy beam reaches the resist layer 12 after the activating energy beam reaches the resist layer 12 even in a configuration in which the activating step and the latent image forming step are performed at the same time. Accordingly, the activating step and the latent image forming step may be performed at the same time as the decay inhibiting step in order to ensure that decay of the activity of the resist layer 12 is inhibited.

In FIG. 5, the activating energy beam is applied to the resist layer 12 from below, and the latent image forming energy beam is applied to the resist layer 12 from above. However, the present invention is not limited to the embodiment. The activating energy beam may be applied to the resist layer 12 from above, and the latent image forming energy beam may be applied to the resist layer 12 from below. Either or both of the activating energy beam and the latent image forming energy beam may be applied to the resist layer 12 obliquely.

FIGS. 6A-6D are diagrams illustrating processes in a resist patterning method according to yet another embodiment of the present invention. Hereinafter, the resist patterning method of the present embodiment will be described with reference to FIGS. 6A-6D, 1A-1E, and 2. The resist patterning method of the present embodiment includes the resist layer forming step (S101), the activating step (S103), the decay inhibiting step (S105), the latent pattern image forming step (S107), and the developing step (S110). The activating step is performed through two irradiating steps, and the latent pattern image forming step is performed through one irradiating step. The other steps are performed in the same manner as in the embodiment described with reference to FIGS. 1A-3. Accordingly, the illustration is limited to that needed to describe the present embodiment.

Figure 6A:
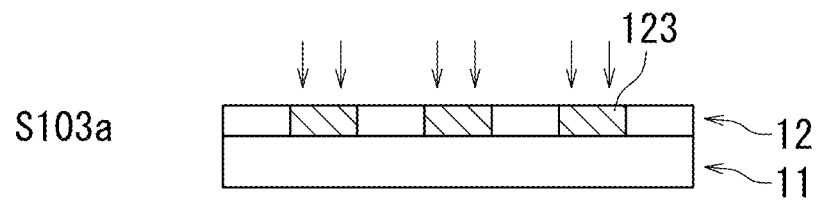
FIGS. 6A-6D are diagrams illustrating processes in a resist patterning method according to yet another embodiment of the present invention.
Figure 6B:
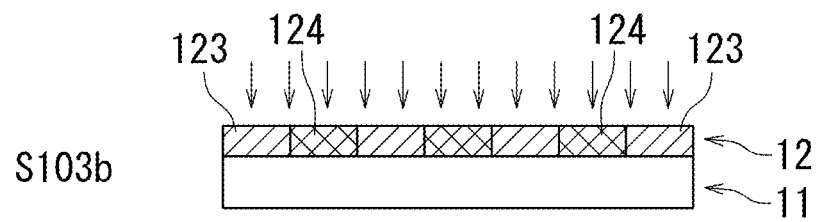

In the present embodiment, the activating step includes a pattern shape irradiating step (S103a) and an area irradiating step (S103b) as shown in FIGS. 6A and 6B. In the pattern shape irradiating step, the activating energy beam is applied in a pattern shape within the resist layer 12 as shown in FIG. 6A. In the area irradiating step, the activating energy beam is applied over an area within the resist layer 12 as shown in FIG. 6B. The total activating energy beam dose Ef in the pattern shape irradiating step and the area irradiating step is smaller than the latent image forming energy dose Ea. Thus, after the activating step is performed, the resist layer 12 has first exposed portions 123 irradiated only once with the activating energy beam and second exposed portions 124 irradiated twice with the activating energy beam.

Figure 6C:
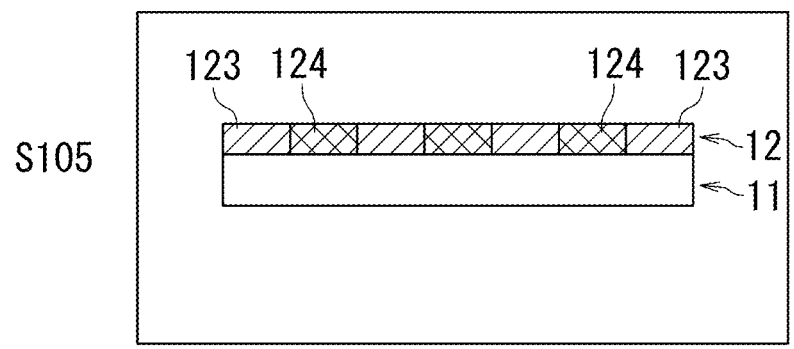
Figure 6D:
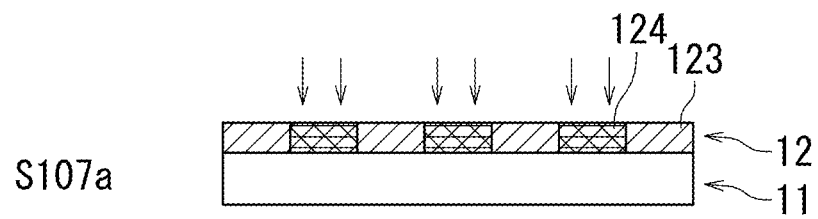

After the activating step is completed and the decay inhibiting step is performed as shown in FIG. 6C, the latent pattern image forming step is performed. The latent pattern image forming step includes a pattern shape irradiating step (S107a) as shown in FIG. 6D. In the pattern shape irradiating step, the latent image forming energy beam is applied in a pattern shape within the resist layer 12. Specifically, the latent image forming energy beam is applied to the second exposed portions 124 of the resist layer 12. The latent image forming energy beam dose is adjusted so that the sum of the activating energy beam dose Ef and the latent image forming energy beam dose Ep in the second exposed portions 124 is larger than the required energy dose Et after the irradiation.

In the present embodiment, the dose Ef to the first exposed portions 123 of the resist layer 12 is smaller than the latent image forming energy dose Ea, and thus the first exposed portions 123 are not dissolved in the developing step. On the other hand, the energy dose Es to the second exposed portions 124 of the resist layer 12 is larger than the required energy dose Et, and thus the second exposed portions 124 are dissolved in the developing step. As described above, a predetermined resist pattern is formed on the substrate 11.

In FIGS. 6A-6D, the activating step is performed through the two irradiating steps, and the latent pattern image forming step is performed through one irradiating step. However, the present invention is not limited to the embodiment. The activating step may be performed through one irradiating step, and the latent pattern image forming step may be performed through two irradiating steps. Alternatively, each of the activating step and the latent pattern image forming step may be performed through two or more irradiating steps. For example, the activating step may include the area irradiating step, and the latent pattern image forming step may include the area irradiating step and the pattern shape irradiating step.

In a configuration in which the activating step or the latent pattern image forming step is performed through two irradiating steps, the two irradiating steps may be similar steps (either the area irradiating step or the latent pattern image forming step) or may be different steps. In the case of the different irradiating steps, either the area irradiating step or the latent pattern image forming step may be performed first.

In FIGS. 6A-6D, furthermore, both the activating step and the latent pattern image forming step include the pattern shape irradiating step. However, the present invention is not limited to the embodiment. Only one of the activating step and the latent pattern image forming step may include the pattern shape irradiating step as long as a latent pattern image can be formed in the resist layer 12.

The resist patterning method according to the present invention may further include a treating step, not shown, that is commonly performed in the exposure process. For example, may be further included a thermal treatment (PEB, for example, pulse thermal treatment) step to be performed after the latent pattern image forming step and an altering step of transforming the resist layer from a positive type to a negative type, or vice versa.

Figure 7A:
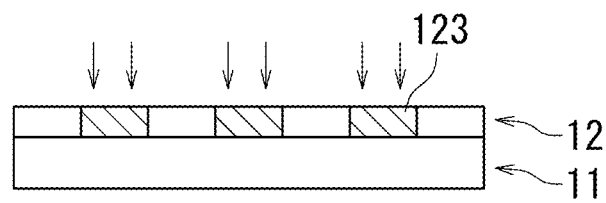
FIGS. 7A-7C are diagrams illustrating Specific Example 1 of the resist patterning method according to the present invention.
Figure 7B:
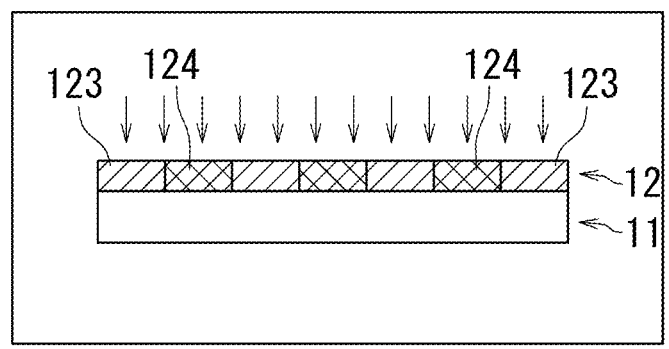
Figure 7C:
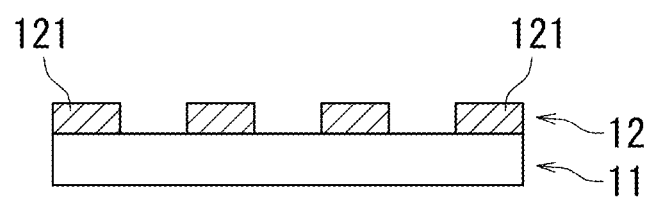

Hereinafter, the resist patterning methods of the embodiments of the present invention will be described using specific examples with reference to FIGS. 7A-10E. FIGS. 7A-7C are diagrams illustrating Specific Example 1 of the resist patterning method according to the present invention. FIGS. 8A-8D are diagrams illustrating Specific Example 2 of the resist patterning method according to the present invention. FIGS. 9A-9D are diagrams illustrating Specific Example 3 of the resist patterning method according to the present invention. FIGS. 10A-10E are diagrams illustrating Specific Example 4 of the resist patterning method according to the present invention. In the following specific examples, a chemically amplified positive resist is used as the resist layer 12.

Specific Example 1

The activating step is performed as shown in FIG. 7A. In the activating step, the activating energy beam is applied in a pattern shape. Once the activating step has been performed, both the active substance A and the active substance B are produced or only the active substance B is produced in the portions irradiated with the activating energy beam in the pattern shape. Since the dose of the irradiation in the pattern shape is small, a resist pattern would not be formed in the resist layer 12 even if the developing step were to be performed at this time.

Next, the decay inhibiting step is performed as shown in FIG. 7B. In the decay inhibiting step, the resist layer 12 is placed in an inert gas atmosphere environment or in a vacuum atmosphere environment. Decay of the active substance A and the active substance B in the resist layer 12 is inhibited.

The latent pattern image forming step is performed at the same time as the decay inhibiting step. In the latent image forming step, the latent image forming energy beam is applied over an area. As shown in FIG. 7B, an energy beam that does not cause a resist reaction in the unexposed portions of the resist layer 12 and activates only the active substance B is selected as appropriate as the latent image forming energy beam. The irradiation with the latent image forming energy beam causes production of the active substance B and/or the active substance A, or the active substance A' (an acid or an acid precursor having a different structure from the active substance A).

Thus, even though the latent image forming energy beam is applied over the area in the latent pattern image forming step, the acid precursor is produced only in the portions irradiated first in the pattern shape, and the active substance B is reproduced in response to the area irradiation only in the portions irradiated first in the pattern shape. Accordingly, a large amount of acid is produced only in the portions irradiated first in the pattern shape, and a latent image of the acid is formed only in the portions irradiated first in the pattern shape after neutralization between the acid and the quencher, which is a base.

Thereafter, a heating step and the developing step are performed to form a resist pattern as shown in FIG. 7C.

Specific Example 2

Figure 8A:
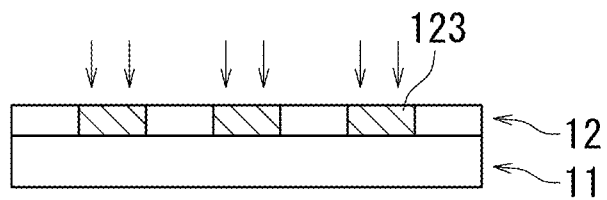
FIGS. 8A-8D are diagrams illustrating Specific Example 2 of the resist patterning method according to the present invention.

The activating step is performed as shown in FIG. 8A. In the activating step, the activating energy beam is applied in a pattern shape. Once the activating step has been performed, both the active substance A and the active substance B are produced or only the active substance B is produced in the portions irradiated with the activating energy beam in the pattern shape. Since the dose of the irradiation in the pattern shape is small, a resist pattern would not be formed in the resist layer 12 even if the developing step were to be performed at this time.

Figure 8B:
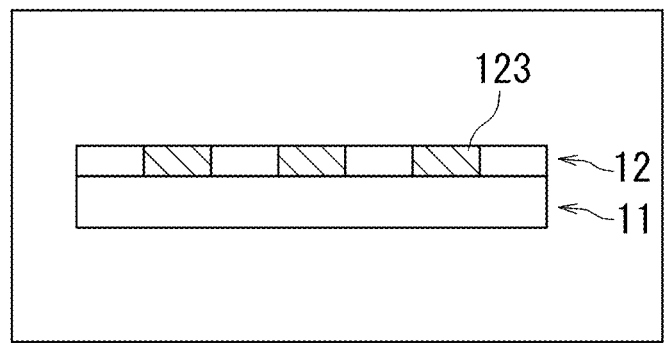

Next, the decay inhibiting step is performed as shown in FIG. 8B. In the decay inhibiting step, the resist layer 12 is placed in an active gas atmosphere environment or in an active liquid environment to cause the active substance B to react. The active substance B is transformed into the active substance α/stable substance α1 having a higher reaction efficiency in the subsequent latent pattern image forming step.

Figure 8C:
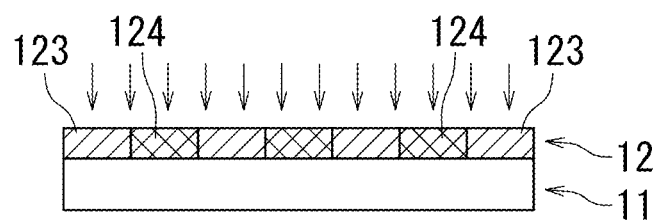

Next, the latent pattern image forming step is performed in the active atmosphere environment or in the active liquid environment as shown in FIG. 8C. In the latent image forming step, the latent image forming energy beam is applied over an area. An energy beam that does not cause a resist reaction in the unexposed portions of the resist layer 12 and activates only the active substance α/stable substance α1 is selected as appropriate as the latent image forming energy beam. As a result of the latent image forming energy beam irradiation, the active substance B and/or the active substance A, or the active substance A' is produced. The active substance B reacts with the active atmosphere or the active liquid to be re-transformed into the active substance α/stable substance a1.

Thus, even though the latent image forming energy beam is applied over the area in the latent pattern image forming step, the acid precursor is produced only in the portions irradiated first in the pattern shape, and the active substance α/stable substance α1 is reproduced in response to the area irradiation only in the portions irradiated first in the pattern shape. Accordingly, a large amount of acid is produced only in the portions irradiated first in the pattern shape, and a latent image of the acid is formed only in the portions irradiated first in the pattern shape after neutralization between the acid and the quencher.

Figure 8D:
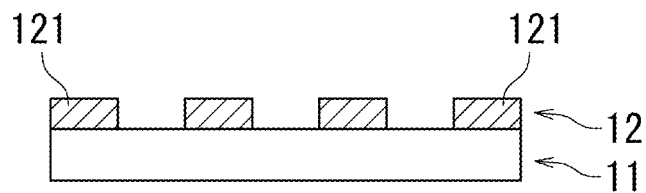

Thereafter, the heating step and the developing step are performed to form a resist pattern as shown in FIG. 8D.

Specific Example 3

Figure 9A:
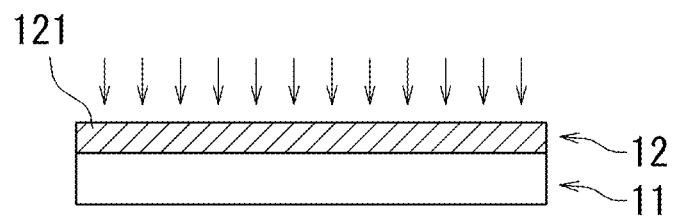
FIGS. 9A-9D are diagrams illustrating Specific Example 3 of the resist patterning method according to the present invention.

The first activating step is performed as shown in FIG. 9A. In the activating step, the activating energy beam is applied over an area.

Figure 9B:
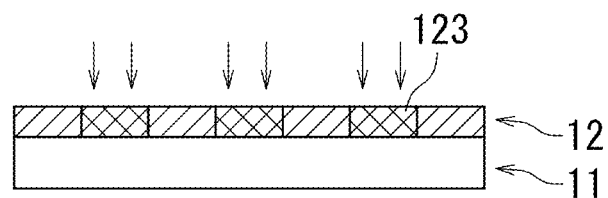

The second activating step is performed as shown in FIG. 9B. In the second activating step, the activating energy beam is applied in a pattern shape. Both the active substance A and the active substance B are produced or only the active substance B is produced in the portions irradiated with the activating energy beam in the pattern shape. Since the dose of the irradiation in the pattern shape is small, a resist pattern would not be formed in the resist layer 12 even if the developing step were to be performed at this time. With the first activating step performed prior to the second activating step, the active substance A and the active substance B are produced efficiently in the second activating step.

Figure 9C:
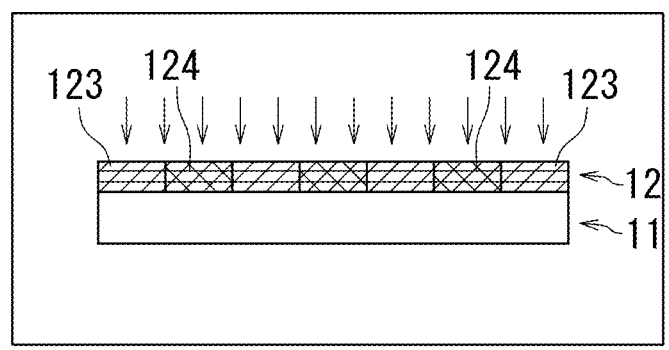

Next, the decay inhibiting step is performed as shown in FIG. 9C. In the decay inhibiting step, the resist layer 12 is placed in an inert gas atmosphere environment or in a vacuum atmosphere environment. Decay of the active substance A and the active substance B in the resist layer 12 is inhibited.

The latent pattern image forming step is performed at the same time as the decay inhibiting step. In the latent image forming step, the latent image forming energy beam is applied over the area. An energy beam that does not cause a resist reaction in the unexposed portions of the resist layer 12 and activates only the active substance B is selected as appropriate as the latent image forming energy beam. The irradiation with the latent image forming energy beam causes production of the active substance B and the active substance A or the active substance A' (an acid precursor having a different structure from the active substance A).

Thus, even though the latent image forming energy beam is applied over the area in the latent pattern image forming step, the acid precursor is produced only in the portions irradiated first in the pattern shape, and the active substance B is reproduced in response to the area irradiation only in the portions irradiated first in the pattern shape. Accordingly, a large amount of acid is produced only in the portions irradiated first in the pattern shape, and a latent image of the acid is formed only in the portions irradiated first in the pattern shape after neutralization between the acid and the quencher.

Figure 9D:
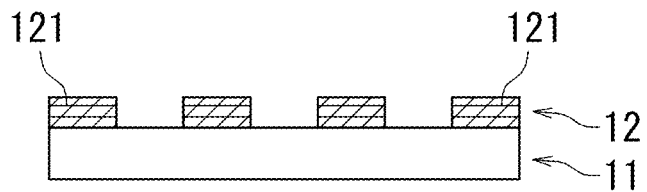

Thereafter, the heating step and the developing step are performed to form a resist pattern as shown in FIG. 9D.

Specific Example 4

Figure 10A:
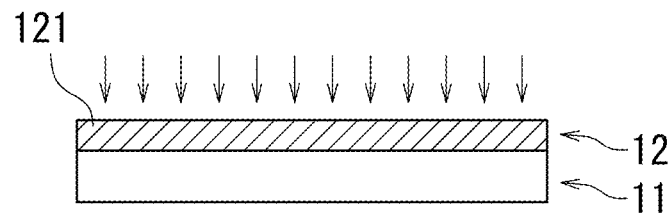
FIGS. 10A-10E are diagrams illustrating Specific Example 4 of the resist patterning method according to the present invention.

The first activating step is performed as shown in FIG. 10A. In the activating step, the activating energy beam is applied over an area.

Figure 10B:
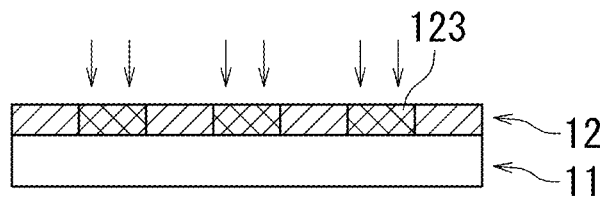

The second activating step is performed as shown in FIG. 10B. In the second activating step, the activating energy beam is applied in a pattern shape. Both the active substance A and the active substance B are produced or only the active substance B is produced in the portions irradiated with the activating energy beam in the pattern shape. Since the dose of the irradiation in the pattern shape is small, a resist pattern would not be formed in the resist layer 12 even if the developing step were to be performed at this time. With the first activating step performed prior to the second activating step, the active substance A and the active substance B are produced efficiently in the second activating step.

Figure 10C:
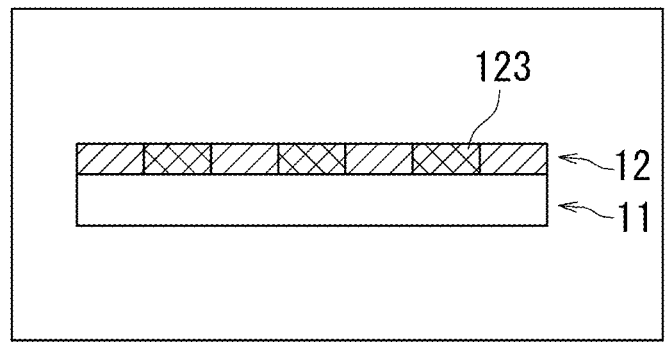

Next, the decay inhibiting step is performed as shown in FIG. 10C. In the decay inhibiting step, the resist layer 12 is placed in an active gas atmosphere environment or in an active liquid environment to cause the active substance B to react. The active substance B is transformed into the active substance α/stable substance α1 having a higher reaction efficiency in the following latent pattern image forming step.

Figure 10D:
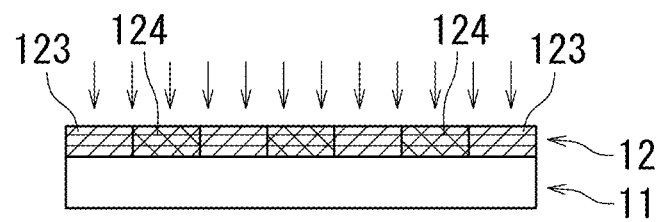

Next, the latent pattern image forming step is performed in the active atmosphere environment or in the active liquid environment as shown in FIG. 10D. In the latent image forming step, the latent image forming energy beam is applied over the area. An energy beam that does not cause a resist reaction in the unexposed portions of the resist layer 12 and activates only the active substance α/stable substance α1 is selected as appropriate as the latent image forming energy beam. The irradiation with the latent image forming energy beam causes production of the active substance B and the active substance A or the active substance A'. The active substance B reacts with the active atmosphere or the active liquid to be re-transformed into the active substance α/stable substance a1.

Thus, even though the latent image forming energy beam is applied over the area in the latent pattern image forming step, the acid precursor is produced only in the portions irradiated first in the pattern shape, and the active substance α/stable substance α1 is reproduced in response to the area irradiation only in the portions irradiated first in the pattern shape. Accordingly, a large amount of acid is produced only in the portions irradiated first in the pattern shape, and a latent image of the acid is formed only in the portions irradiated first in the pattern shape after neutralization between the acid and the quencher.

Figure 10E:
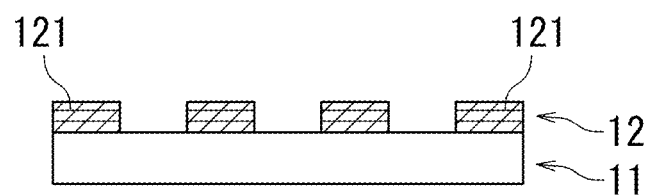

Thereafter, the heating step and the developing step are performed to form a resist pattern as shown in FIG. 10E.

According to the resist patterning methods of the present invention, as described in Specific Examples 1 to 4, a high-resolution resist pattern can be formed by irradiation in a pattern shape in a much lower dose than normal with selection of an appropriate resist design and an appropriate energy beam source, regardless of whether the resist is a chemically amplified resist or a non-chemically amplified resist, and regardless of whether the resist is a positive resist or a negative resist.

In the above-described specific examples, an energy beam that does not cause a reaction with the unirradiated resist layer 12 is selected as the latent image forming energy beam in the latent pattern image forming step. However, the present invention is not limited to the specific examples. An energy beam that is likely to cause a negative tone reaction with the unirradiated resist layer 12 may be selected as the latent image forming energy beam in the latent pattern image forming step.

The resist patterning methods of the embodiments described with reference to FIGS. 1A-10E include the decay inhibiting step of inhibiting decay of the activity. However, the present invention is not limited to the embodiments. Hereinafter, a resist patterning method according to another embodiment of the present invention will be described. The resist patterning method of the present embodiment includes a resist layer forming step, an activating step, a latent pattern image forming step, and a developing step. The resist layer forming step, the activating step, and the developing step are performed in the same manner as the resist layer forming step (S101), the activating step (S105), and the developing step (S110) of the embodiments described with reference to FIGS. 1A-10E. Accordingly, description thereof will be omitted.

In the latent pattern image forming step, a latent pattern image is formed in a resist layer in an active substance by irradiation with the latent image forming energy beam. Specifically, a latent pattern image is formed in the resist layer while the active substance B is present in the resist layer. Preferably, the latent pattern image forming step is performed while a large amount of active substance B is present. As long as the latent pattern image is formed while the resist layer is in the active substance, it is possible to produce the active substance A from the active substance B by the irradiation. The resist patterning method of the present embodiment may further include a decay inhibiting step of inhibiting decay of the activity of the resist layer. The decay inhibiting step is performed in the same manner as the decay inhibiting step (S105) of the embodiments described with reference to FIGS. 1A-10E. Accordingly, description thereof will be omitted here.

According to the resist patterning methods of the embodiments described with reference to FIGS. 1A-10E, the active substance B is produced, and the active substance A is produced directly from the active substance B, or the active substance B is transformed into the active substance α/stable substance α1 and then the active substance A is produced using the active substance α/stable substance α1 in the resist layer 12. However, the present invention is not limited to the embodiments. A stable substance B1 may be produced, and the active substance A may be produced directly from the stable substance B1, or the stable substance B1 may be transformed into the active substance α/stable substance α1 and then the active substance A may be produced using the active substance α/stable substance α1 in the resist layer. Hereinafter, a resist patterning method according to another embodiment of the present invention will be described.

The resist patterning method of the present embodiment includes a resist layer forming step, a stable substance producing step, a transforming step, a latent pattern image forming step, and a developing step. The resist layer forming step and the developing step are performed in the same manner as the resist layer forming step (S101) and the developing step (S110) of the embodiments described with reference to FIGS. 1A-10E. Accordingly, description thereof will be omitted.

In the stable substance producing step, a stable substance is produced in the resist layer by irradiation with the activating energy beam. Specifically, both the active substance A and the stable substance B1 are produced in the resist layer 12 by irradiation with the activating energy beam. Alternatively, only the stable substance B1 is produced in the resist layer 12. The stable substance B1 is for example an aromatic iodine compound or an aromatic sulfuric compound.

In the transforming step, the stable substance B1 in the resist layer 12 is transformed. Specifically, the stable substance B1 in the resist layer 12 produced in the stable substance producing step is transformed into the active substance α/stable substance α1 by controlling a surrounding environment until the later-described latent pattern image forming step (S107) is performed. For the transforming, an active gas atmosphere or an active liquid may be used as described in the former embodiments.

In the latent pattern image forming step, the latent image forming energy beam is applied to form a latent pattern image in the resist layer in which the stable substance B1 has been produced. Specifically, the latent image forming energy beam is a beam that transforms the stable substance B1 and the active substance α/stable substance α1 into the active substance A. The stable substance B1 and the active substance α/stable substance α1 are transformed into the stable substance B1 and the active substance A or the active substance A' in the portions of the resist layer 12 irradiated with the latent image forming energy beam.

Hereinafter, an embodiment of a latent resist image forming device 200 according to the present invention will be described with reference to FIG. 11. The latent resist image forming device 200 includes an activating device 210 and a latent pattern image forming section 220. The activating device 210 activates the resist layer 12 formed on the substrate 11, and then the latent pattern image forming section 220 forms a latent pattern image in the resist layer 12. The resist layer 12 may be formed directly on the substrate 11 or formed on another layer on the substrate 11.

The activating device 210 has an activating chamber 212 and an activating energy source 214. The activating chamber 212 can accommodate the resist layer 12 formed on the substrate 11. Preferably, the atmosphere inside the activating chamber 212 is an inert gas atmosphere, an active gas atmosphere, or a vacuum atmosphere. The active gas atmosphere includes for example hydrogen gas having a controlled partial pressure. Preferably, the activating chamber 212 is capable of controlling the temperature of the substrate 11 therein in a range of from $-10°$ C. to $100°$ C.

The activating energy source 214 emits an activating energy beam for activating the resist layer 12 in the activating chamber 212. The activating energy beam to be emitted from the activating energy source 214 is electromagnetic waves such as visible light, UV, DUV, and EUV. Alternatively, the activating energy beam may be an electron beam or an ion beam. For example, the activating energy source 214 includes an ion beam irradiation section, an electron beam irradiation section, or an electromagnetic wave irradiation section.

Herein, the substrate 11 is conveyed from the activating device 210 to the latent pattern image forming section 220 after the activating device 210 has activated the resist layer 12 formed on the substrate 11. While the substrate 11 is being conveyed from the activating device 210 to the latent pattern image forming section 220, the atmosphere inside the latent resist image forming device 200 is preferably an inert gas atmosphere, an active gas atmosphere, or a vacuum atmosphere. Thus, decay of the activity of the resist layer 12 activated by the activating device 210 can be inhibited. Preferably, the latent image forming chamber 222 is capable of controlling the temperature of the substrate 11 therein in a range of from $-10°$ C. to $100°$ C.

The latent pattern image forming section 220 has a latent image forming chamber 222 and a latent image forming energy source 224. The latent image forming chamber 222 can accommodate the resist layer 12 formed on the substrate 11. Preferably, the atmosphere inside the latent image forming chamber 222 is an inert gas atmosphere, an active gas atmosphere, or a vacuum atmosphere.

The latent image forming energy source 224 emits a latent image forming energy beam for forming a latent pattern image in the resist layer 12 in the latent image forming chamber 222. For example, the latent image forming energy beam is electromagnetic waves such as, for example, visible light, UV, DUV, and EUV. In FIG. 11, the latent image forming energy beam is reflected off mirrors and guided into the latent image forming chamber 222. Alternatively, the latent image forming energy beam may be an ion beam or an electron beam. For example, the latent image forming energy source 224 includes an ion beam irradiation section, an electron beam irradiation section, or an electromagnetic wave irradiation section.

The latent image forming energy source 224 may be of the same type as the activating energy source 214 or a different type from the activating energy source 214. In a configuration in which EUV is used as the activating energy beam and/or the latent image forming energy beam, the EUV preferably has a wavelength of no less than 1 nm and no greater than 13.5 nm, and more preferably no less than 6 nm and no greater than 13.5 nm. Alternatively, in a configuration in which an electron beam is used as the activating energy beam and/or the latent image forming energy beam, the electron beam preferably has an acceleration energy of no less than 10 keV and no greater than 300 keV, and more preferably no less than 40 keV and no greater than 130 keV.

The resist layer 12 may be developed by a developing device, not shown, after the latent pattern image has been formed in the resist layer 12. As a result of the developing, the resist layer 12 having a predetermined pattern is obtained.

As described above, the energy beam emitted from one of the activating energy source 214 and the latent image forming energy source 224 is applied over an area within the resist layer 12. The energy beam emitted from the other of the activating energy source 214 and the latent image forming energy source 224 is applied in a pattern shape within the area of the resist layer 12. That is, the activating energy source 214 is one of a patterned irradiation source that emits an energy beam in a pattern shape and an area irradiation source that emits an energy beam over a predetermined area. The latent image forming energy source 224 is the other of the patterned irradiation source and the area irradiation source.

For example, the activating energy source 214 may emit an energy beam over an area within the resist layer 12 to activate the resist layer 12, and thereafter the latent image forming energy source 224 may emit an energy beam in a pattern shape within the area to form a latent image having a predetermined pattern in the resist layer 12. Alternatively, the activating energy source 214 may emit an energy beam in a pattern shape within an area of the resist layer 12 to activate the resist layer 12, and thereafter the latent image forming energy source 224 may emit an energy beam over the area to form a latent image having a predetermined pattern in the resist layer 12.

In a configuration in which the activating energy source 214 is the area irradiation source that emits an energy beam over a predetermined area, the activating device 210 may further have a mechanism for processing the energy beam into the shape of the area. The activating device 210 has for example a projection lens system and a block mask. Alternatively, the activating device 210 may have the block mask but no projection lens system. It is favorable that the activating device 210 has only the block mask because the configuration of the activating device 210 is simpler. Likewise, in a configuration in which the latent image forming energy source 224 is the area irradiation source that emits the energy beam over a predetermined area, the latent pattern image forming section 220 may have a projection lens system and a block mask or may have only the block mask.

Preferably, the latent resist image forming device 200 further includes for example a coater/developer (not shown herein) in addition to the activating device 210 including the activating energy source 214 and the latent pattern image forming section 220 including the latent image forming energy source 224.

The latent resist image forming device 200 including the coater/developer forms a pattern in the resist layer 12 as follows. First, the coater/developer forms an under layer on the substrate 11 by spin coating and bakes the under layer.

Next, the coater/developer deposits the resist layer 12 on the under layer and pre-bakes the resist layer 12. As needed, another layer may be formed on the resist layer 12 by spin coating and the layer may be baked.

Next, the activating energy source 214 of the activating device 210 applies the energy beam to the resist layer 12. Thus, the resist layer 12 is activated.

Next, the latent image forming energy source 224 of the latent pattern image forming section 220 applies the energy beam to the resist layer 12. Thus, a latent pattern image is formed in the resist layer 12.

Next, the coater/developer performs post-baking. Thereafter, the coater/developer develops the resist layer 12. Thus, the resist layer 12 having a predetermined pattern shape is formed. Next, the coater/developer rinses the resist layer 12 with purified water and performs post-baking (drying). A pattern can be formed in the resist layer 12 as described above.

In a configuration in which the substrate 11 is conveyed between the coater/developer, a location where the resist layer 12 is activated, and a location where a latent pattern image is formed in the resist layer 12, the substrate 11 is preferably conveyed under a predetermined inert gas atmosphere, active gas atmosphere, or vacuum atmosphere. A stage having a temperature adjusting function is suitably used as the conveying member.

The coater/developer may be disposed within the activating chamber 212 of the activating device 210 or disposed within the latent image forming chamber 222 of the latent pattern image forming section 220. Furthermore, the coater/developer may be disposed in a chamber shared by the activating device 210 and the latent pattern image forming section 220.

Figure 11:
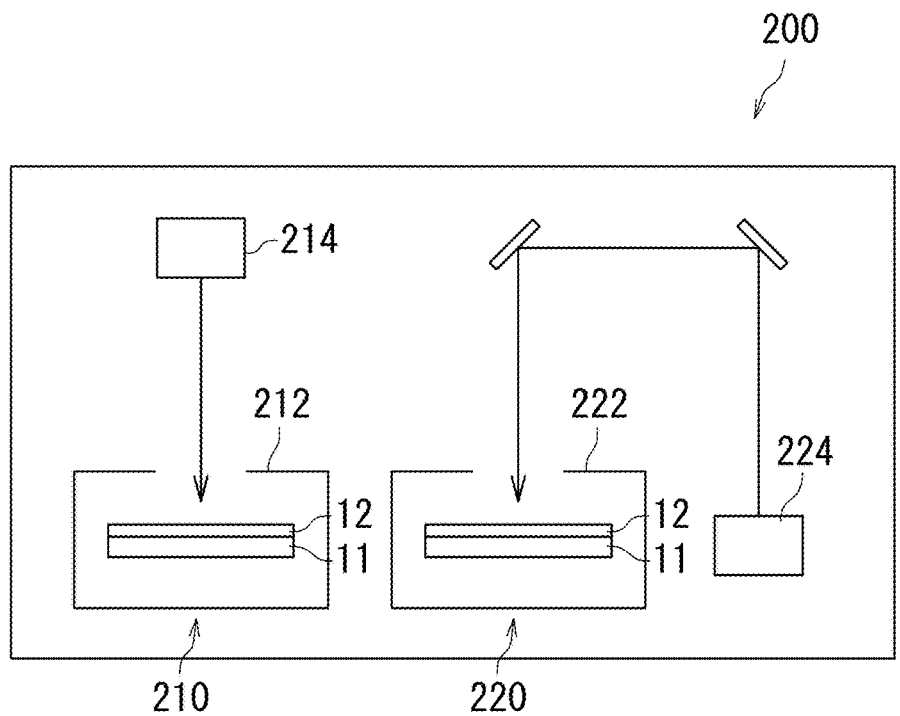
FIG. 11 is a schematic illustration showing an embodiment of a latent resist image forming device according to the present invention.

In the description made above with reference to FIG. 11, the activating energy source 214 emits the energy beam into the activating chamber 212, and the latent image forming energy source 224, which is different from the activating energy source 214, emits the energy beam into the latent image forming chamber 222. However, the present invention is not limited thereto. As will be described with reference to FIG. 12, a single energy source may emit the energy beams into the activating chamber 212 and into the latent image forming chamber 222.

Hereinafter, another embodiment of the latent resist image forming device 200 according to the present invention will be described with reference to FIG. 12. The latent resist image forming device 200 shown in FIG. 12 has an energy source 234 shared by the activating device 210 and the latent pattern image forming section 220. The latent resist image forming device 200 of the present embodiment has a similar configuration to the latent resist image forming device 200 described with reference to FIG. 11 except that the activating device 210 performs the activation of the resist layer 12 and the latent pattern image forming section 220 performs the latent pattern image formation using energy beams emitted from the same energy source 234. Accordingly, redundant description will be omitted in order to avoid repetition.

When the resist layer 12 formed on the substrate 11 is accommodated in the activating chamber 212, the energy beam from the energy source 234 is applied to the resist layer 12 in the activating chamber 212. Next, the resist layer 12 formed on the substrate 11 is conveyed from the activating chamber 212 to the latent image forming chamber 222. When the resist layer 12 is accommodated in the latent image forming chamber 222, the energy beam from the energy source 234 is applied to the resist layer 12 in the latent image forming chamber 222. The directions of the energy beams in pathways of the energy beams emitted from the energy source 234 may be switched depending on the location of the resist layer 12. The switching of the directions of the energy beams is implemented by a switching means (e.g., switching mirrors).

Since the activation and the latent image formation are performed on the resist layer 12 using the same energy source 234, it is preferable to use a mask when an electromagnetic beam is applied in a pattern shape to the resist layer 12. In a configuration in which the energy source 234 is relatively intense, the activation and the latent image formation may be performed on resist layers 12 on different substrates 11 at the same time, one of which is in the activating chamber 212 and the other is in the latent image forming chamber 222.

Figure 12:
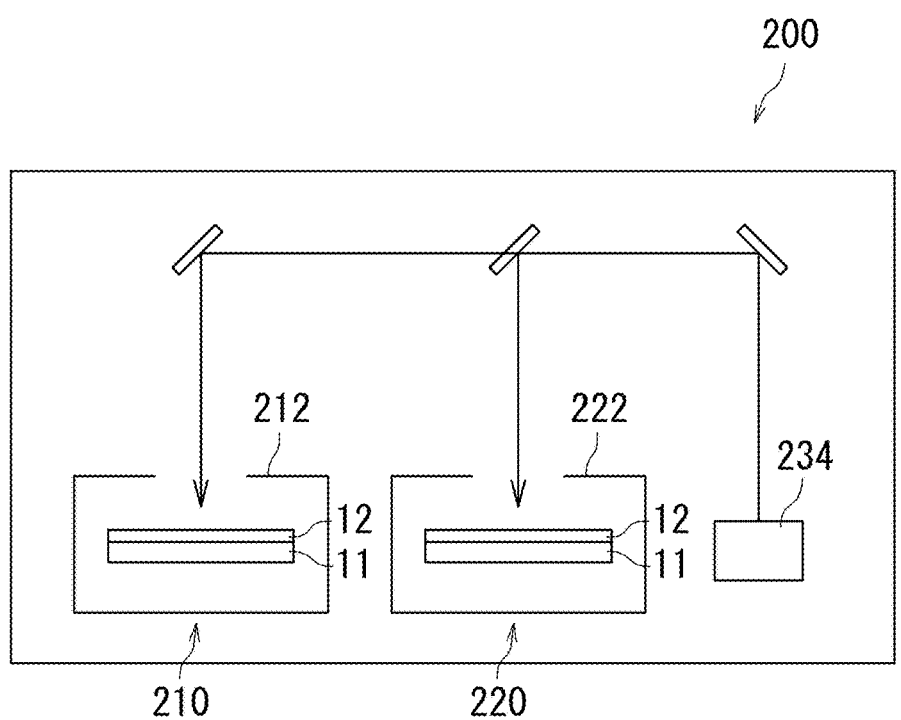
FIG. 12 is a schematic illustration showing an embodiment of the latent resist image forming device according to the present invention.

In the description made above with reference to FIGS. 11 and 12, the substrate 11 is taken out from the activating chamber 212 and then conveyed to the latent image forming chamber 222 after the resist layer 12 formed on the substrate 11 has been activated. However, the present invention is not limited thereto. As will be described with reference to FIG. 13, the substrate 11 may be conveyed from the activating chamber 212 to the latent image forming chamber 222 through a communication path providing communication between the activating chamber 212 and the latent image forming chamber 222.

Hereinafter, another embodiment of the latent resist image forming device 200 according to the present invention will be described with reference to FIG. 13. The latent resist image forming device 200 shown in FIG. 13 has a similar configuration to the latent resist image forming device 200 described with reference to FIG. 11 except that the activating chamber 212 and the latent image forming chamber 222 communicate with each other via the communication path 231. Accordingly, redundant description will be omitted in order to avoid repetition.

After the activating device 210 has activated the resist layer 12 formed on the substrate 11 by irradiation with the energy beam, the substrate 11 is conveyed from the activating chamber 212 to the latent image forming chamber 222 through the communication path 231. Once the substrate 11 has been conveyed to the latent image forming chamber 222, the latent resist image forming device 200 irradiates the resist layer 12 with the energy beam to form a latent pattern image. Since the activating chamber 212 and the latent image forming chamber 222 communicate with each other through the communication path 231, the atmospheres in the activating chamber 212, the communication path 231, and the latent image forming chamber 222 can be made uniform relatively easily. Thus, decay of the activity of the resist layer 12 can be suitably inhibited. The communication path 231 may be used as a part of a differential pumping system or may be coupled with a load-lock chamber.

Figure 13:
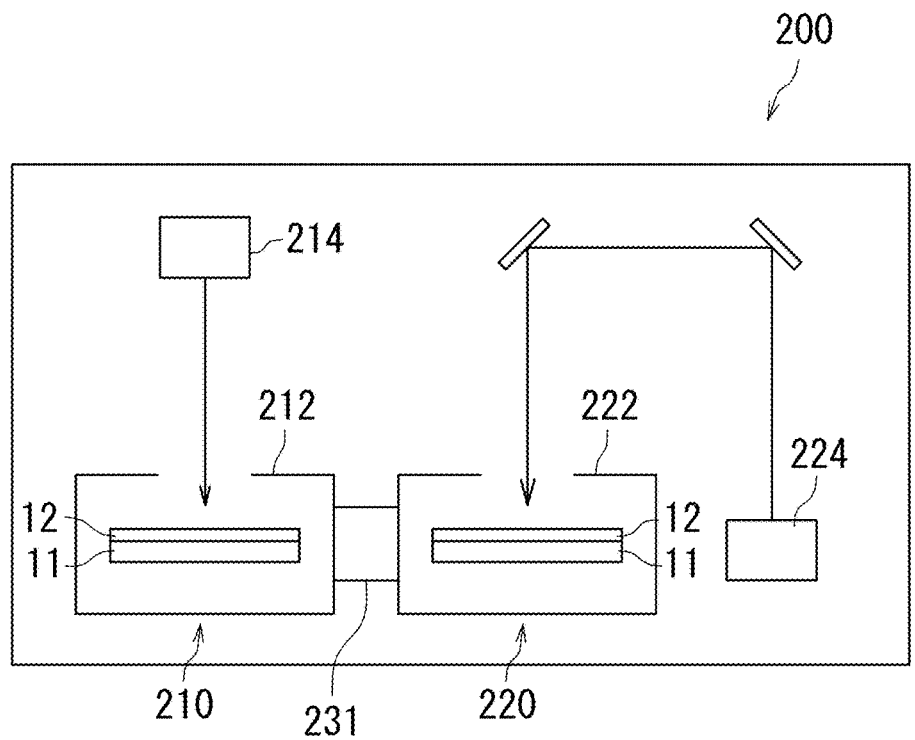
FIG. 13 is a schematic illustration showing an embodiment of the latent resist image forming device according to the present invention.

In the description made above with reference to FIGS. 11 to 13, the activating device 210 and the latent pattern image forming section 220 include the activating chamber 212 and the latent image forming chamber 222, respectively. However, the present invention is not limited thereto. As will be described with reference to FIG. 14, the activating device 210 and the latent pattern image forming section 220 may share a single chamber.

Figure 14:
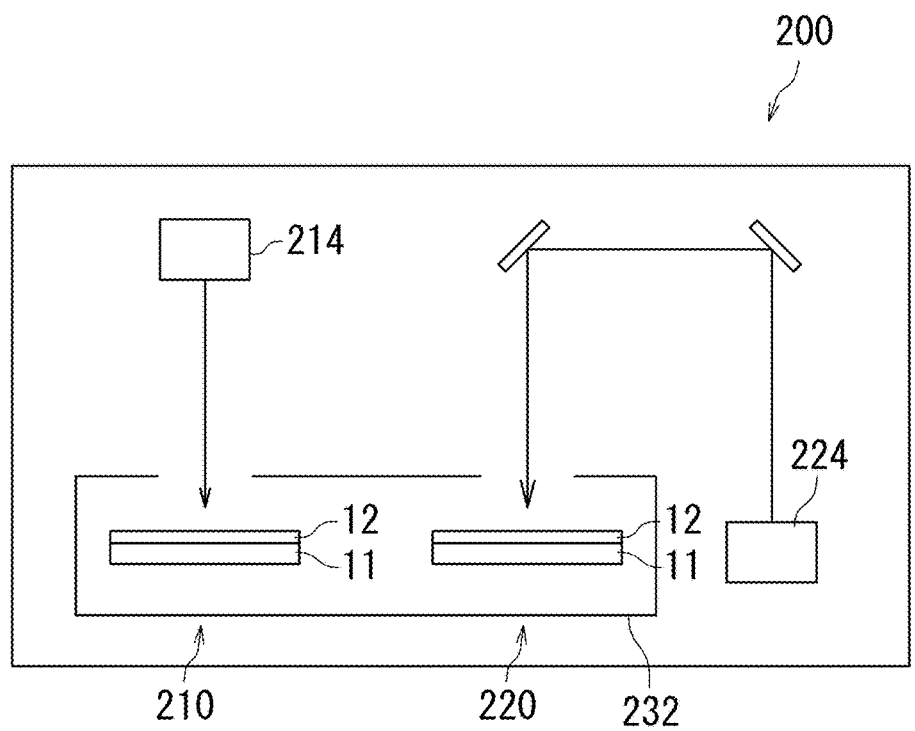
FIG. 14 is a schematic illustration showing an embodiment of the latent resist image forming device according to the present invention.

Hereinafter, another embodiment of the latent resist image forming device 200 according to the present invention will be described with reference to FIG. 14. The latent resist image forming device 200 of the present embodiment shown in FIG. 14 has a similar configuration to the latent resist image forming device 200 described with reference to FIG. 11 except that the activation and the latent pattern image formation are performed on the resist layer 12 in a single chamber 232. Accordingly, redundant description will be omitted in order to avoid repetition.

After the activating device 210 has activated the resist layer 12 formed on the substrate 11 by irradiation with the energy beam, the substrate 11 is conveyed within the chamber 232. After the substrate 11 has been conveyed, the latent resist image forming device 200 irradiates the resist layer 12 with the energy beam to form a latent pattern image. Since the activating chamber for the activation of the resist layer 12 and the latent image forming chamber for the latent image formation in the resist layer 12 are integrated as the single chamber 232, the atmosphere in the chamber 232 can be made substantially homogeneous. Accordingly, it is possible to suitably inhibit decay of the activity of the resist layer 12 without the need of separately controlling the atmosphere in each chamber.

In the description made above with reference to FIGS. 11 to 14, the activation of the resist layer 12 is performed at a different location from the latent pattern image formation in the resist layer 12. However, the present invention is not limited thereto. The latent pattern image formation in the resist layer 12 may be performed at the same location as the activation of the resist layer 12. The activating energy beam and the latent image forming energy beam may be applied to the resist layer 12 at the same time to perform the latent pattern image formation on the resist layer 12 substantially at the same time as the activation of the resist layer 12.

As described above, the activating energy beam may be applied in a pattern shape, and the latent image forming energy beam may be applied over an area. Hereinafter, a resist material that is suitably used in a configuration in which the activating energy beam is applied in a pattern shape and the latent image forming energy beam is applied over an area will be described.

The resist material of the present embodiment includes a resist composition containing a base resin and a sensitizer precursor. In the resist material of the present embodiment, the resist composition produces a sensitizer when irradiated with a first energy beam (activating energy beam) but does not produce an acid or the sensitizer when irradiated with a second energy beam (latent image forming energy beam) for promoting a resist reaction that is caused by the sensitizer. Desirably, the resist material (the base resin and the sensitizer precursor) of the present embodiment is transmissive to the second energy beam (latent image forming energy beam). As described above, once the sensitizer precursor has been irradiated with the first energy beam (activating energy beam), a sensitizer that exhibits significant absorption at different wavelengths is produced.

Once the sensitizer produced from the sensitizer precursor by the irradiation with the first energy beam has been irradiated with the second energy beam in the resist material of the present embodiment, the sensitizer absorbs the latent image forming energy beam to promote the resist reaction. Meanwhile, if not irradiated with the first energy beam, the resist material does not produce an acid or a sensitizer when irradiated with the second energy beam.

Once the activating energy beam has been applied in a pattern shape to the resist material of the present embodiment, the sensitizer is produced in the pattern shape. Thereafter, once the latent image forming energy beam has been applied over a predetermined area of the resist composition, the resist reaction is caused by the sensitizer. Thus, a predetermined resist pattern can be formed readily.

Preferably, the base resin includes a methyl methacrylate resin (MMA resin). This is because the MMA resin is less likely to extinguish an intermediate, a radical, and an ion (cation or anion), at least one of which is involved in the chemical reaction caused by the irradiation with at least one of the first energy beam and the second energy beam. The base resin may contain a polyhydroxystyrene resin (PHS resin). Alternatively, the base resin may be a mixture of an MMA resin and a PHS resin. The base resin may contain a low-molecular compound as well as a high-molecular compound.

The base resin may be decomposed by at least one of the first energy beam and the second energy beam to produce an intermediate, a radical, and an ion. In particular, the base resin is decomposed relatively easily when an electron beam or an EUV beam is used as the first energy beam or the second energy beam.

The sensitizer precursor includes for example at least one of bis(4-methoxyphenyl)methanol (DOMeBzH), a dimethoxy benzhydrol derivative (DOBzMM), and trimethoxy benzhydrol (TriOMeBzH).

The sensitizer precursor may be mixed in the base resin. For example, the ratio between the sensitizer precursor and the base resin is specified in the later-described examples. Alternatively, the sensitizer precursor may be incorporated in the base resin. For example, the sensitizer precursor is bound to the base resin.

Once the resist material has been irradiated with the activating energy beam, the sensitizer is produced from the sensitizer precursor. For example, the activating energy beam is an electron beam or an EUV beam. Alternatively, the activating energy beam may be an ArF laser beam.

Once the sensitizer has been irradiated with the latent image forming energy beam, a latent image is formed in the resist material. As described above, the irradiation with the latent image forming energy beam may be performed in the atmosphere or in vacuo. For example, the latent image forming energy beam is a UV beam.

The resist composition does not absorb the latent image forming energy beam. Typically, an energy beam having a longer wavelength than the activating energy beam is used as the latent image forming energy beam. However, the present invention is not limited thereto, and an energy beam having a shorter wavelength than the activating energy beam may be used as the latent image forming energy beam.

Preferably, the resist composition contains an acid generator (Photo Acid Generator: PAG). The acid generator absorbs the first energy beam but does not absorb the second energy beam. When the resist material is a chemically amplified resist material, the resist composition has the acid generator in addition to the base resin and the sensitizer precursor. A single compound may function both as the sensitizer precursor and as the acid generator.

The resist composition may contain a quencher. For example, the quencher is one that neutralizes an acid. Furthermore, the quencher may be one that inactivates a reaction intermediate that becomes the sensitizer precursor.

The resist material may be a chemically amplified resist material or a non-chemically amplified resist material. When the resist material is a chemically amplified resist material, the sensitizer absorbs the latent image forming energy beam to cause production of an acid and sensitizer. As a result, the resist reaction proceeds. For example, the irradiation with the latent image forming energy beam puts the sensitizer in an excited state. Electron transfer from the sensitizer in the excited state causes the acid generator to be decomposed through a dissociative electrophilic addition reaction. As a result, the acid and the unexcited sensitizer are newly produced. The production of the acid and the sensitizer is continued until the acid generator is consumed substantially completely as long as the exposure to the latent image forming energy beam is continued in a portion where the sensitizer is present.

Figure 15:
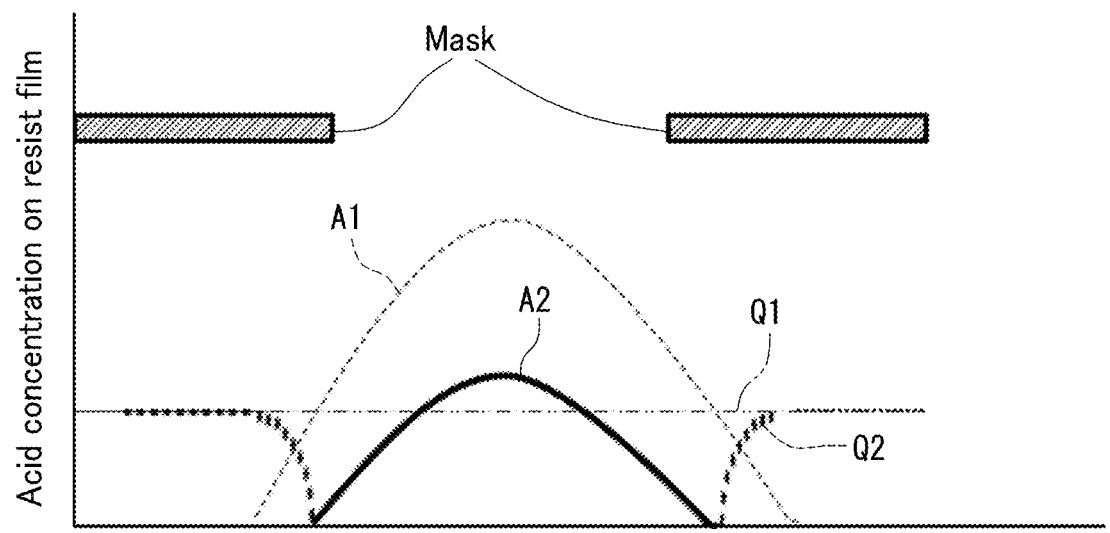
FIG. 15 is a schematic illustration showing concentration changes of an acid and a quencher in a general resist material.

Hereinafter, concentration changes of an acid and a quencher in a general chemically amplified resist material will be described with reference to FIG. 15. FIG. 15 shows concentration changes of an acid and a quencher in a general resist material. This resist material has an acid generator and a quencher. The concentrations of the acid generator and the quencher are substantially constant throughout an entire area before ultraviolet irradiation.

Once relatively intense ultraviolet light has been applied in a predetermined pattern to the resist material, the acid is produced as represented by a concentration distribution A1. Thereafter, the acid and the quencher neutralize each other. Consequently, the concentration distribution of the acid in the resist material changes from the concentration distribution A1 to a concentration distribution A2, and the concentration distribution of the quencher in the resist material changes from a concentration distribution Q1 to a concentration distribution Q2.

Figure 16A:
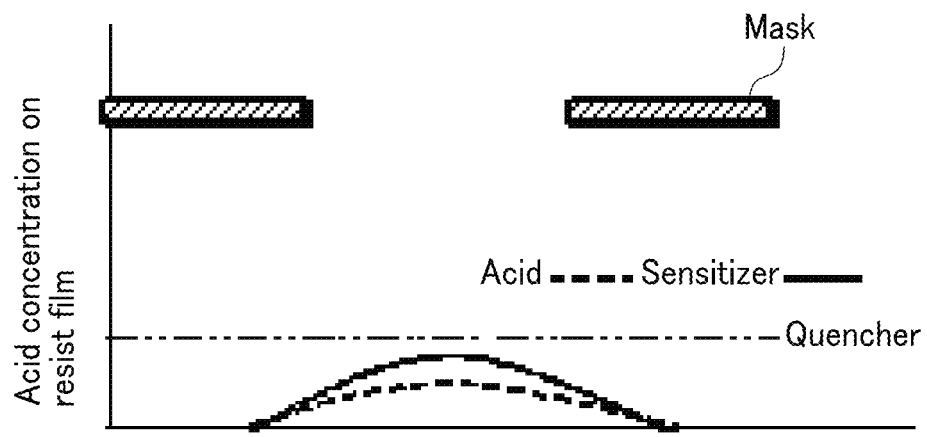
Figure 16B:
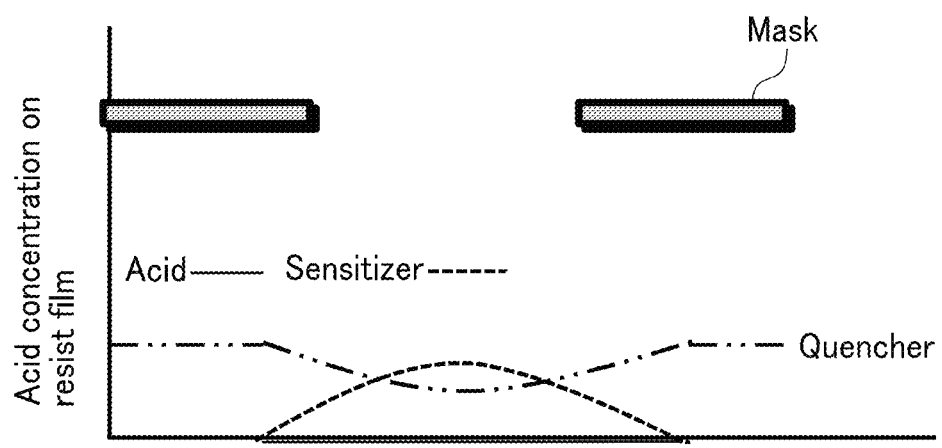
Figure 16C:
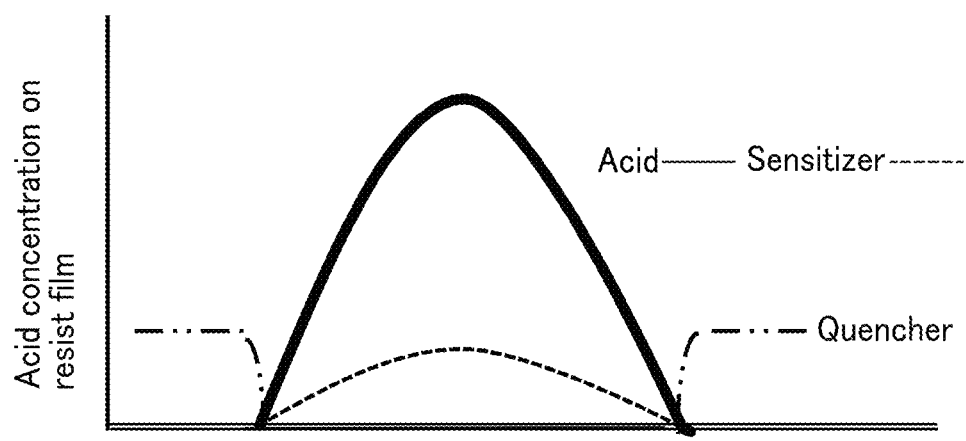

Concentration changes of an acid, a sensitizer, and a quencher in an embodiment of the resist material according to the present invention will be described with reference to FIGS. 16A-16C. FIG. 16A shows the concentrations immediately after the irradiation with the activating energy beam. FIG. 16B shows the concentrations after the neutralization between the acid produced as a result of the irradiation with the activating energy beam and the quencher. FIG. 16C shows the concentrations after the irradiation with the latent image forming energy beam.

As shown in FIG. 16A, the acid and the sensitizer are produced immediately after the irradiation with the activating energy beam in a portion irradiated with the activating energy beam.

Thereafter, the acid produced is neutralized with the quencher. Thus, the acid produced in the portion irradiated with the activating energy beam is consumed substantially completely as shown in FIG. 16B. The concentration of the quencher in the portion irradiated with the activating energy beam is reduced to be lower than that of the quencher in an unirradiated portion. It should be noted here that the sensitizer does not react with the quencher.

The sensitizer is excited by the irradiation with the latent image forming energy beam, and electron transfer from the excited sensitizer causes the acid generator to be decomposed through a dissociative electrophilic addition reaction. As a result, the acid and the unexcited sensitizer are newly produced as shown in FIG. 16C. As mentioned above, the sensitizer does not react with the quencher. Thus, the production of the acid can be continued until the acid generator is consumed completely. Unlike a conventional acid proliferation reaction accompanied by thermal diffusion, the mass acid production mechanism by the irradiation with the latent image forming energy beam is a reaction unaccompanied by a thermal diffusion reaction. Accordingly, it is possible to increase the sensitivity without reducing the resolution.

In the description made with reference to FIGS. 16A-16C, the resist material contains a moderate amount of quencher. However, the present invention is not limited thereto. The resist material may contain a high concentration of quencher.

Figure 17A:
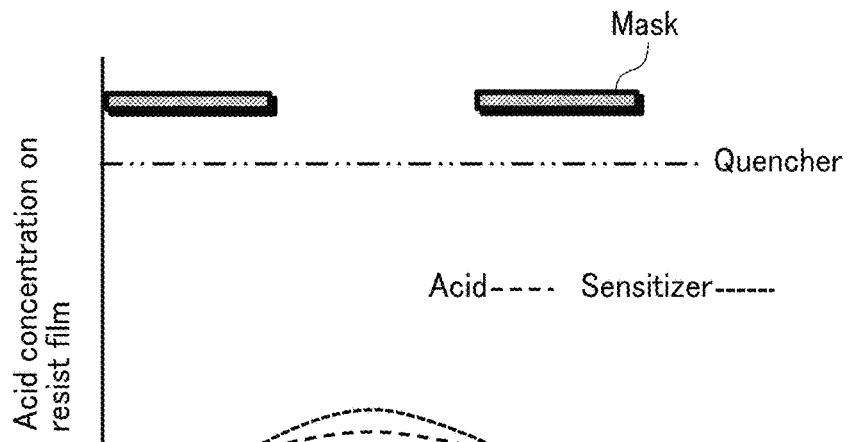
Figure 17B:
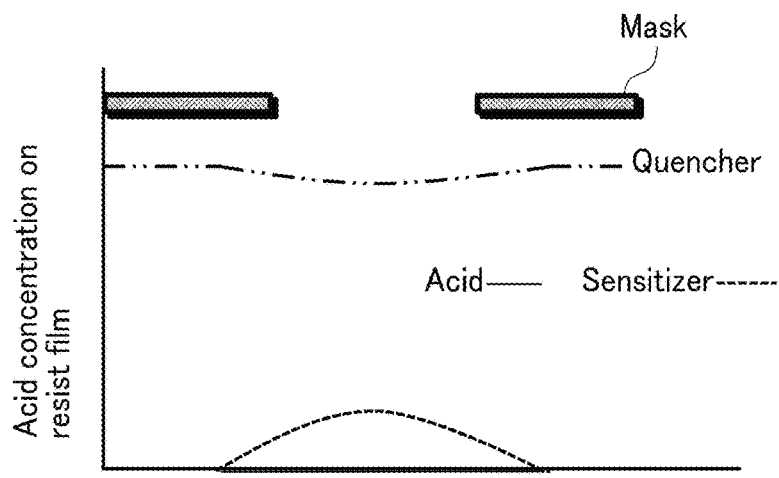
Figure 17C:
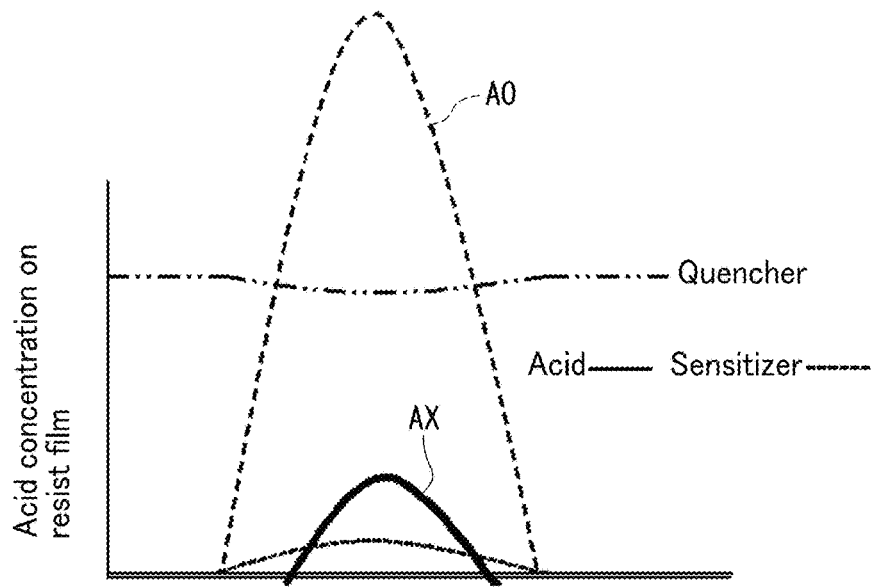

FIGS. 17A-17C show concentration changes of an acid, a sensitizer, and a quencher in an embodiment of the resist material according to the present invention. The resist material of the present embodiment contains a high concentration of quencher. FIG. 17A shows the concentrations immediately after the irradiation with the activating energy beam. FIG. 17B shows the concentrations after the neutralization between the acid produced as a result of the irradiation with the activating energy beam and the quencher. FIG. 17C shows the concentrations after the irradiation with the latent image forming energy beam.

As shown in FIG. 17A, the acid and the sensitizer are produced immediately after the irradiation with the activating energy beam in a portion irradiated with the activating energy beam.

Thereafter, the acid produced is neutralized with the quencher. Thus, the acid produced in the portion irradiated with the activating energy beam is consumed substantially completely as shown in FIG. 17B. The concentration of the quencher in the portion irradiated with the activating energy beam is reduced to be lower than that of the quencher in an unirradiated portion.

The sensitizer is excited by the irradiation with the latent image forming energy beam, and electron transfer from the excited sensitizer causes the acid generator to be decomposed through a dissociative electrophilic addition reaction. As a result, the acid and the unexcited sensitizer are newly produced as shown in FIG. 17C. Thus, the production of the acid can be continued until the acid generator is consumed completely. As mentioned above, the sensitizer does not react with the quencher. In FIG. 17C, a concentration distribution A0 represents the concentration distribution of the acid given on the assumption that no quencher is used, and a concentration distribution AX represents the concentration after the neutralization between the acid and the quencher. As shown in FIGS. 17A-17C, the acid distribution after the neutralization between the acid and the quencher becomes narrower because of the presence of a high concentration of quencher. A threshold of the acid concentration for the dissolution can be adjusted to a value in a range of the acid distribution where the slope is steep by adjusting the quencher concentration. As a result, it is possible to achieve higher resolution and lower LER in the resist pattern.

In the description made above, the quencher is one that neutralizes the acid to inactivate the acid. However, the present invention is not limited thereto. The quencher may be one that inactivates the sensitizer or the sensitizer precursor. Alternatively, the resist composition may include both a quencher that neutralizes the acid and a quencher that inactivates the sensitizer or the sensitizer precursor.

Figure 18A:
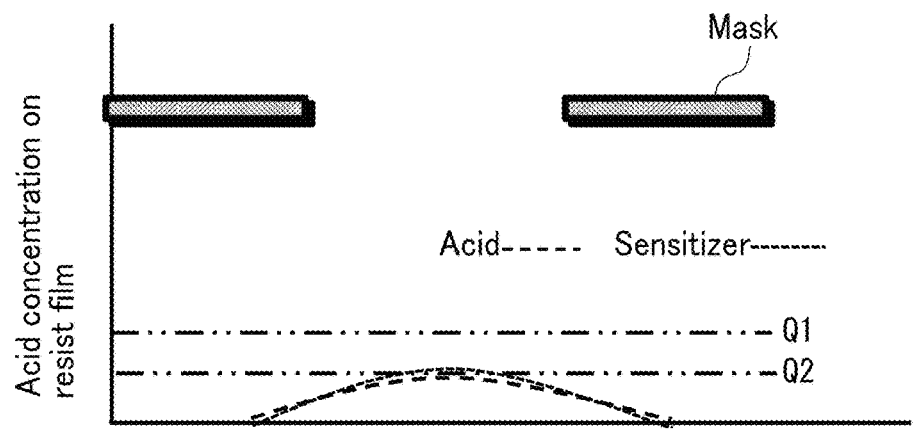
Figure 18B:
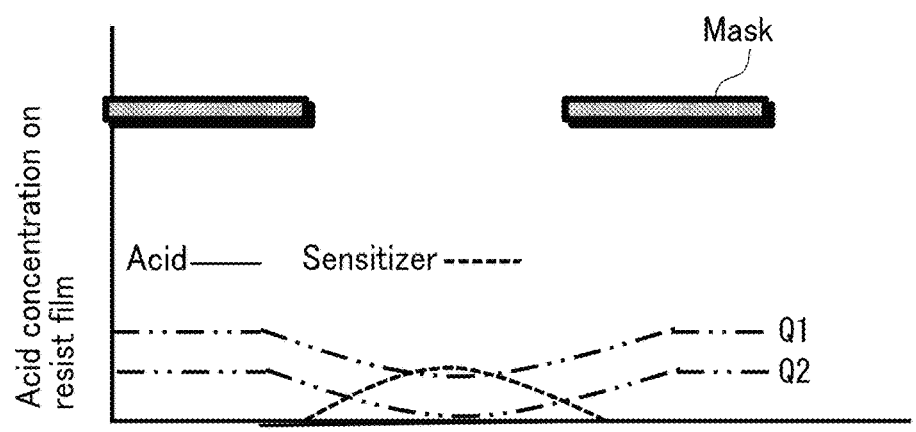
Figure 18C:
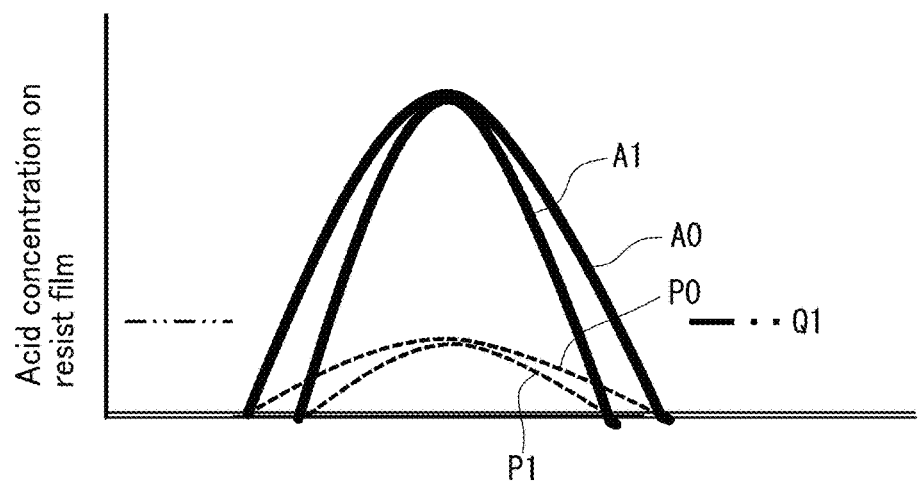

Concentration changes of an acid, a sensitizer, and a quencher in an embodiment of the resist material according to the present invention will be described with reference to FIGS. 18A-18C. In the present embodiment, the resist material contains a quencher that neutralizes the acid and a quencher that inactivates the sensitizer or the sensitizer precursor. FIG. 18A shows the concentrations immediately after the irradiation with the activating energy beam. FIG. 18B shows the acid concentration after the neutralization between the acid produced as a result of the irradiation with the activating energy beam and the quencher, and the concentration distribution of the sensitizer after a reaction between the sensitizer and the quencher or between the sensitizer, the sensitizer precursor, and the quencher. FIG. 18C shows the concentrations after the irradiation with the latent image forming energy beam.

As shown in FIG. 18A, the acid and the sensitizer are produced immediately after the irradiation with the activating energy beam in a portion irradiated with the activating energy beam. In this embodiment, a concentration distribution Q1 represents the concentration distribution of the quencher that neutralizes the acid, and a concentration distribution Q2 represents the concentration distribution of the quencher that inactivates the sensitizer.

The acid is then neutralized with the quencher. Thus, the acid produced in the portion irradiated with the activating energy beam is consumed substantially completely as shown in FIG. 18B. In this case, the concentration of the quencher in the portion irradiated with the activating energy beam is reduced to be lower than that of the quencher in an unirradiated portion as indicated by the concentration distribution Q1.

The concentration of the sensitizer is reduced by the reaction between the sensitizer and the quencher or between the sensitizer precursor and the quencher. However, the concentration of the quencher that inactivates the sensitizer or the sensitizer precursor is relatively low, and thus the concentration distribution of the sensitizer becomes narrower than that before the reaction with the quencher.

Once the latent image forming energy beam has been applied, as shown in FIG. 18C, the acid is produced to have a concentration distribution A1 through a reaction caused by the excited sensitizer, and the unexcited sensitizer is newly produced to have a concentration distribution P1 since the concentration distribution of the sensitizer has become narrower. Thus, the production of the acid can be continued until the acid generator is consumed completely as long as the irradiation with the latent image forming energy beam is continued. In FIG. 18C, for reference, a concentration distribution A0 represents the concentration distribution of the acid given on the assumption that the quencher that inactivates the sensitizer or the sensitizer precursor is not used, and a concentration distribution P0 represents the concentration distribution of the unexcited sensitizer given on the assumption that the quencher that inactivates the sensitizer or the sensitizer precursor is not used. By achieving a narrow acid concentration distribution and controlling the concentration of the quencher that inactivates the sensitizer or the sensitizer precursor as described above, the threshold value for the dissolution can be adjusted to a value where the slope of the acid concentration distribution is steep. Accordingly, it is possible to achieve higher resolution and lower LER in the resist pattern.

In the description made above with reference to FIGS. 16A-18C, the activating energy beam is applied in a pattern shape using a mask. However, the present invention is not limited thereto. The activating energy beam may be applied in a pattern shape without using a mask.

Figure 19:
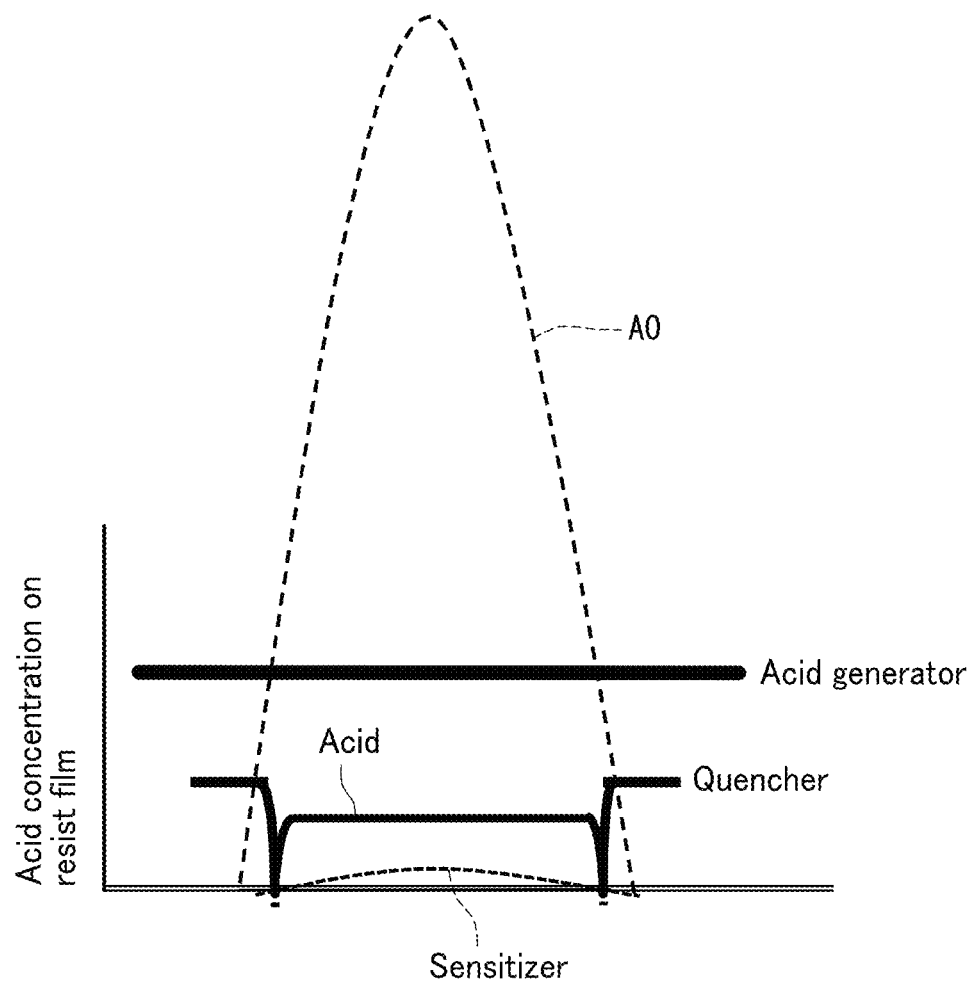
FIG. 19 is a schematic illustration showing concentration changes of an acid, a sensitizer, and a quencher in an embodiment of the resist material according to the present invention.

Concentration changes of an acid, a sensitizer, and a quencher in an embodiment of the resist material according to the present invention will be described with reference to FIG. 19. In the present embodiment, the activating energy beam is applied in a pattern shape. The acid and the sensitizer are produced in a portion irradiated with the activating energy beam. The acid produced is neutralized with the quencher. Thus, the acid produced in the portion irradiated with the activating energy beam is consumed substantially completely. The concentration of the quencher in the portion irradiated with the activating energy beam is reduced to be lower than that of the quencher in an unirradiated portion. It should be noted here that the sensitizer does not react with the quencher.

Next, the sensitizer is excited by the irradiation with the latent image forming energy beam, and electron transfer from the excited sensitizer causes the acid generator to be decomposed through a dissociative electrophilic addition reaction. As a result, the acid and the unexcited sensitizer are newly produced. As mentioned above, the sensitizer does not react with the quencher. Thus, the production of the acid can be continued until the acid generator is consumed completely. As the irradiation with the latent image forming energy beam is continued, therefore, the actual acid concentration does not take a concentration distribution A0 given on the assumption that the acid generator were inexhaustible. That is, the acid generator concentration decreases, the acid formation reaction caused by the latent image forming energy beam slows, and the acid concentration eventually becomes saturated in a central portion of the pattern. Accordingly, the acid concentration is substantially constant in the center of the acid distribution and drops very sharply at each end of the acid distribution. That is, the acid is formed to have a concentration distribution having a slope changing sharply at each end of the acid distribution. As a result, the LER, which depends on the slope at each end of the acid distribution, is significantly reduced, and the possibility of a problem of pattern shot noise is reduced.

Figure 20A:
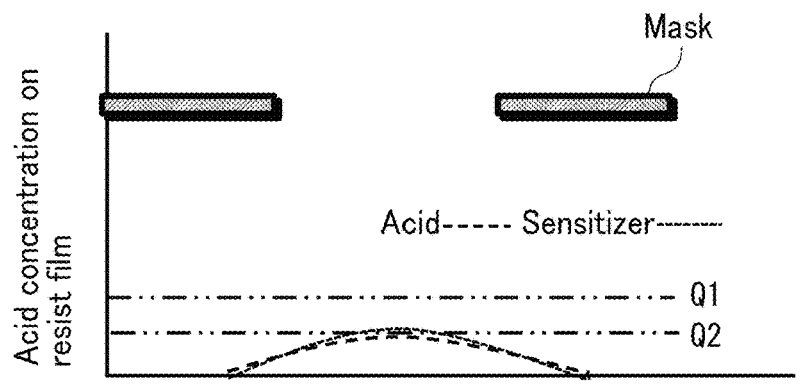
Figure 20B:
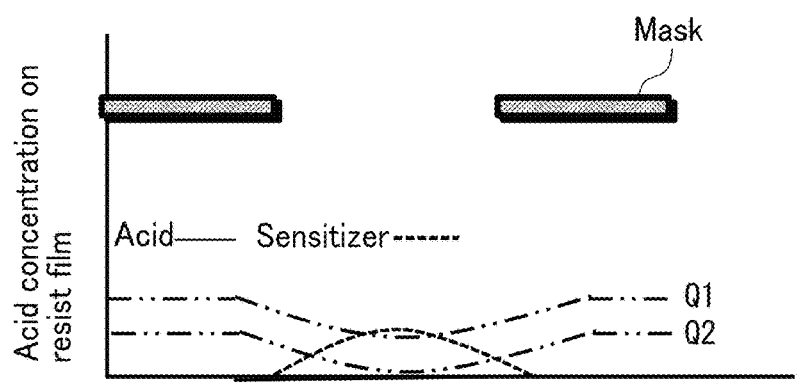
Figure 20C:
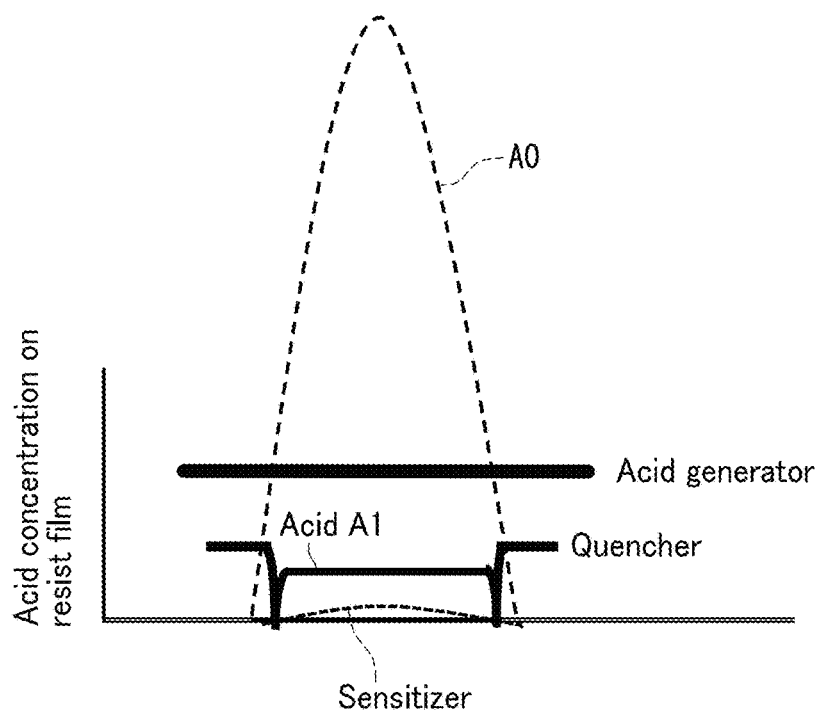

By combining the methods described with reference to the four schemes illustrated in FIGS. 16A to 19, a technique that has been considered impossible is achieved. That is, increasing sensitivity, increasing resolution, reducing LER, and solving the problem of photon shot noise, which have been current challenges in all types of lithography such as EUV lithography, EB lithography, and Ar lithography, can be achieved at the same time. Concentration changes of an acid, a sensitizer, and a quencher in an embodiment of the resist material according to the present invention will be described with reference to FIGS. 20A-20C. FIG. 20A shows the concentrations immediately after the irradiation with the activating energy beam. FIG. 20B shows the concentrations after the neutralization between the acid produced as a result of the irradiation with the activating energy beam and the quencher. FIG. 20C shows the concentrations after the irradiation with the latent image forming energy beam.

As shown in FIG. 20A, the acid and the sensitizer are produced immediately after the irradiation with the activating energy beam in a portion irradiated with the activating energy beam. In the present embodiment, a concentration distribution Q1 represents the concentration distribution of the quencher that neutralizes the acid, and a concentration distribution Q2 represents the concentration distribution of the quencher that inactivates the sensitizer or the sensitizer precursor.

The acid is then neutralized with the quencher. Thus, the acid produced in the portion irradiated with the activating energy beam is consumed substantially completely as shown in FIG. 20B. In this case, the concentration of the quencher in the portion irradiated with the activating energy beam is reduced to be lower than that of the quencher in an unirradiated portion as indicated by the concentration distribution Q1.

The concentration of the sensitizer is reduced by the quencher. However, the concentration of the quencher that reduces the sensitizer is relatively low, and thus the concentration distribution of the sensitizer becomes narrower than that before the reaction with the quencher.

Once the latent image forming energy beam has been applied, as shown in FIG. 20C, the acid is produced to have a concentration distribution A1 through a reaction caused by the excited sensitizer having the narrower concentration distribution, and the unexcited sensitizer is newly produced. Thus, the production of the acid can be continued until the acid generator is consumed completely as long as the irradiation with the latent image forming energy beam is continued. In FIG. 20C, for reference, a concentration distribution A0 represents the concentration distribution of the acid given on the assumption that the acid generator were inexhaustible.

In this resist material, the excited sensitizer is produced by subjecting to flood light exposure the sensitizer whose concentration distribution has become narrower due to the quencher that reduces the sensitizer in the activating step. The electron transfer from the excited sensitizer causes a reaction to decompose the acid generator, and the acid and the unexcited sensitizer are newly produced. The production of the acid is continued until the acid generator is consumed substantially completely in the portion where the sensitizer is present. The acid formation reaction slows and the acid concentration becomes saturated in a portion where the amount of the residual acid generator has become low. According to the acid concentration distribution after the neutralization between the acid and the quencher, the acid concentration is constant in a substantial center of the portion irradiated with the activating energy beam and drops very sharply around the boundary of the portion. The acid is formed to have a concentration distribution having a slope changing sharply at each end. As described above, increasing sensitivity, increasing resolution, reducing LER, and solving the problem of photon shot noise are achieved at the same time.

Hereinafter, preferred usage examples of the resist material of the present embodiment will be described with reference to Specific Examples 5 and 6.

Specific Example 5

A resist material is prepared. The resist material includes a resist composition containing a base resin and a sensitizer precursor. In the resist material of the present embodiment, the resist composition produces a sensitizer when irradiated with a first energy beam (activating energy beam) but does not produce the sensitizer when irradiated with a second energy beam (activating energy beam) for promoting a resist reaction that is caused by the sensitizer.

A resist layer is formed using the resist material. The resist layer is for example formed on a substrate by spin coating.

The activating step is performed. In the activating step, the activating energy beam is applied in a pattern shape. Once the activating step has been performed, the sensitizer is produced in portions irradiated with the activating energy beam in the pattern shape. An acid may be produced as well as the sensitizer. Since the dose of the irradiation in the pattern shape is small in the activating step, a resist pattern would not be formed in the resist layer even if the developing step were to be performed. In Specific Example 5, decay of the activity of the resist layer may be inhibited as described above or may not be inhibited.

The latent pattern image forming step is performed at the same time as the activating step or after the activating step. The latent image forming energy beam is applied over an area in the latent image forming step. As shown in FIG. 7B, an energy beam that does not cause a resist reaction in unexposed portions of the resist layer and activates the sensitizer is selected as appropriate as the latent image forming energy beam. As a result of the irradiation with the latent image forming energy beam, a reaction between the acid generator and the sensitizer is caused to produce the acid, or a resist reaction is caused.

Thus, even though the latent image forming energy beam is applied over the area in the latent pattern image forming step, the sensitizer is produced only in the portions irradiated first in the pattern shape, and the sensitizer is activated by the area irradiation only in the portions irradiated first in the pattern shape. Accordingly, a large amount of acid is produced only in the portions irradiated first in the pattern shape, and a latent image of the acid is formed only in the portions irradiated first in the pattern shape after neutralization between the acid and the quencher. Thereafter, the heating step and the developing step are performed to form a resist pattern.

Specific Example 6

A resist material is prepared. The resist material includes a resist composition containing a base resin and a sensitizer precursor. In the resist material of the present embodiment, the resist composition produces a sensitizer when irradiated with a first energy beam (activating energy beam) but does not produce the sensitizer when irradiated with a second energy beam (activating energy beam) for promoting a resist reaction that is caused by the sensitizer.

A resist layer is formed using the resist material. The resist layer is for example formed on a substrate by spin coating.

The activating step is performed. In the activating step, the activating energy beam is applied in a pattern shape. Once the activating step has been performed, at least the sensitizer is produced in portions irradiated with the activating energy beam in the pattern shape. Since the dose of the irradiation in the pattern shape is small, a resist pattern would not be formed in the resist layer even if the developing step were to be performed at this time. In Specific Example 6, decay of the activity of the resist layer may be inhibited as described above or may not be inhibited.

The latent pattern image forming step is performed at the same time as the activating step or after the activating step. In the latent image forming step, the latent image forming energy beam is applied over an area. An energy beam that does not cause a resist reaction in unexposed portions of the resist layer and activates only the active substance α/stable substance α1 is selected as appropriate as the latent image forming energy beam. As a result of the irradiation with the latent image forming energy beam, the active substance B and/or the active substance A, or the active substance A' is produced. The active substance B reacts with an active atmosphere or an active liquid to be re-transformed into the active substance α/stable substance α1.

Thus, even though the latent image forming energy beam is applied over the area in the latent pattern image forming step, the acid precursor is produced only in the portions irradiated first in the pattern shape, and the active substance α/stable substance α1 is reproduced in response to the area irradiation only in the portions irradiated first in the pattern shape. Accordingly, a large amount of acid is produced only in the portions irradiated first in the pattern shape, and a latent image of the acid is formed only in the portions irradiated first in the pattern shape after neutralization between the acid and the quencher. Thereafter, the heating step and the developing step are performed to form a resist pattern.

Specific Example 7

Hereinafter, Specific Example 7 will be described with reference to FIGS. 21-25C. First, a resist material is prepared. The resist material contains a copolymer of group γ-butyrolactone-α-methacrylate, 2-(1-adamantyl)propane-2-yl methacrylate, 3-hydroxyadamantan-1-yl methacrylate, and 1-ethylcyclopentyl methacrylate as a polymer serving as a base resin (RX); bis(4-methoxyphenyl)methanol (DOMeBzH) as a sensitizer precursor (B0); and an iodonium salt ($R_2IX$) as an acid generator (PAG) (sensitizer precursor: 4.6% by weight (3 to 30% by weight, preferably 4 to 10% by weight), PAG: 4.6% by weight (3 to 30% by weight, preferably 4 to 10% by weight, relative to the weight of the resin). In the present example, the resist material is a chemically amplified positive resist material.

Next, the resist material is applied onto a silicon substrate by spin coating and pre-baked. Conditions of the spin coating vary depending on the regulated density of the resist. In the present example, the spin coating was performed at 1500 rpm for 30 seconds, and the pre-baking was performed at 100° C. for 60 seconds. A target amount of a quencher to add is approximately 1/10 of the amount of the PAG to add. For example, the amount is from 0.1 to 3.0% by weight, and preferably from 0.3 to 1.2% by weight.

FIG. 21 shows equations of chemical reactions that occur in the present embodiment. An EB is applied in a pattern to the resist material. The patterned EB exposure is for example performed using an EB exposure system of JSM-6500F at 30 keV (JEOL Ltd., beam current: 12.5 and 28 pA, <1E-4 Pa) equipped with Beam Draw (Tokyo Technology Corporation).

The reaction mechanism in the resist material upon the patterned EB irradiation is expected to work in accordance with equations (a-1) to (a-5) in FIG. 21. As shown in the equation (a-1), the patterned EB irradiation causes ionization of the resist material and thus production mainly of a polymer radical cation ($RH^+\cdot$) and an electron ($e^-$). The polymer radical cation ($RH^+\cdot$) reacts with a polymer (RH) to be separated into a radical P. and a cation ($RH(H^+)$).

As shown in the equation (a-2), the electron ($e^-$) reacts with the acid generator ($R_2I^+X^-$), and thus a neutral molecule (RI), a radical (R.), and an anion ($X^-$) are produced.

As shown in the equation (a-3), the cation ($RH(H^+)$) reacts with the anion ($X^-$), and thus a polymer (RH) and an acid (HX) are produced.

As shown in the equation (a-4), the radical (R.) reacts with DOMeBzH, and thus a radical (DOMeBzH) is produced. As shown in the equation (a-5), this radical reacts with the acid generator ($R_2I^+X^-$) to cause electron transfer, and thus a cation ($DOMeBzH^+$) is produced. Furthermore, as shown in the equation (a-6), a proton is transferred from the cation ($DOMeBzH^+$) to the anion, and thus the sensitizer (DOMeBzO) and the acid (HX) are produced.

Next, after the patterned EB irradiation, flood UV irradiation (320 and 365 nm) is performed at room temperature. The reaction mechanism in the resist material upon the flood UV irradiation is expected to work in accordance with an equation (b-1) in FIG. 21. The flood UV irradiation excites the sensitizer (DOMeBzO). An electron is transferred from the excited sensitizer (DOMeBzO) to the acid generator (PAG), and thus a radical cation of the sensitizer (DOMeBzO.$^+$), a neutral molecule (RI), a radical (R.), and an anion (X$^-$) are produced. The flood UV irradiation also causes the same reactions as the reactions caused by the patterned EB irradiation, and thus a chain reaction occurs, producing the acid efficiently.

FIGS. 22A-22C show results of observation of a photosensitivity curve and line-and-space patterns using an atomic force microscope (AFM, NanoNavi II/SPA-300HV, Hitachi High-Tech Science). FIGS. 22A-22C show results of measurements performed on the same RPGM chemically amplified positive resist for the same line-and-space pattern (75 nm) under the same spin coating and pre-baking conditions, the same thermal treatment temperature and time conditions, and the same developing conditions. They are different in the dose of the first patterned EB exposure, inclusion or exclusion of the second flood UV exposure, and the wavelength of the UV exposure.

The resist subjected to the patterned single EB exposure has a photosensitivity of 77 μC/cm$^2$, and the resist subjected to the combined PF lithography at 320 nm has a photosensitivity of 8.8 μC/cm$^2$. It has been revealed that there is a trade-off between the photosensitivity and the resolution of the chemically amplified resist in an initial stage of the developing of the chemically amplified resist. The trade-off arises from the fact that reduction of the acid concentration leads to increase in the acid diffusion length needed to produce the necessary amount of chemical reactions. Results of the experiments that have achieved a high photosensitivity while preventing reduction of the resolution can be accounted for by the novel process.

Figure 23:
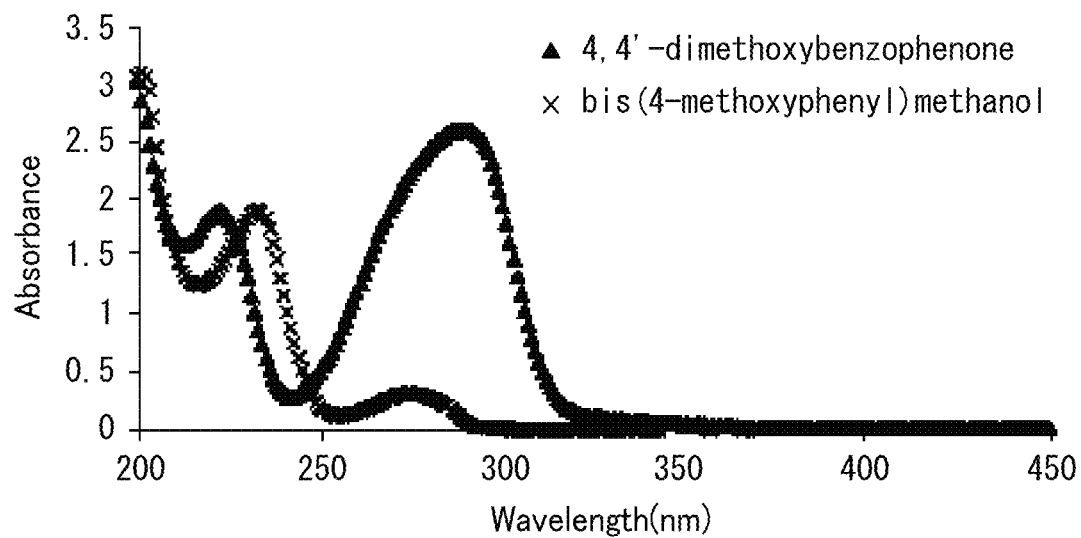
FIG. 23 is a graph showing the absorbance of DOMeBzH and DOMeBzO.
Figure 24:
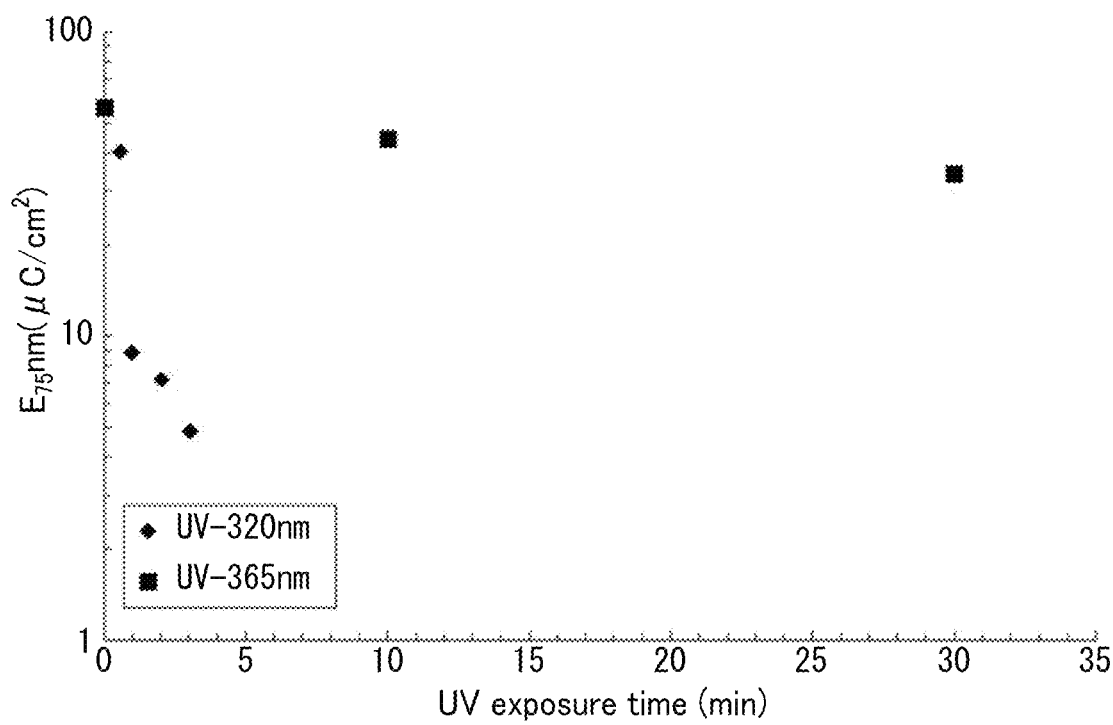
FIG. 24 is a graph showing the relationship between the UV exposure time and the irradiation dose.

FIG. 23 is a graph showing the absorbance of DOMeBzH and DOMeBzO. FIG. 24 is a graph showing the relationship between the UV exposure time and the irradiation dose.

Figure 25A:
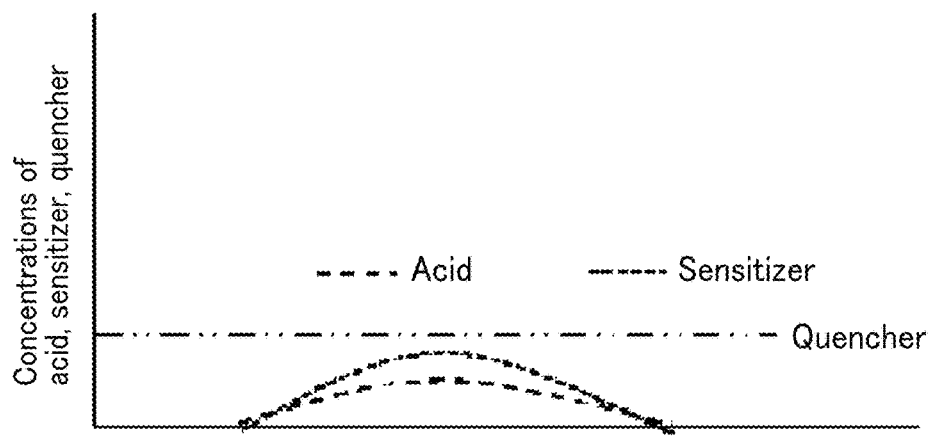

Hereinafter, an acid formation process in the chemically amplified resist material of the present embodiment will be described with reference to FIGS. 25A-25C. In this embodiment, a quencher is added to the resist material. The quencher added restricts diffusion of the acid, and thus a high-resolution pattern can be suitably formed in the chemically amplified resist.

First, in the present embodiment, the activating energy beam is applied in a pattern shape. FIG. 25A shows the concentrations of the acid, the sensitizer, and the quencher in the resist immediately after the irradiation with the activating energy beam in the pattern shape. The quencher concentration is substantially constant throughout an entire area before the irradiation with the activating energy beam in the pattern shape.

The irradiation with the activating energy beam in the pattern shape causes production of the acid and the sensitizer in a portion irradiated with the activating energy beam. For example, the activating energy beam is an electron beam or an EUV beam.

Figure 25B:
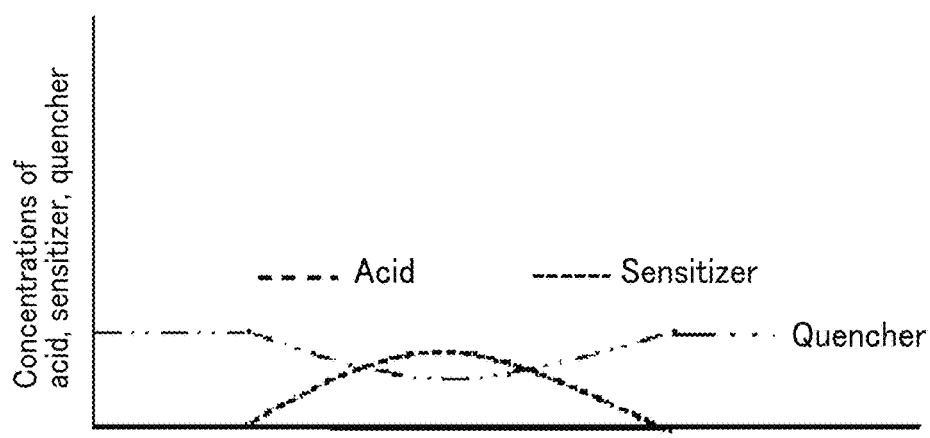

After some time after the irradiation with the activating energy beam, the acid and the quencher are recombined at room temperature as shown in FIG. 25B. Accordingly, the quencher concentration decreases to be lower in the portion irradiated with the activating energy beam than in the unirradiated portion. Meanwhile, the sensitizer does not react with the quencher.

Figure 25C:
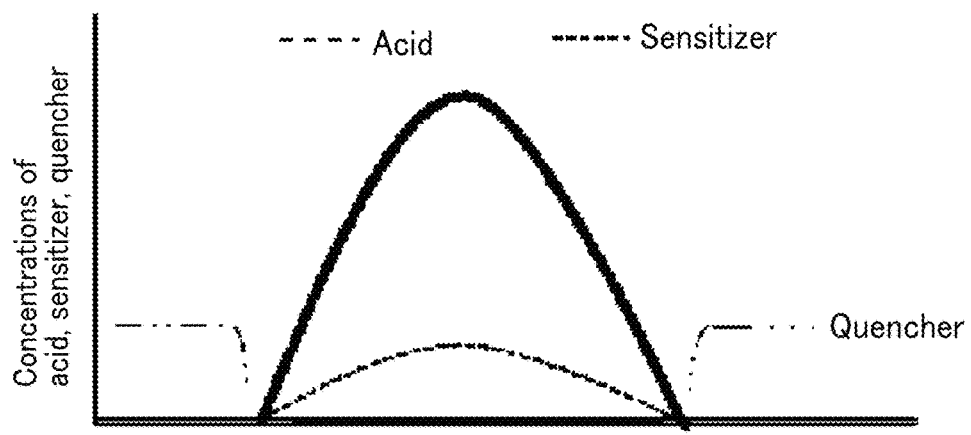

Next, the latent image forming energy beam is applied over an area as shown in FIG. 25C. For example, the latent image forming energy beam is a flood UV beam. The irradiation with the latent image forming energy beam causes production of both the acid and the sensitizer over the area.

Such light-induced acid amplification occurs through a non-thermal diffusion reaction at room temperature. This novel process has achieved a sensitivity ten times higher than that to be obtained through a single EB exposure. Basically, the light exposure is continued until the acid generator is consumed substantially completely. Accordingly, a higher concentration of quencher can be used, and the photon shot noise and the line width can be reduced.

Hereinafter, Examples 1 to 33 based on the present invention will be described with reference to FIGS. 26A to 55B.

Example 1

A poly(methyl methacrylate) resin (product of Sigma-Aldrich, hereinafter, referred to as "PMMA") was employed for a resist layer. The resist layer (PMMA) had a molecular weight of 350 k and a film thickness of 100 nm. In an activating step, the resist layer was irradiated with an electron beam at an irradiation current of 30 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 5 minutes as an interval. Subsequently, a latent pattern image forming step was performed. In the latent pattern image forming step, the resist layer was irradiated with an electron beam at an electron current of 200 μA (20 μC/cm$^2$) and an acceleration voltage of 100 kV ten times (dose: 200 μC/cm$^2$) under a stream of nitrogen gas (oxygen concentration: no greater than 100 ppm) using an electron beam radiation source (model: EB-ENGINE), product of Hamamatsu Photonics K.K., as a latent pattern image forming section.

Figure 26A:
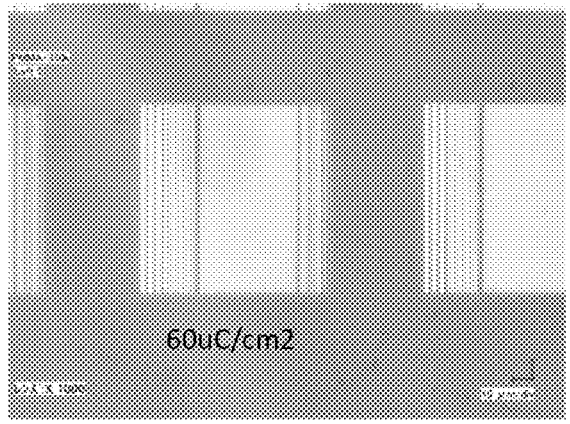
FIGS. 26A-26D are diagrams showing results of developing in Example 1.
Figure 26B:
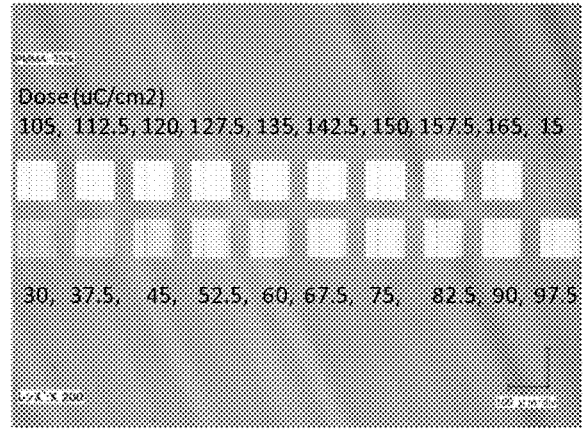
Figure 26C:
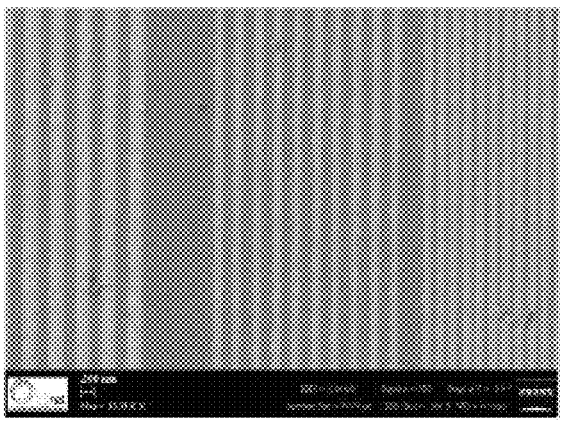
Figure 26D:
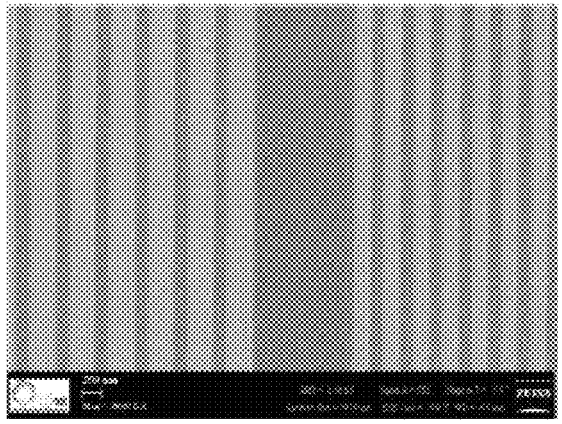

In a developing step, the resist layer was developed at 13° C. for 60 seconds with a developing solution obtained by mixing methyl isobutyl ketone (MIBK) and 2-propanol (IPA) at a ratio of 1:3. FIGS. 26A-26D show results of the developing in Example 1. A left-side portion of FIG. 26C shows lines and spaces having a size of 200 nm obtained after the processing with respect to lines and spaces having a design size of 200 nm. A middle portion of FIG. 26C shows lines (processed portions) having a size of 120 nm and spaces (unprocessed portions) having a size of 180 nm obtained after the processing with respect to lines having a design size of 100 nm and spaces having a design size of 200 nm. A right-side portion of FIG. 26C shows lines (processed portions) having a size of 120 nm and spaces (unprocessed portions) having a size of 30 nm obtained after the processing with respect to lines having a design size of 100 nm and spaces having a design size of 50 nm. A left-side portion of FIG. 26D shows lines (processed portions) having a size of 260 nm and spaces (unprocessed portions) having a size of 140 nm obtained after the processing with respect to lines and spaces having a design size of 200 nm. A right-side portion of FIG. 26D shows lines (processed portions) having a size of 170 nm and spaces (unprocessed portions) having a size of 130 nm obtained after the processing with respect to lines having a design size of 100 nm and spaces having a design size of 200 nm.

The results of Example 1 indicate that the resist sensitivity evaluated based on the total absorbed dose in the combined irradiation (through the activating step and the latent pattern image forming step) was D (0)=2190 kGy, which was a smaller total energy value than the sensitivity D (0)=2925 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution.

Example 2

PMMA was employed for a resist layer. The resist layer (PMMA) had a molecular weight of 350 k and a film thickness of 100 nm. In an activating step, the resist layer was irradiated with an electron beam at an electron current of 200 pA (20 $\mu C/cm^2$) and an acceleration voltage of 100 kV ten times (dose: 200 $\mu C/cm^2$) under a stream of nitrogen gas (oxygen concentration: 50 ppm) using an electron beam radiation source (model: EB-ENGINE), product of Hamamatsu Photonics K.K., as an activating device.

After the activating step was performed, the resist layer was maintained in the atmosphere for 5 minutes as an interval. Subsequently, a latent pattern image forming step was performed. In the latent pattern image forming step, the resist layer was irradiated with an electron beam at an irradiation current of 30 pA and an acceleration voltage of 30 keV using a patterning device JSM-6500F (with a beam blanker, raster scanning), product of JEOL Ltd., as a latent pattern image forming section.

Figure 27:
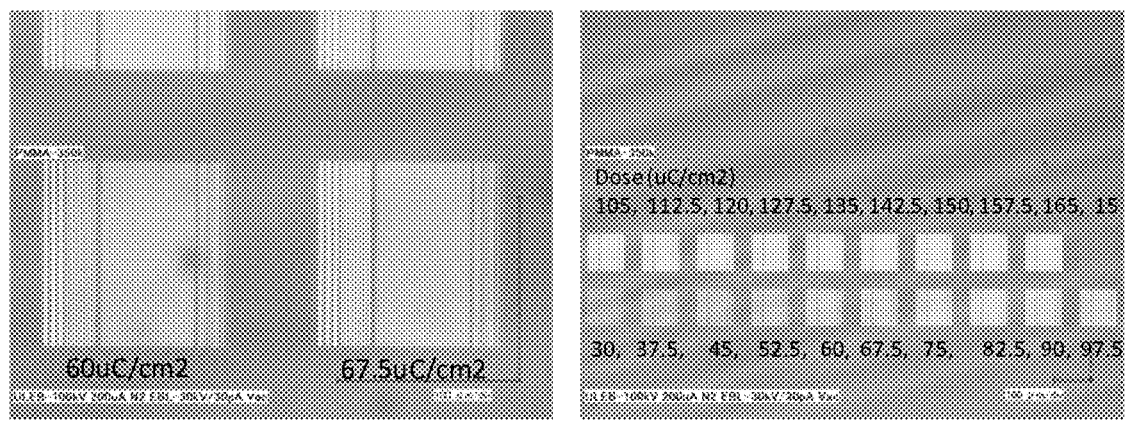
FIG. 27 is a diagram showing results of developing in Example 2.

In a developing step, the resist layer was developed at 13° C. for 60 seconds with a developing solution obtained by mixing MIBK and IPA at a ratio of 1:3. FIG. 27 shows results of the developing in Example 2.

The results of Example 2 indicate that the resist sensitivity evaluated based on the total absorbed dose in the combined irradiation (through the activating step and the latent pattern image forming step) was D (0)=2300 kGy, which was a smaller total energy value than the sensitivity D (0)=2925 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution.

Example 3

ZEP520A (product of Zeon Corporation, a copolymer of α-methylstyrene and methyl α-chloroacrylate) was employed for a resist layer. The resist layer (ZEP520A) had a film thickness of 280 nm. In an activating step, the resist layer was irradiated with an electron beam at an irradiation current of 30 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 5 minutes as an interval. Subsequently, a latent pattern image forming step was performed. In the latent pattern image forming step, the resist layer was irradiated with an electron beam at an electron current of 100 $\mu A$ (10 $\mu C/cm^2$) and an acceleration voltage of 100 kV four times (dose: 40 $\mu C/cm^2$) under a stream of nitrogen gas (oxygen concentration: 100 ppm) using an electron beam radiation source (model: EB-ENGINE), product of Hamamatsu Photonics K.K., as a latent pattern image forming section.

Figure 28A:
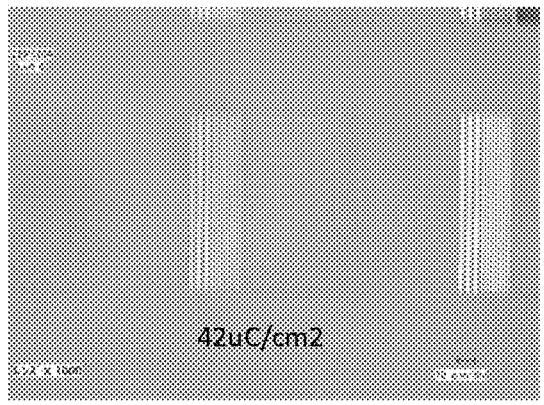
FIGS. 28A-28D are diagrams showing results of developing in Example 3.
Figure 28B:
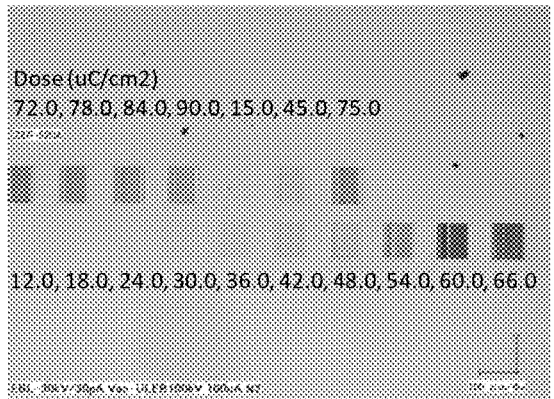
Figure 28C:
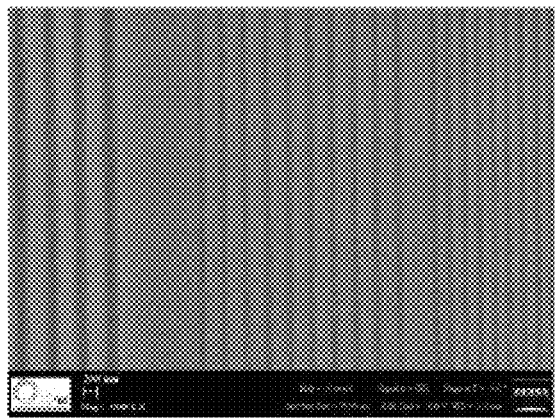
Figure 28D:
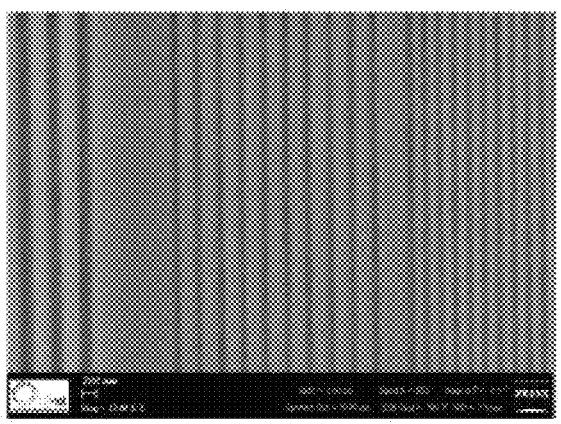

In a developing step, the resist layer was developed at 13° C. for 60 seconds with a developing solution ZED-N50 (product of Zeon Corporation). FIGS. 28A-28D show results of the developing in Example 3. A left-side portion of FIG. 28C shows lines (processed portions) having a size of 110 nm and spaces (unprocessed portions) having a size of 190 nm obtained after the processing with respect to lines having a design size of 100 nm and spaces having a design size of 200 nm. A middle portion of FIG. 28C shows lines (processed portions) having a size of 50 nm and spaces (unprocessed portions) having a size of 200 nm obtained after the processing with respect to lines having a design size of 50 nm and spaces having a design size of 200 nm. A right-side portion of FIG. 28C shows lines (processed portions) having a size of 50 nm and spaces (unprocessed portions) having a size of 100 nm obtained after the processing with respect to lines having a design size of 50 nm and spaces having a design size of 100 nm. A left-side portion of FIG. 28D shows lines (processed portions) having a size of 150 nm and spaces (unprocessed portions) having a size of 150 nm obtained after the processing with respect to lines having a design size of 100 nm and spaces having a design size of 200 nm. A middle portion of FIG. 28D shows lines (processed portions) having a size of 55 nm and spaces (unprocessed portions) having a size of 195 nm obtained after the processing with respect to lines having a design size of 50 nm and spaces having a design size of 200 nm. A right-side portion of FIG. 28D shows lines (processed portions) having a size of 102 nm and spaces (unprocessed portions) having a size of 98 nm obtained after the processing with respect to lines having a design size of 100 nm and spaces having a design size of 100 nm.

The results of Example 3 indicate that the resist sensitivity evaluated based on the total absorbed dose in the combined irradiation (through the activating step and the latent pattern image forming step) was D (0)=862 kGy, which was a smaller total energy value than the sensitivity D (0)=1050 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution.

Example 4

PMMA was employed for a resist layer. The resist layer (PMMA) had a molecular weight of 350 k and a film thickness of 100 nm. In the first activating step, the resist layer was irradiated with an electron beam at an electron current of 100 pA (20 $\mu C/cm^2$) and an acceleration voltage of 100 kV five times (dose: 100 $\mu C/cm^2$) under a stream of nitrogen gas (oxygen concentration <50 ppm) using an electron beam radiation source (model: EB-ENGINE), product of Hamamatsu Photonics K.K., as an activating device.

After the first activating step was performed, the resist layer was maintained in nitrogen gas for 5 minutes as an interval. Subsequently, the second activating step was performed. In the second activating step, the resist layer was irradiated with an electron beam at an irradiation current of 16 pA and an acceleration voltage of 30 keV using a patterning device JSM-6500F (with a beam blanker, raster scanning), product of JEOL Ltd., as an activating device.

In Example 4, after the second activating step was performed and the resist layer was maintained in nitrogen gas for 5 minutes as an interval, a latent pattern image forming step was performed. In the latent pattern image forming step, the resist layer was irradiated with an electron beam at an electron current of 100 μA (20 μC/cm$^2$) and an acceleration voltage of 100 kV five times (dose: 100 μC/cm$^2$) under a stream of nitrogen gas (oxygen concentration<50 ppm) using the same activating device as the activating device used when the first activating step was performed.

In a developing step, the resist layer was developed at 13° C. for 60 seconds with a developing solution obtained by mixing MIBK and IPA at a ratio of 1:3. FIG. 29A shows a result of the developing in Example 4.

The result of Example 4 indicates that the resist sensitivity evaluated based on the total absorbed dose in the combined irradiation (through the activating steps and the latent pattern image forming step) was D (0)=2190 kGy, which was a smaller total energy value than the sensitivity D (0)=2925 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution.

Example 5

A chemically amplified resist UV3 was employed for a resist layer. The resist layer (UV3) had a film thickness of 200 nm. In an activating step, the resist layer was irradiated with an electron beam at an irradiation current of 16 pA and an acceleration voltage of 30 keV using a patterning device JSM-6500F (with a beam blanker, raster scanning), product of JEOL Ltd., as an activating device.

After the activating step was performed, the resist layer was maintained in nitrogen gas for 5 minutes as an interval. Subsequently, a latent pattern image forming step was performed. In the latent pattern image forming step, the resist layer was irradiated with an electron beam at an irradiation current of 50 μA (5 μC/cm$^2$) and an acceleration voltage of 100 kV twice (dose: 10 μC/cm$^2$) using an electron beam radiation source (model: EB-ENGINE), product of Hamamatsu Photonics, as a latent pattern image forming section.

After the latent image forming step was performed, a thermal treatment (PEB) was performed at 130° C. for 60 seconds. In a developing step, the resist layer was developed at 25° C. for 60 seconds with 2.38% tetramethyl ammonium hydroxide (hereinafter, referred to as "TMAH") as a developing solution. FIG. 29B shows a result of the developing in Example 5.

The result of Example 5 indicates that the resist sensitivity evaluated based on the total absorbed dose in the combined irradiation (through the activating step and the latent pattern image forming step) was D (0)=155 kGy, which was a smaller total energy value than the sensitivity D (0)=194 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution.

Example 6

A chemically amplified resist UV3 was employed for a resist layer. The resist layer (UV3) had a film thickness of 200 nm. In an activating step, the resist layer was irradiated with an electron beam at an electron current of 50 μA (5 μC/cm$^2$) and an acceleration voltage of 100 kV twice (dose: 10 μC/cm$^2$) using an electron beam radiation source (model: EB-ENGINE), product of Hamamatsu Photonics, as an activating device.

After the activating step was performed, the resist layer was maintained in nitrogen gas for 5 minutes as an interval. Subsequently, a latent pattern image forming step was performed. In the latent pattern image forming step, the resist layer was irradiated with an electron beam at an irradiation current of 16 pA and an acceleration voltage of 30 keV using a patterning device JSM-6500F (with a beam blanker, raster scanning), product of JEOL Ltd., as a latent pattern image forming section.

After the latent image forming step was performed, a thermal treatment (PEB) was performed at 130° C. for 60 seconds. In a developing step, the resist layer was developed at 25° C. for 60 seconds with 2.38% TMAH as a developing solution. FIG. 29C shows a result of the developing in Example 6.

The result of Example 6 indicates that the resist sensitivity evaluated based on the total absorbed dose in the combined irradiation (through the activating step and the latent pattern image forming step) was D (0)=167 kGy, which was a smaller total energy value than the sensitivity D (0)=194 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution.

Example 7

PMMA was employed for a resist layer. The resist layer (PMMA) had a molecular weight of 350 k and a film thickness of 100 nm. In an activating step, the resist layer was irradiated with an electron beam at an irradiation current of 30 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval, and then stored in vacuo. Subsequently, a latent pattern image forming step was performed. In the latent pattern image forming step, the resist layer was irradiated with a heavy ion Xe$^{54+}$ with an energy of 6 MeV/u at 7 nC/pulse, 1E+10 ion/cm$^2$ (vacuum: 5E-5 Pa), and 24° C. using a heavy particle cancer radiotherapy device (Heavy Ion Medical Accelerator in Chiba, hereinafter referred to as "HIMAC") of The National Institute of Radiological Sciences as a latent pattern image forming section.

Figure 30A:
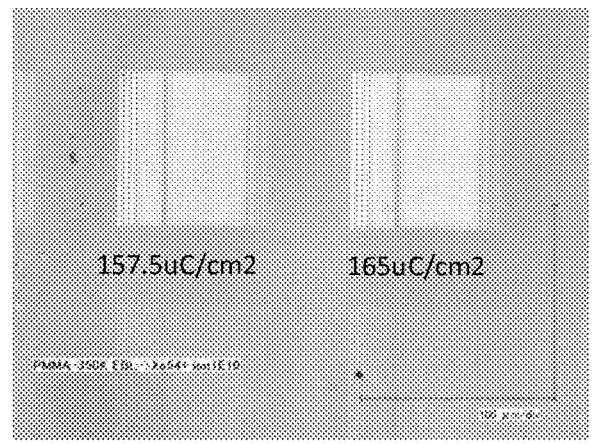
FIGS. 30A-30C are diagrams showing results of developing in Examples 7 to 9.

In a developing step, the resist layer was developed at 13° C. for 60 seconds with a developing solution obtained by mixing MIBK and IPA at a ratio of 1:3. FIG. 30A shows a result of the developing in Example 7.

The result of Example 7 indicates that the resist sensitivity evaluated based on the total absorbed dose in the combined irradiation (through the activating step and the latent pattern image forming step) was D (0)=2380 kGy, which was a smaller total energy value than the sensitivity D (0)=2925 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution. In the sensitivity evaluation with high LET radiation single exposure, an energy greater than a necessary quantity was given for the resist sensitivity to address greatly overlapping radiation tracks. Still, the result indicates reduction of the total energy dose.

Example 8

PMMA was employed for a resist layer. The resist layer (PMMA) had a molecular weight of 350 k and a film thickness of 100 nm. In an activating step, the resist layer was irradiated with an electron beam at an irradiation current of 30 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval, and then stored in vacuo. Subsequently, a latent pattern image forming step was performed. In the latent pattern image forming step, the resist layer was irradiated with a heavy ion $Kr^{36+}$ with an energy of 6 MeV/u at 7 nC/pulse, 1E+9 ion/$cm^2$ (vacuum: 5E-5 Pa), and 24° C. using the HIMAC as a latent pattern image forming section.

Figure 30B:
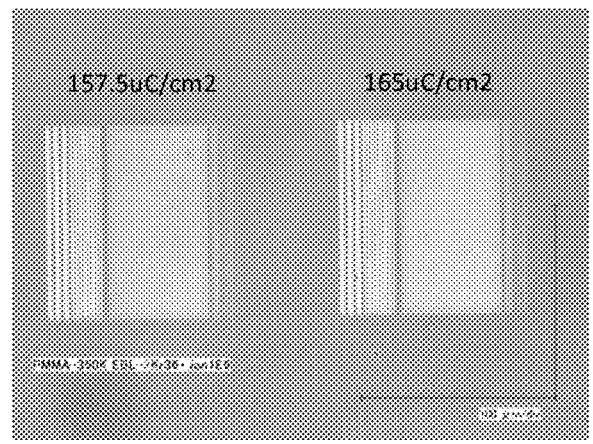

In a developing step, the resist layer was developed at 13° C. for 60 seconds with a developing solution obtained by mixing MIBK and IPA at a ratio of 1:3. FIG. 30B shows a result of the developing in Example 8.

The result of Example 8 indicates that the resist sensitivity evaluated based on the total absorbed dose in the combined irradiation (through the activating step and the latent pattern image forming step) was D (0)=2518 kGy, which was a smaller total energy value than the sensitivity D (0)=2925 kGy in the case of a single patterned exposure. This means that the re-exposing while maintaining the active substance, rather than exposing to a dose near a threshold in the resist sensitivity curve and then additionally exposing to a reduced dose, takes advantage of a non-linear reaction and enables the resist to achieve a high sensitivity while maintaining the resolution. In the sensitivity evaluation with high LET radiation single exposure, an energy greater than a necessary quantity was given for the resist sensitivity to address greatly overlapping radiation tracks. Still, the result indicates reduction of the total energy dose.

Example 9

ZEP520A (product of Zeon Corporation) was employed for a resist layer. The resist layer (ZEP520A) had a film thickness of 280 nm. In an activating step, the resist layer was irradiated with an electron beam at an irradiation current of 30 pA and an acceleration voltage of 30 keV using a patterning device JSM-6500F (with a beam blanker, raster scanning), product of JEOL Ltd., as an activating device.

After the activating step was performed, a latent pattern image forming step was performed. In the latent pattern image forming step, the resist layer was irradiated in the atmosphere only with light (dose: 2 J/$cm^2$) having a wavelength that is not absorbed by the resist (365 nm) obtained through a filter and using a high-pressure mercury lamp as a latent pattern image forming section.

Figure 30C:
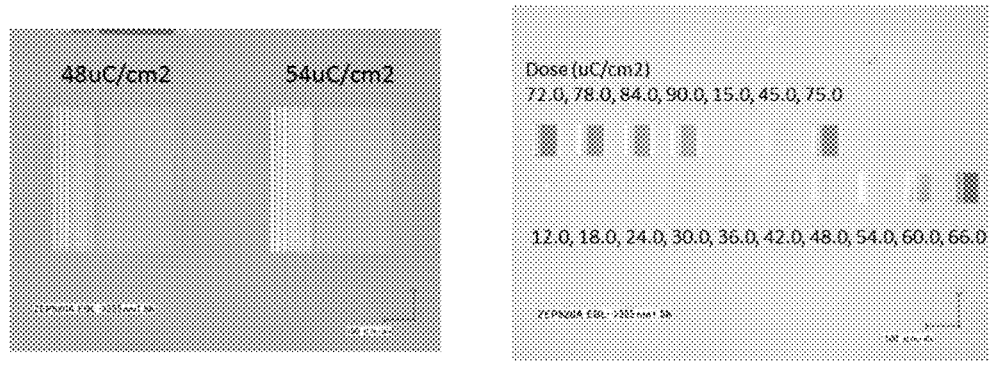

In a developing step, the resist layer was developed at 22° C. for 60 seconds with a developing solution ZED-N50 (product of Zeon Corporation). FIG. 30C shows a result of the developing in Example 9.

The result of Example 9 indicates that a higher sensitivity E(0) (54 uC/$cm^2$) can be achieved in the patterning involving the UV exposure than in the patterning by a single patterned exposure, although the wavelength of the UV light does not induce a reaction in the conventional art.

Comparative Example 1

In Comparative Example 1, resist exposure was performed by the following process (single exposure process) for comparison with Example 9. ZEP520A (product of Zeon Corporation) was employed for a resist layer. The resist layer (ZEP520A) had a film thickness of 280 nm. The resist layer was irradiated in the atmosphere only with light of 365 nm (dose: 2 J/$cm^2$) obtained through a filter and using a high-pressure mercury lamp. In a developing step, developing the resist layer was attempted at 22° C. for 60 seconds with a developing solution ZED-N50 (product of Zeon Corporation) but failed. No change in the film thickness or the like was observed.

Example 10

PMMA was employed for a resist layer. The resist layer (PMMA) had a molecular weight of 350 k and a film thickness of 100 nm. In an activating step, the resist layer was irradiated with an electron beam at an electron current of 200 µA (20 µC/$cm^2$) and an acceleration voltage of 100 kV ten times (dose: 200 µC/$cm^2$) under a stream of nitrogen gas (oxygen concentration: 50 ppm) using an electron beam radiation source (model: EB-ENGINE), product of Hamamatsu Photonics K.K., as an activating device.

After the activating step was performed, the sample was maintained in vacuo for 24 hours. Subsequently, a latent pattern image forming step was performed. In the latent pattern image forming step, the resist layer was irradiated with soft X-rays of 3.1 nm (horizontal, resolution: 30000, with Cr mirrors) with a flux of 4.43E+9 photons/s in a spectroscopy beamline BL27SU in vacuo (1E-4 Pa) using SPring-8 as a latent pattern image forming section.

In a developing step, the resist layer was developed at 13° C. for 60 seconds with a developing solution obtained by mixing MIBK and IPA at a ratio of 1:3. As a result, the resist layer had a sensitivity of an exposure dose of 50.8 mJ/$cm^2$.

Comparative Example 2

In Comparative Example 2, resist exposure was performed by the following process (single exposure process) for comparison with Example 10. PMMA (product of Sigma-Aldrich, molecular weight: 350 k) was employed for a resist layer. The resist layer (PMMA) had a film thickness of 100 nm. The resist layer was irradiated with soft X-rays of 3.1 nm (horizontal, resolution: 30000, with Cr mirrors) with a flux of 4.43E+9 photons/s in a spectroscopy beamline BL27SU in vacuo (1E-4 Pa) using SPring-8. In a developing step, the resist layer was developed at 13° C. for 60 seconds with a developing solution obtained by mixing MIBK and IPA at a ratio of 1:3. As a result, the resist layer had a sensitivity of an exposure dose of 220 mJ/$cm^2$.

Example 11

PMMA was employed for a resist layer. The resist layer (PMMA) had a molecular weight of 350 k and a film thickness of 100 nm. In an activating step, the resist layer was irradiated with an electron beam at an electron current of 200 μA (20 μC/cm$^2$) and an acceleration voltage of 100 kV ten times (dose: 200 μC/cm$^2$) under a stream of nitrogen gas (oxygen concentration: 50 ppm) using an electron beam radiation source (model: EB-ENGINE), product of Hamamatsu Photonics K.K., as an activating device.

After the activating step was performed, the sample was maintained in vacuo for 24 hours. Subsequently, a latent pattern image forming step was performed. In the latent pattern image forming step, the resist layer was irradiated with EUV light of 6.7 nm (vertical, resolution: 10000, with Cr mirrors) with a flux of 1.09E+10 photons/s in a spectroscopy beamline BL27SU in vacuo (1E-4 Pa) using SPring-8 as a latent pattern image forming section.

In a developing step, the resist layer was developed at 13° C. for 60 seconds with a developing solution obtained by mixing MIBK and IPA at a ratio of 1:3. As a result, the resist layer had a sensitivity of an exposure dose of 87.3 mJ/cm$^2$.

Example 12

PMMA was employed for a resist layer. The resist layer (PMMA) had a molecular weight of 350 k and a film thickness of 100 nm. In an activating step, the resist layer was irradiated with EUV light of 6.7 nm (vertical, resolution: 10000, with Cr mirrors) with a flux of 1.09E+10 photons/s in a spectroscopy beamline BL27SU in vacuo (1E-4 Pa) using SPring-8 as an activating device.

After the activating step was performed, the sample was maintained in the atmosphere for 5 hours. Subsequently, a latent pattern image forming step was performed. In the latent pattern image forming step, the resist layer was irradiated with an electron beam at an electron current of 200 μA (20 μC/cm$^2$) and an acceleration voltage of 100 kV ten times (dose: 200 μC/cm$^2$) under a stream of nitrogen gas (oxygen concentration: 50 ppm) using an electron beam radiation source (model: EB-ENGINE), product of Hamamatsu Photonics K.K., as a latent pattern image forming section.

In a developing step, the resist layer was developed at 13° C. for 60 seconds with a developing solution obtained by mixing MIBK and IPA at a ratio of 1:3. As a result, the resist layer had a sensitivity of an exposure dose of 94.6 mJ/cm$^2$.

Comparative Example 3

In Comparative Example 3, resist exposure was performed by the following process (single exposure process) for comparison with Examples 11 and 12. PMMA (product of Sigma-Aldrich, molecular weight: 350 k) was employed for a resist layer. The resist layer (PMMA) had a film thickness of 100 nm. The resist layer was irradiated with EUV light of 6.7 nm (vertical, resolution: 10000, with Cr mirrors) with a flux of 1.09E+10 photons/s in a spectroscopy beamline BL27SU in vacuo (1E-4 Pa) using SPring-8. In a developing step, the resist layer was developed at 13° C. for 60 seconds with a developing solution obtained by mixing MIBK and IPA at a ratio of 1:3. As a result, the resist layer had a sensitivity of an exposure dose of 430 mJ/cm$^2$.

In the embodiments according to the present invention, it is possible to form a high-precision resist pattern by pattern shape irradiation at a low dose by combining the pattern shape irradiation with multiple times of area irradiation with controlling the surrounding environment (maintaining or increasing the active substance) during or after the irradiation. As indicated by Example 9, it is possible to form a resist pattern by performing the area irradiation even at a wavelength to which the unirradiated resist is not reactive at all after the pattern shape irradiation as long as the active substance is reacted.

Example 13

Hereinafter, Example 13 will be described. In Example 13, a mixture obtained by adding 0.05 M of DPI-PFBS as an acid generator (hereinafter, referred to as "PAG") and 0.1 M of DOMeBzH as a sensitizer precursor to a methyl methacrylate-based polymer (hereinafter, referred to as "MMA") as a base resin dissolved in cyclohexanone was prepared as a resist material of Example 13. The resist material thus prepared was applied onto a HMDS-treated silicon substrate by spin coating at 2000 rpm for 30 seconds using a spin coater (Mikasa Co., Ltd.). The spin coating was followed by a thermal treatment at 100° C. for 1 minute. The film thickness after the spin coating was measured using an atomic force microscope (hereinafter, referred to "AFM", NanoNavi II/SPA-300HV, Hitachi High-Tech Science) to be 450 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed. In the latent pattern image forming step, whole-area ultraviolet exposure was performed in the atmosphere for 30 seconds, 1 minute, 2 minutes, 3 minutes, 5 minutes, and 10 minutes using a light source with 1 mW/h and a black light (320 nm), product of Toshiba Corporation, as a latent pattern image forming section. After the latent image forming step was performed, a thermal treatment (PEB) was performed at 100° C. for 60 seconds. In a developing step, the resist layer was developed at 25° C. for 1 minute with 2.38% tetramethyl ammonium hydroxide (hereinafter, referred to as "TMAH") as a developing solution.

One or more samples were subjected to a thermal treatment at 100° C. for 1 minute after the activating step and the resist layer thereof was developed at 25° C. for 1 minute with 2.38% TMAH as a developing solution in the developing step.

Figure 31:
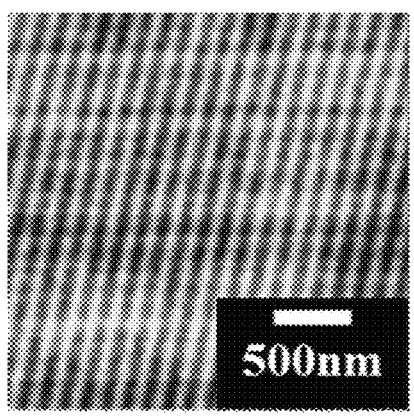
FIG. 31 is a diagram showing a result of developing in Example 13.

FIG. 31 shows an AFM image of a 75-nm line-and-space pattern written after the developing in Example 13. FIG. 31 indicates that the 75-nm line-and-space pattern written according to the present embodiment has a high resolution.

Figure 32:
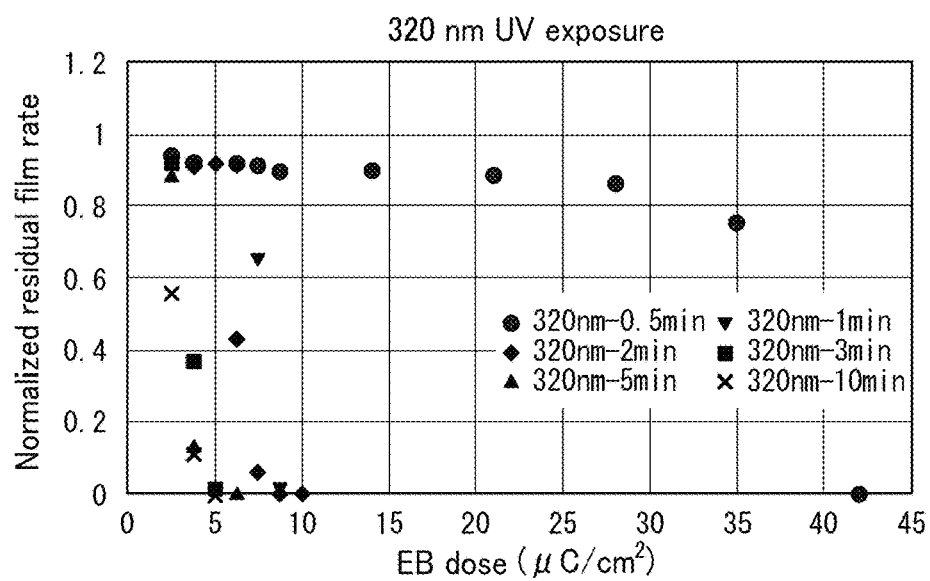
FIG. 32 is a graph showing sensitivity curves in Example 13.

FIG. 32 shows curves of the sensitivity to the electron beam in the case where the whole-area ultraviolet exposure was performed. FIG. 32 indicates that the dose representing the sensitivity $E_0$ of the resist material to the electron beam decreases with increase in the ultraviolet exposure dose.

Example 14

A resist material was prepared in the same manner as in the resist material of Example 13 except that no sensitizer precursor was added, and the processes up to completion of the developing were performed under the same conditions.

The resist material prepared was applied onto a HMDS-treated silicon substrate by spin coating at 2000 rpm for 30 seconds using a spin coater (Mikasa Co., Ltd.). The spin coating was followed by a thermal treatment at 100° C. for 1 minute. The film thickness after the spin coating was measured using an AFM to be 450 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

A thermal treatment was performed at 100° C. for 1 minute after the activating step, and the resist layer was developed at 25° C. for 1 minute with 2.38% TMAH as a developing solution in a developing step.

Figure 33:
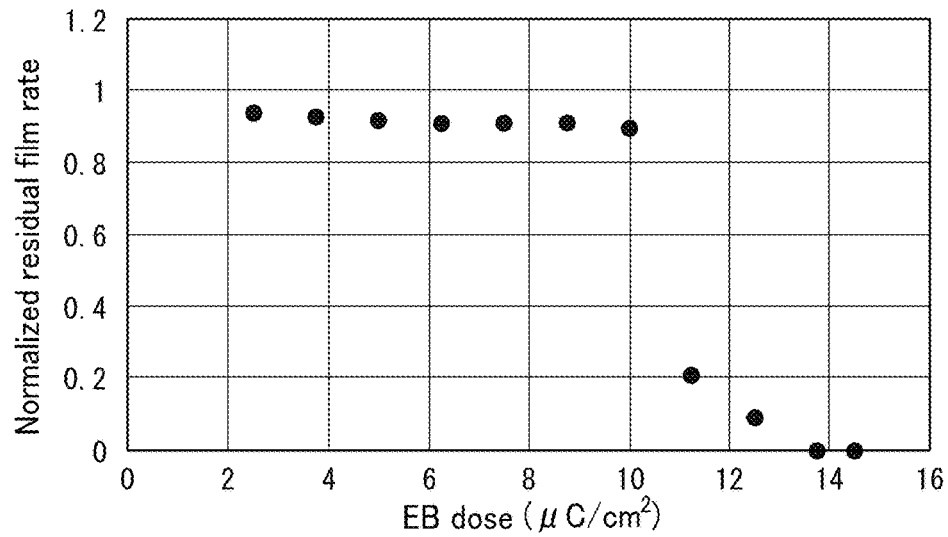
FIG. 33 is a diagram showing a result of developing in Example 14.

FIG. 33 shows a sensitivity curve of the resist material after the developing. The dose representing the sensitivity $E_0$ was approximately 12 mC/cm$^2$.

Figure 34:
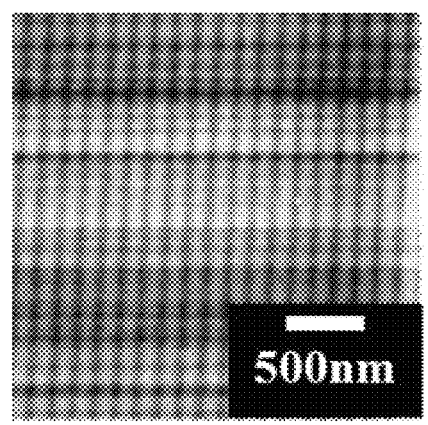
FIG. 34 is a graph showing a sensitivity curve in Example 14.

FIG. 34 shows an AFM image of a 75-nm line-and-space pattern written after the developing in Example 14. FIG. 34 indicates that the 75-nm line-and-space pattern written by the electron beam writing has a high resolution.

Other samples of the resist layer were maintained in the atmosphere for 1 minute as an interval after the activating step was performed. Subsequently, a latent pattern image forming step was performed. In the latent pattern image forming step, whole-area ultraviolet exposure was performed in the atmosphere for 1 minute, 5 minutes, 10 minutes, 15 minutes, and 30 minutes using a light source with 1 mW/h and a black light (320 nm), product of Toshiba Corporation, as a latent pattern image forming section.

After the latent image forming step was performed, a thermal treatment was performed at 100° C. for 60 seconds. In a developing step, the resist layer was developed at 25° C. for 1 minute with 2.38% TMAH as a developing solution.

The dose representing the sensitivity $E_0$ to the electron beam after the exposure to the ultraviolet having a wavelength of 320 nm is shown in a table. The values were substantially equal to the dose representing the sensitivity $E_0$ in the case where no ultraviolet exposure was performed, indicating that the sensitivity was not increased by the ultraviolet exposure, unlike the resist material of Example 13 containing the photo-acid generator.

TABLE 1

| | 1 minute | 5 minutes | 10 minutes | 15 minutes | 30 minutes |
|---|---|---|---|---|---|
| $E_0$ (μC/cm$^2$) | 12.1 | 12.0 | 12.2 | 12.1 | 12.0 |

Example 15

The same resist material as in Example 13 was prepared, and a sensitivity curve thereof in the case where no ultraviolet exposure was performed was obtained. The steps other than that of the ultraviolet exposure were the same as in Example 13.

Figure 35:
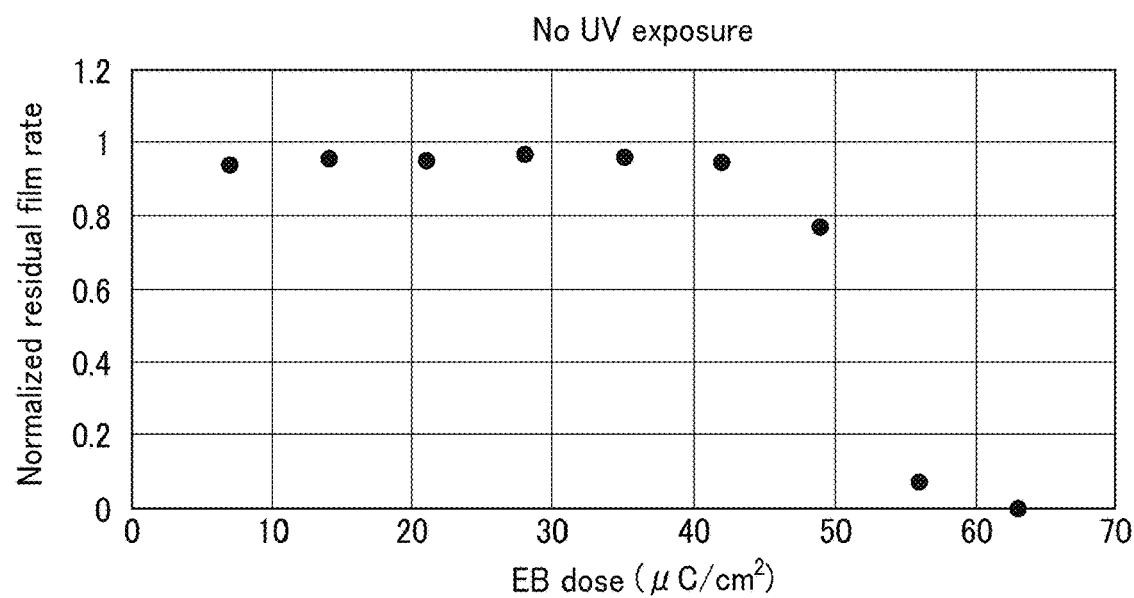
FIG. 35 is a graph showing a sensitivity curve in Example 15.

FIG. 35 shows the sensitivity curve. The dose representing the sensitivity $E_0$ was 56.5 mC/cm$^2$, indicating that the sensitivity has been significantly increased by the involvement of the latent image forming step described in Example 13 in which ultraviolet light irradiation was performed.

Example 16

The resist material prepared in Example 13 was applied onto a HMDS-treated silicon substrate by spin coating at 2000 rpm for 30 seconds using a spin coater (Mikasa Co., Ltd.) After the coating, a thermal treatment was performed at 100° C. for 1 minute. The film thickness after the coating was 450 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed. In the latent pattern image forming step, whole-area ultraviolet exposure was performed in the atmosphere for 10 minutes, 15 minutes, and 30 minutes using a light source with 1 mW/h and a black light (365 nm), product of Hitachi, Ltd., as a latent pattern image forming section.

A thermal treatment was performed at 100° C. for 1 minute after the latent image forming step, and the resist layer was developed at 25° C. for 1 minute with 2.38% TMAH as a developing solution in a developing step.

One or more samples were subjected to a thermal treatment at 100° C. for 1 minute after the activating step, and the resist layer thereof was developed at 25° C. for 1 minute with 2.38% TMAH as a developing solution in the developing step.

Figure 36:
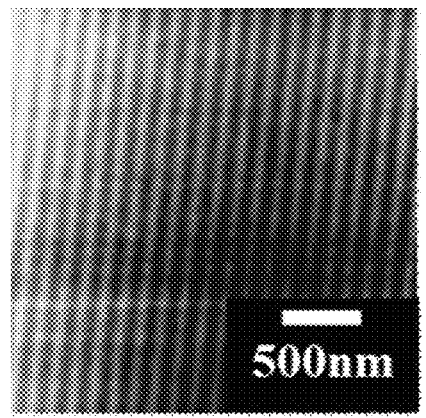
FIG. 36 is a diagram showing a result of developing in Example 15.

FIG. 36 shows an AFM image of a 75-nm line-and-space pattern written after the developing in Example 16. FIG. 36 indicates that the 75-nm line-and-space pattern written by the present electron-light combined irradiation process has a high resolution.

Figure 37:
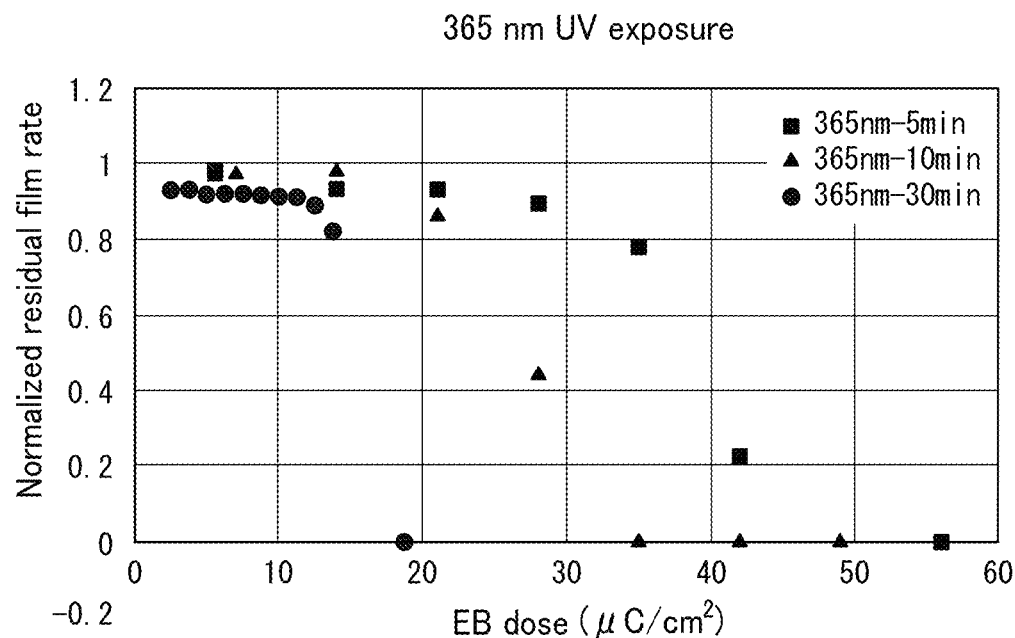
FIG. 37 is a graph showing sensitivity curves in Example 16.

FIG. 37 shows curves of the sensitivity to the electron beam in the case where the whole-area exposure to the 365-nm ultraviolet was performed. FIG. 37 indicates that the dose representing the sensitivity $E_0$ of the resist material to the electron beam decreases with increase in the ultraviolet exposure dose.

Example 17

A resist material was prepared in the same manner as in the resist material of Example 16 except that no sensitizer precursor was added, and the processes up to completion of the developing were performed on the resist material under the same conditions as in Example 16.

The resist material prepared was applied onto a HMDS-treated silicon substrate by spin coating at 2000 rpm for 30 seconds using a spin coater (Mikasa Co., Ltd.) The spin coating was followed by a thermal treatment at 100° C. for 1 minute.

The film thickness after the spin coating was measured using an AFM to be 450 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed. In the latent pattern image forming step, whole-area ultraviolet exposure was performed in the atmosphere for 10 minutes, 15 minutes, and 30 minutes using a light source with 1 mW/h and a black light (365 nm), product of Hitachi, Ltd., as a latent pattern image forming section.

After the latent image forming step was performed, a thermal treatment was performed at 100° C. for 60 seconds. In a developing step, the resist layer was developed at 25° C. for 1 minute with 2.38% TMAH as a developing solution.

The dose representing the sensitivity $E_0$ to the electron beam after the exposure to the ultraviolet having a wavelength of 365 nm is shown in a table. The values were substantially equal to the dose representing the sensitivity $E_0$ in the case where no ultraviolet exposure was performed, indicating that the sensitivity was not increased by the ultraviolet exposure, unlike the resist material of Example 13 containing the photo-acid generator.

TABLE 2

| | 10 minutes | 15 minutes | 30 minutes | 45 minutes | 60 minutes |
|---|---|---|---|---|---|
| $E_0$ ($\mu C/cm^2$) | 12.0 | 11.9 | 12.1 | 12.2 | 12.1 |

Example 18

The resist material prepared in Example 13 was applied onto a HMDS-treated silicon substrate by spin coating at 2000 rpm for 30 seconds using a spin coater (Mikasa Co., Ltd.) After the coating, a thermal treatment was performed at 100° C. for 1 minute. The film thickness after the coating was 450 nm.

In an activating step, the resist layer was irradiated with an electron beam at an irradiation current of 20 pA and an acceleration voltage of 30 keV using a patterning device JSM-6500F (with a beam blanker, raster scanning), product of JEOL Ltd., as an activating device.

Immediately after the activating step was performed, a latent pattern image forming step was performed. In the latent pattern image forming step, whole-area ultraviolet exposure was performed in vacuo for 5 minutes, 10 minutes, 15 minutes, and 30 minutes using a light source with 0.9 mW/h and an LED light source (365 nm, 3D LIME LIGHT) as a latent pattern image forming section.

After the latent image forming step was performed, a thermal treatment was performed at 100° C. for 60 seconds. In a developing step, the resist layer was developed at 24° C. for 1 minute with 2.38% TMAH as a developing solution.

Figure 38:
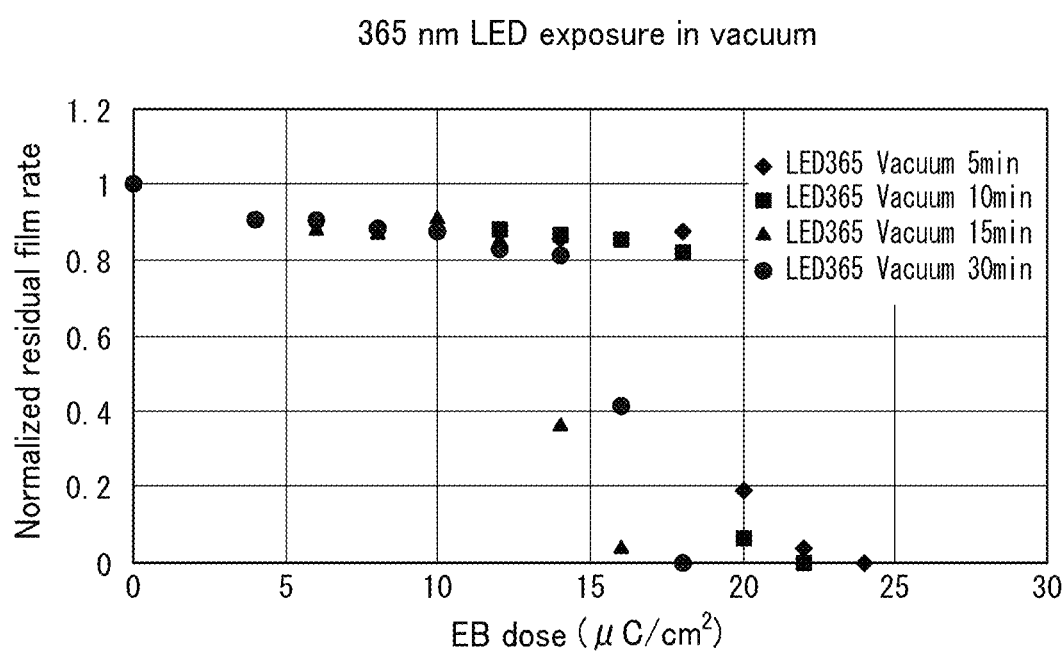
FIG. 38 is a graph showing sensitivity curves in Example 17.

FIG. 38 shows curves of the sensitivity to the electron beam in the case where the whole-area exposure to the 365-nm ultraviolet from the LED light source was performed in vacuo. FIG. 38 indicates that the dose representing the sensitivity $E_0$ of the resist material to the electron beam decreases with increase in the ultraviolet exposure dose.

Example 19

The resist material prepared in Example 13 was applied onto a HMDS-treated silicon substrate by spin coating at 2000 rpm for 30 seconds using a spin coater (Mikasa Co., Ltd.) After the coating, a thermal treatment was performed at 100° C. for 1 minute. The film thickness after the coating was 450 nm.

In an activating step, the resist layer was irradiated with an electron beam at an irradiation current of 20 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 2 minutes as an interval. Subsequently, a latent pattern image forming step was performed. In the latent pattern image forming step, whole-area ultraviolet exposure was performed in the atmosphere for 15 minutes, 30 minutes, and 45 minutes using a light source with 0.7 mW/h and an LED light source (365 nm, 3D LIME LIGHT) as a latent pattern image forming section.

After the latent image forming step was performed, a thermal treatment was performed at 100° C. for 60 seconds. In a developing step, the resist layer was developed at 24° C. for 1 minute with 2.38% TMAH as a developing solution.

Figure 39:
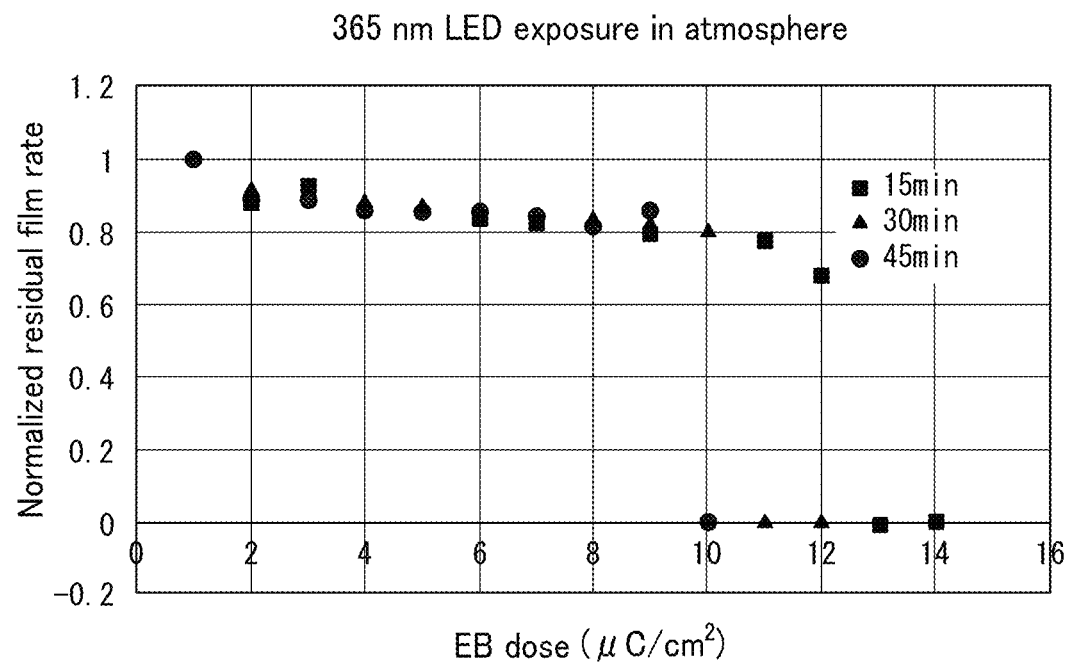
FIG. 39 is a graph showing sensitivity curves in Example 18.

FIG. 39 shows curves of the sensitivity to the electron beam in the case where the whole-area exposure to the 365-nm ultraviolet from the LED light source was performed in the atmosphere. FIG. 39 indicates that the dose representing the sensitivity $E_0$ of the resist material to the electron beam decreases with increase in the ultraviolet exposure dose.

Example 20

A mixture obtained by adding 0.1 M of TriOMeBzH as a sensitizer precursor to a system obtained by adding 0.05 M of PAG (DPI-PFBS) to an MMA dissolved in cyclohexanone was prepared as a resist material of Example 20. The resist material was applied onto a HMDS-treated silicon substrate by spin coating at 4000 rpm for 60 seconds using a spin coater (Mikasa Co., Ltd.) After the coating, a thermal treatment was performed at 100° C. for 1 minute. The film thickness after the coating was measured using an AFM to be 140 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed. In the latent pattern image forming step, whole-area ultraviolet exposure was performed in the atmosphere for 5 minutes, 10 minutes, and 30 minutes using a light source with 1 mW/h and a black light (320 nm), product of Toshiba Corporation, as a latent pattern image forming section.

A thermal treatment was performed at 100° C. for 1 minute after the latent image forming step, and the resist layer was developed at 25° C. for 1 minute with 2.38% TMAH as a developing solution in a developing step.

One or more samples were subjected to a thermal treatment at 100° C. for 1 minute after the activating step, and the resist layer thereof was developed at 25° C. for 1 minute with 2.38% TMAH as a developing solution in the developing step.

Figure 40:
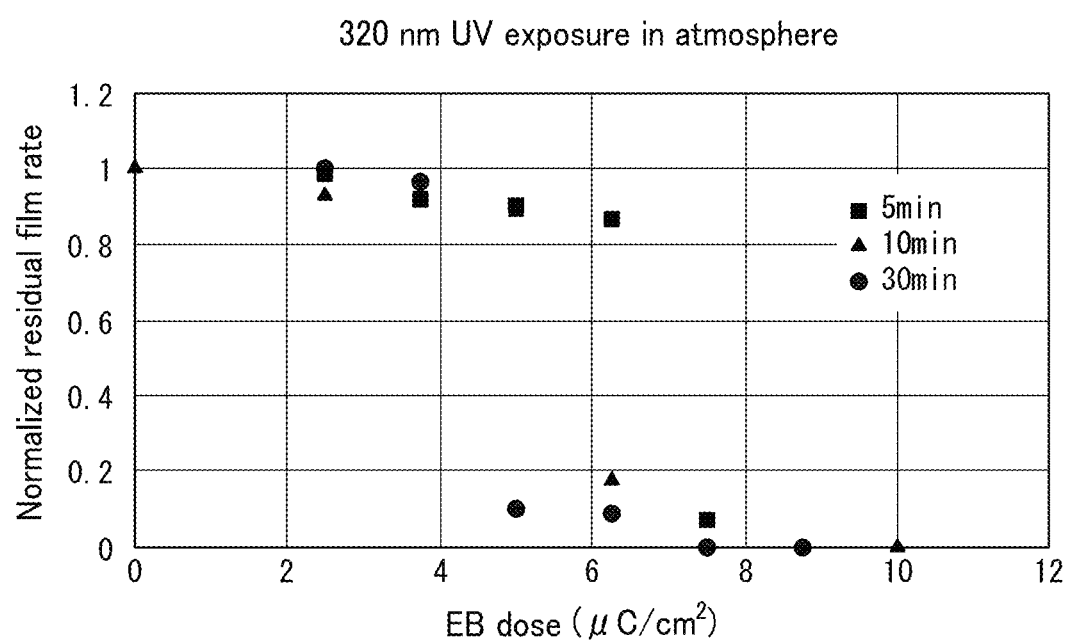
FIG. 40 is a graph showing sensitivity curves in Example 19.

FIG. 40 shows curves of the sensitivity to the electron beam in the case where the whole-area ultraviolet exposure was performed. FIG. 40 indicates that the dose representing the sensitivity $E_0$ of the resist material to the electron beam decreases with increase in the ultraviolet exposure dose.

Example 21

Figure 41:
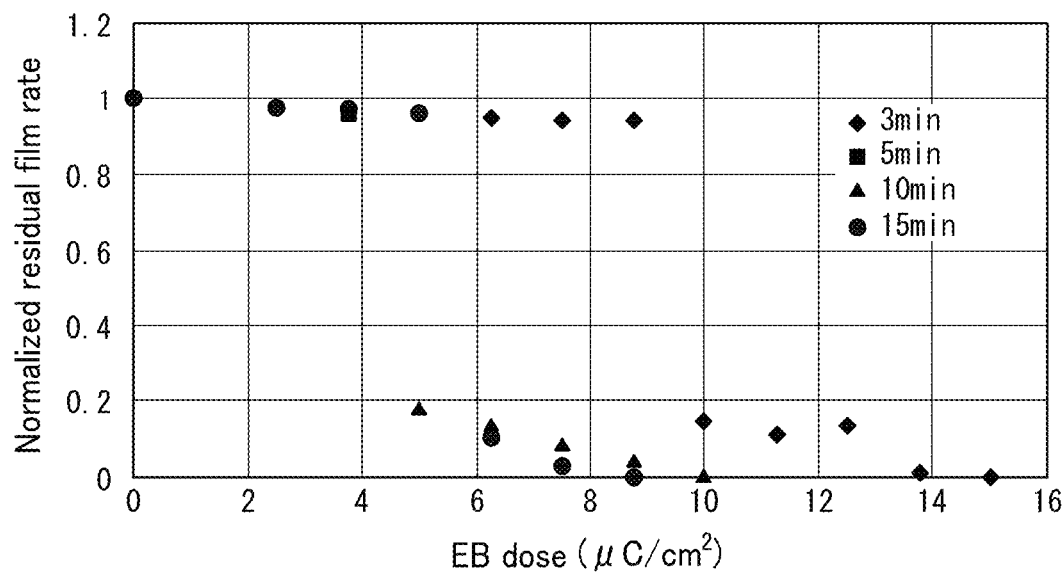
FIG. 41 is a graph showing sensitivity curves in Example 20.

A sensitivity curve of a resist material in the case where no ultraviolet exposure was performed was obtained. The steps other than that of the ultraviolet exposure were the same as in Example 20. FIG. 41 shows the sensitivity curve. The dose representing the sensitivity $E_0$ was 13.8 mC/cm$^2$, indicating that the sensitivity was increased by the involvement of the latent image forming step described in Example 20 in which ultraviolet light irradiation was performed.

Example 22

The resist material of Example 20 was applied onto a HMDS-treated silicon substrate by spin coating at 4000 rpm for 60 seconds using a spin coater (Mikasa Co., Ltd.) After the coating, a thermal treatment was performed at 100° C. for 1 minute. The film thickness after the coating was 140 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

Immediately after the activating step was performed, a latent pattern image forming step was performed. In the latent pattern image forming step, whole-area ultraviolet exposure was performed in vacuo for 3 minutes, 5 minutes, 10 minutes, and 15 minutes using a light source with 0.9 mW/h and an LED light source (365 nm, 3D LIME LIGHT) as a latent pattern image forming section.

After the latent image forming step was performed, a thermal treatment was performed at 100° C. for 60 seconds. In a developing step, the resist layer was developed at 24° C. for 1 minute with 2.38% TMAH as a developing solution.

Figure 42:
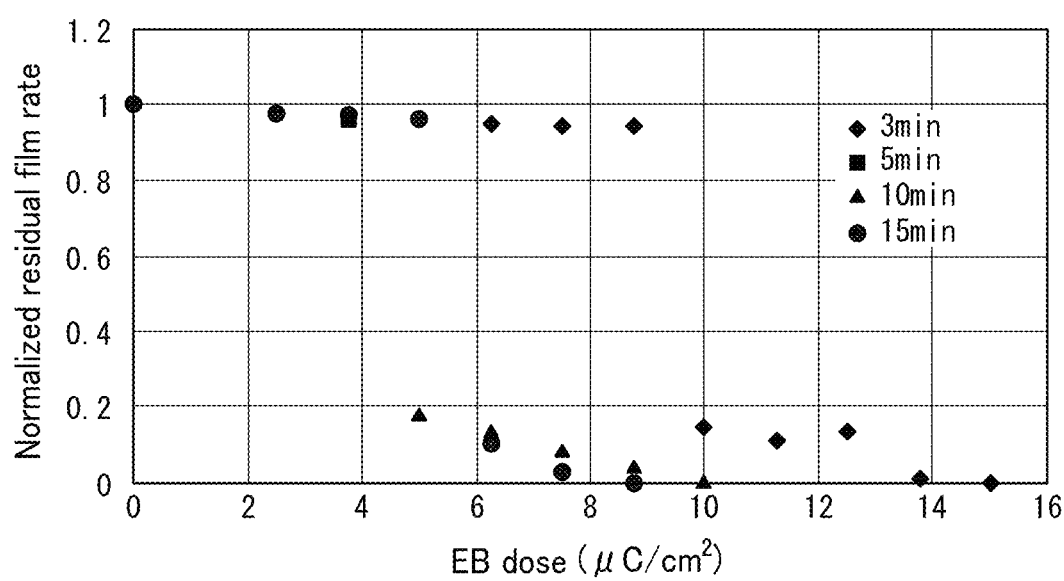
FIG. 42 is a graph showing sensitivity curves in Example 21.

FIG. 42 shows curves of the sensitivity to the electron beam in the case where the whole-area exposure to the 365-nm ultraviolet from the LED light source was performed in vacuo. FIG. 42 indicates that the dose representing the sensitivity $E_0$ of the resist material to the electron beam decreases with increase in the ultraviolet exposure dose.

Example 23

The resist material of Example 20 was applied onto a HMDS-treated silicon substrate by spin coating at 4000 rpm for 60 seconds using a spin coater (Mikasa Co., Ltd.) After the coating, a thermal treatment was performed at 100° C. for 1 minute. The film thickness after the coating was 140 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed. In the latent pattern image forming step, whole-area ultraviolet exposure was performed in the atmosphere for 5 minutes, 10 minutes, and 15 minutes using a light source with 0.7 mW/h and an LED light source (365 nm, 3D LIME LIGHT) as a latent pattern image forming section.

After the latent image forming step was performed, a thermal treatment was performed at 100° C. for 60 seconds. In a developing step, the resist layer was developed at 24° C. for 1 minute with 2.38% TMAH as a developing solution.

Figure 43:
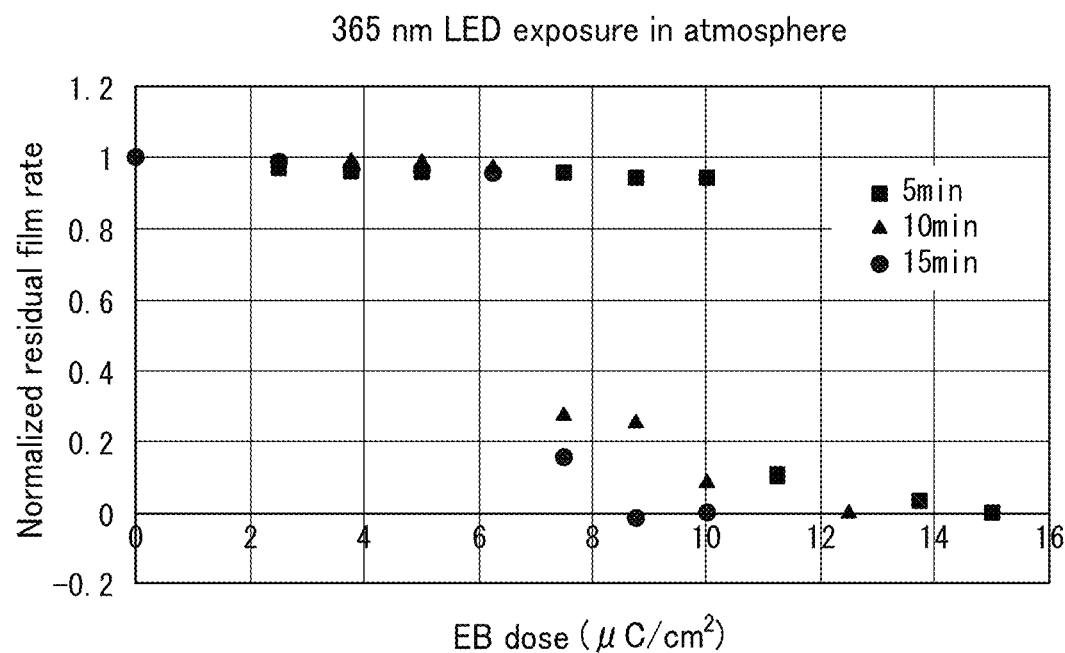
FIG. 43 is a graph showing sensitivity curves in Example 22.

FIG. 43 shows curves of the sensitivity to the electron beam in the case where the whole-area exposure to the 365-nm ultraviolet from the LED light source was performed in the atmosphere. FIG. 43 indicates that the dose representing the sensitivity $E_0$ of the resist material to the electron beam decreases with increase in the ultraviolet exposure dose.

Example 24

A mixture obtained by adding 0.1 M of DOBzMM as a sensitizer precursor to a system obtained by adding 0.05 M of an acid generator (hereinafter, referred to as "PAG", DPI-PFBS) to a methyl methacrylate-based polymer (hereinafter, referred to as "MMA") dissolved in cyclohexanone was prepared as a resist material of Example 24.

The resist material thus prepared was applied onto a HMDS-treated silicon substrate by spin coating at 4000 rpm for 120 seconds using a spin coater (Mikasa Co., Ltd.). The spin coating was followed by a thermal treatment at 100° C. for 1 minute.

The film thickness after the spin coating was measured using an AFM (NanoNavi II/SPA-300HV, Hitachi High-Tech Science) to be 90 nm.

In an activating step, the resist layer was irradiated with an electron beam at an irradiation current of 12.5 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed in vacuo.

In the latent pattern image forming step, whole-area ultraviolet exposure was performed in vacuo for 10 minutes and 15 minutes using a light source with 0.9 mW/h and an LED light source (365 nm, 3D LIME LIGHT) as a latent pattern image forming section. A sample that was not subjected to the ultraviolet irradiation was also prepared.

After the latent image forming step was performed, a thermal treatment was performed at 100° C. for 60 seconds. In a developing step, the resist layer was developed at 24° C. for 1 minute with 2.38% TMAH as a developing solution.

Figure 44:
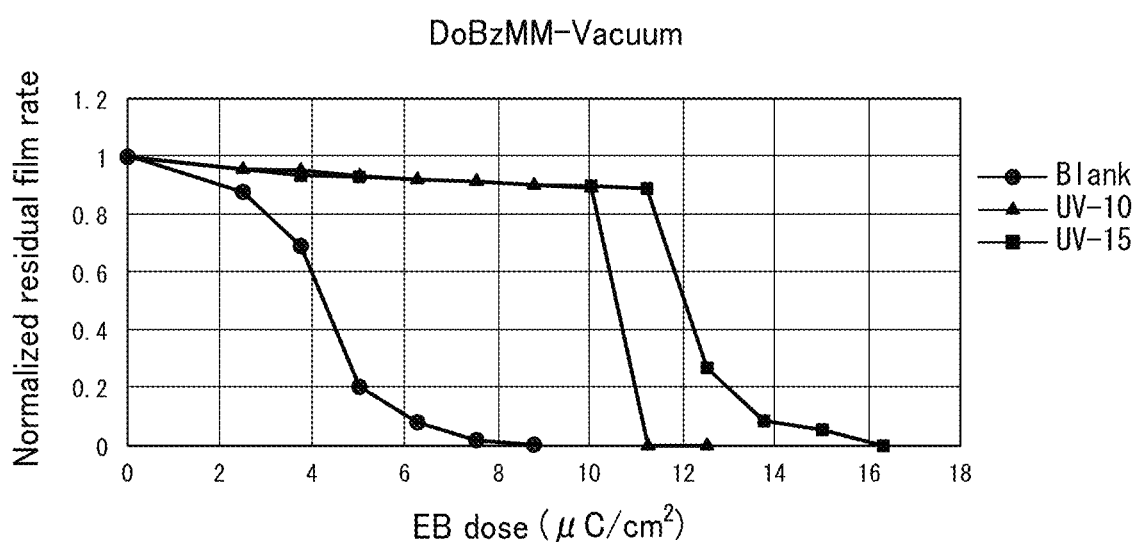
FIG. 44 is a graph showing sensitivity curves in Example 23.
Figure 45A:
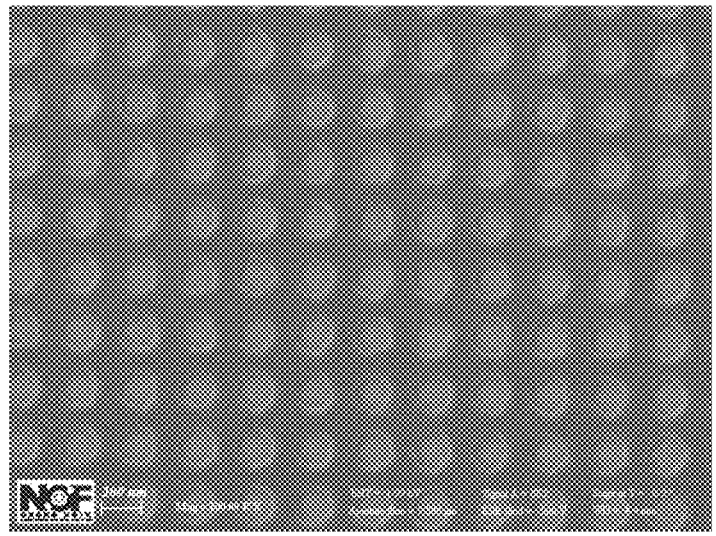
FIGS. 45A and 45B are diagrams showing results of developing in Example 24.
Figure 45B:
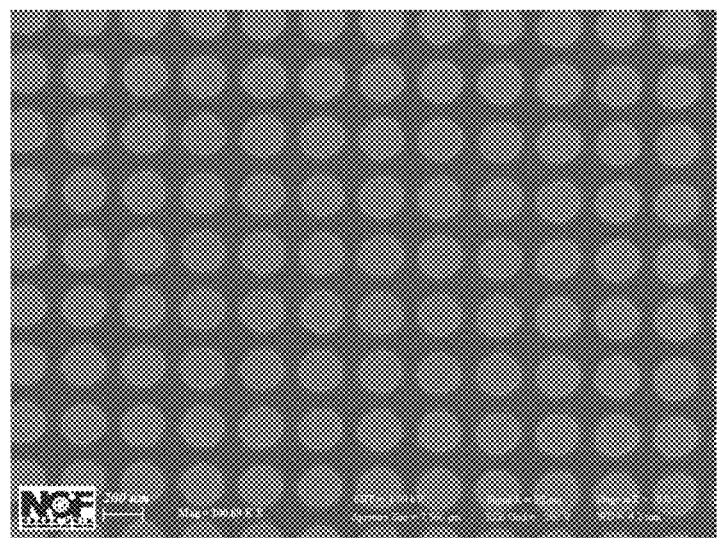
Figure 46A:
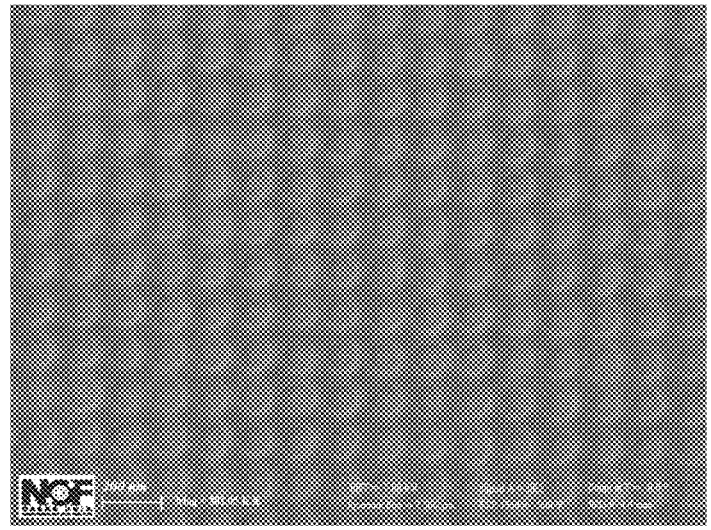
FIGS. 46A and 46B are diagrams showing results of developing in Example 24.
Figure 46B:
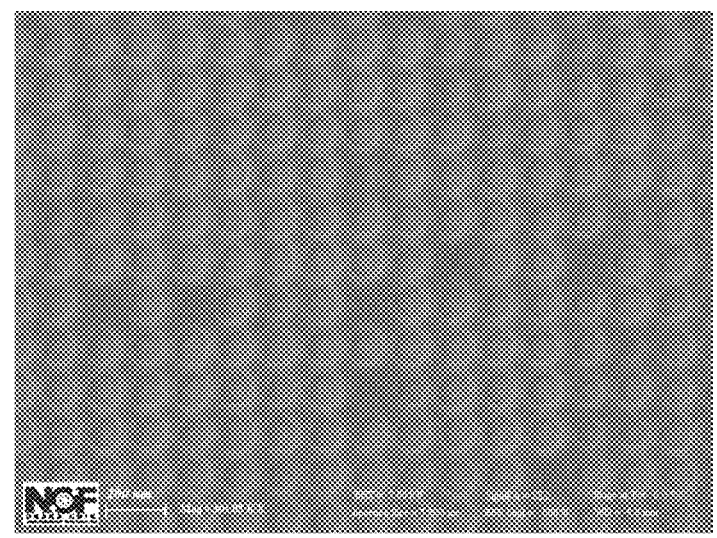
Figure 47A:
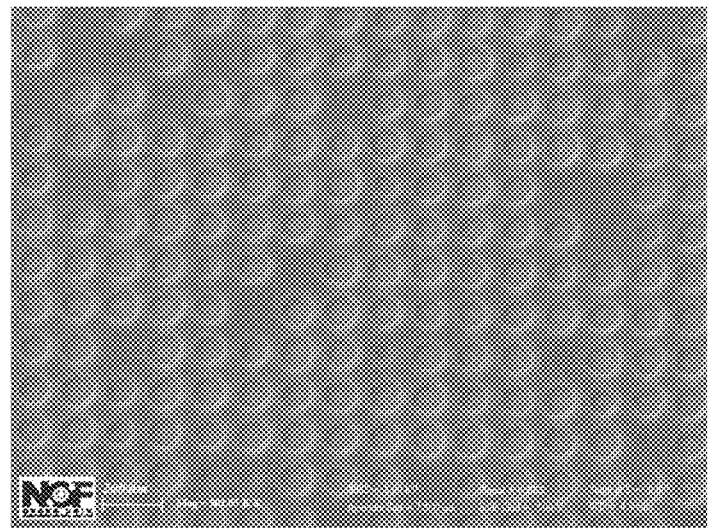
FIGS. 47A and 47B are diagrams showing results of developing in Example 24.
Figure 47B:
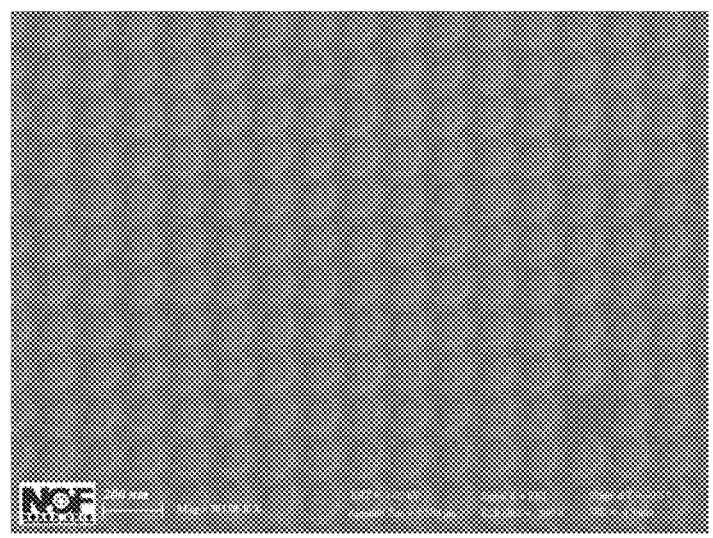

FIG. 44 shows curves of the sensitivity to the electron beam in the case where the whole-area exposure to the 365-nm ultraviolet from the LED light source was performed in vacuo. FIG. 44 indicates that the dose representing the sensitivity $E_0$ of the resist material to the electron beam decreases with increase in the ultraviolet exposure dose.

Example 25

A resist material was prepared by adding 0.005 M of trioctylamine (TOA) to the resist material of Example 24 and diluting the mixture five-fold with cyclohexanone. The resist material was applied by spin coating at 1000 rpm for 60 seconds. After the coating, a thermal treatment was performed at 100° C. for 1 minute. The film thickness after the coating was 50 nm.

In an activating step, the resist layer was irradiated with an electron beam at an irradiation current of 30 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 1 minute as an interval. Subsequently, a latent pattern image forming step was performed. In the latent pattern image forming step, whole-area ultraviolet exposure was performed in the atmosphere for 5 minutes, 10 minutes, and 15 minutes using a light source with 0.7 mW/h and SLUV-6 (365 nm), product of AS ONE Corporation, as a latent pattern image forming section.

A thermal treatment was performed at 100° C. for 1 minute after the latent pattern image forming step, and the resist layer was developed at 24° C. for 1 minute with 2.38% TMAH as a developing solution in a developing step.

One or more samples were subjected to a thermal treatment at 100° C. for 1 minute after the activating step, and the resist layer thereof was developed at 24° C. for 1 minute with 2.38% TMAH as a developing solution in the developing step. FIGS. 45A-47B show SEM images taken after the patterning through the latent image forming step.

Example 26

A resist layer prepared using the resist material of Example 25 was irradiated with 0.01 mJ/cm$^2$/s of extreme ultraviolet (EUV light) having a wavelength of 13.5 nm using a sensitivity evaluator (EQ-10M, xenon plasma, frame exposure) of Energetiq Technology, Inc. as an activating device in an activating step.

After the activating step was performed, the resist layer was maintained in a vacuum desiccator for 5 minutes as an interval. Subsequently, a latent pattern image forming step was performed. In the latent pattern image forming step, whole-area ultraviolet exposure was performed in the atmosphere for 5 minutes, 10 minutes, and 15 minutes using a light source with 0.7 mW/h and SLUV-6 (365 nm), product of AS ONE Corporation, as a latent pattern image forming section.

A thermal treatment was performed at 100° C. for 1 minute after the latent image forming step, and the resist layer was developed at 24° C. for 1 minute with 2.38% TMAH as a developing solution in a developing step.

Figure 48:
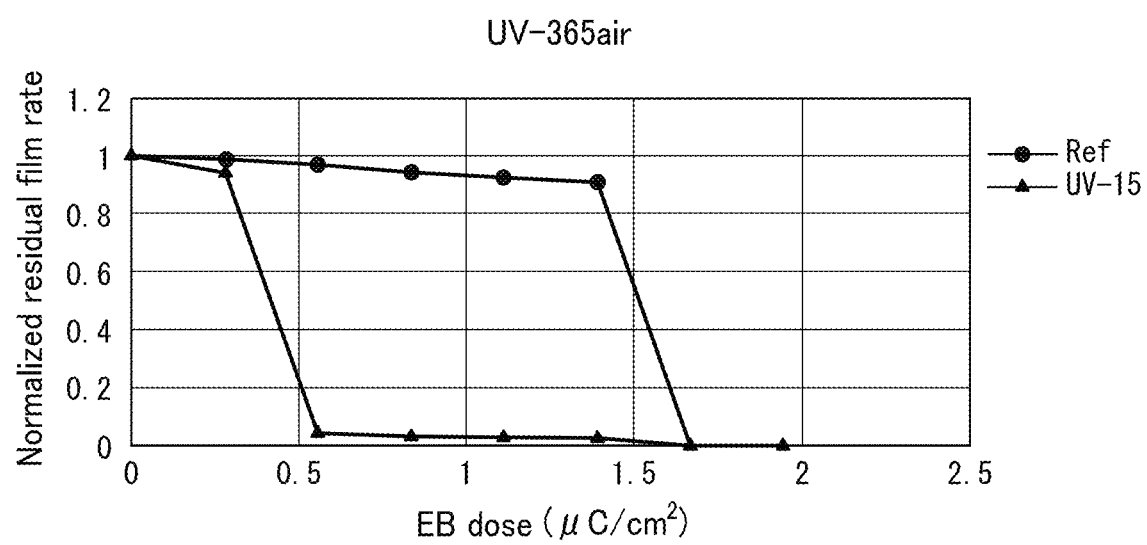
FIG. 48 is a graph showing sensitivity curves in Example 25.
Figure 49A:
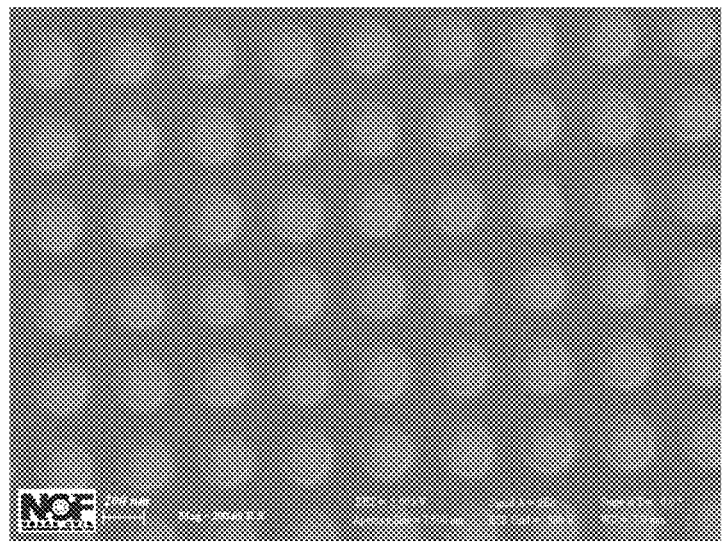
FIGS. 49A and 49B are diagrams showing results of developing in Example 26.
Figure 49B:
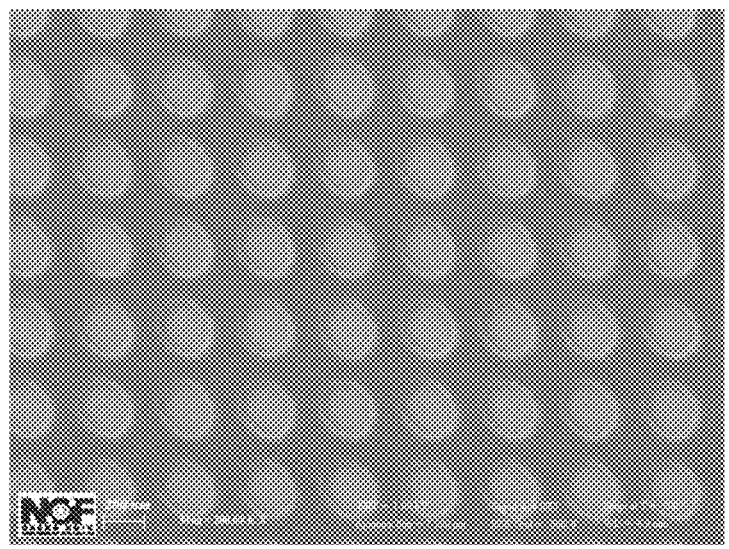
Figure 50A:
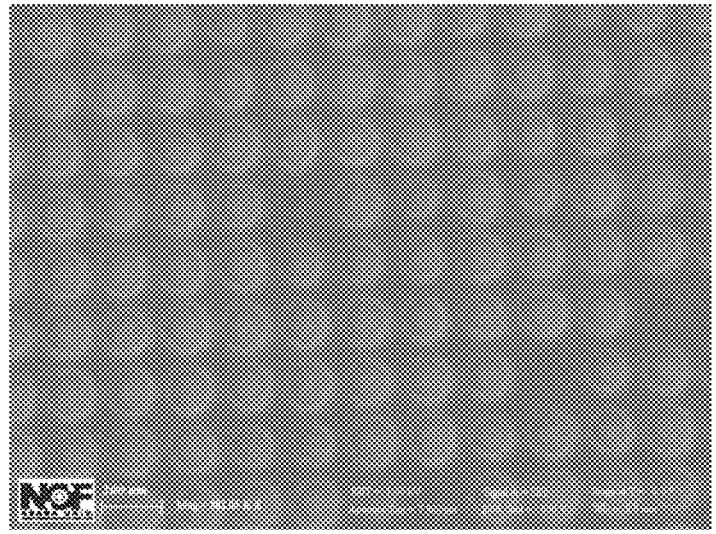
FIGS. 50A and 50B are diagrams showing results of developing in Example 26.
Figure 50B:
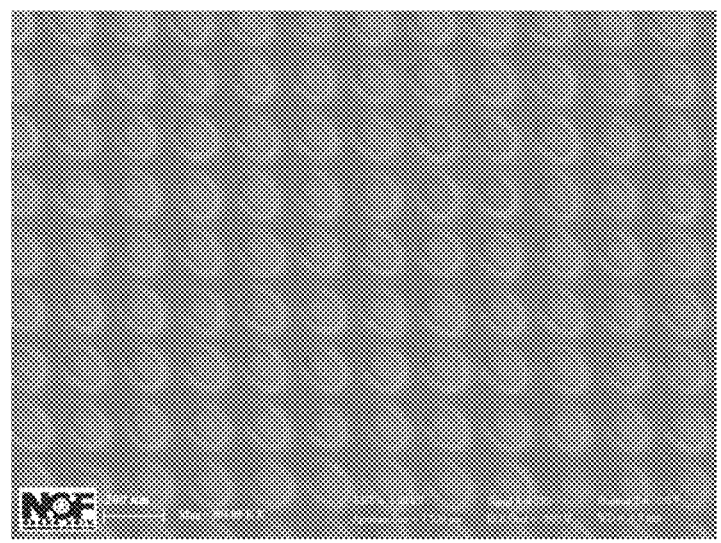

One or more samples were subjected to a thermal treatment at 100° C. for 1 minute after the activating step, and the resist layer thereof was developed at 24° C. for 1 minute with 2.38% TMAH as a developing solution in the developing step. FIG. 48 shows a curve of the sensitivity to the electron beam in the case where the whole-area exposure to the 365-nm ultraviolet from the LED light source was performed in vacuo.

Example 27

A resist layer prepared using the resist material of Example 25 was irradiated with an electron beam at an irradiation current of 20 pA and an acceleration voltage of 75 kV using a patterning device ELS-7700T (vector scanning) of ELIONIX INC. as an activating device in an activating step.

After the activating step was performed, the sample was maintained in vacuo. Subsequently, a latent pattern image forming step was performed in vacuo. In the latent pattern image forming step, whole-area ultraviolet exposure was performed for 15 minutes using a light source with 0.8 mW/h through a quartz window of SLUV-6 (365 nm), product of AS ONE Corporation, as a latent pattern image forming section.

After the latent image forming step, the sample was taken out into the atmosphere, and a thermal treatment was performed thereon at 100° C. for 1 minute. In a developing step, the resist layer was developed at 25° C. for 1 minute with 2.38% TMAH as a developing solution.

One or more samples were subjected to a thermal treatment at 100° C. for 1 minute after the activating step, and the resist layer thereof was developed at 25° C. for 1 minute with 2.38% TMAH as a developing solution in the developing step. FIGS. 49A and 49B, and 50A and 50B show SEM images taken after the patterning through the latent image forming step.

Example 28

A mixture obtained by adding 0.1 M of DOBzMM as a sensitizer precursor to a system obtained by adding 0.05 M of sulfonium salt-based PBpS-PFBS as a PAG to a methyl methacrylate-based polymer (hereinafter, referred to as "MMA") dissolved in cyclohexanone was prepared as a resist material of Example 28.

The resist material thus prepared was applied onto a HMDS-treated silicon substrate by spin coating at 4000 rpm for 120 seconds using a spin coater (Mikasa Co., Ltd.). The spin coating was followed by a thermal treatment at 110° C. for 1 minute.

The film thickness after the spin coating was measured using an AFM (NanoNavi II/SPA-300HV, Hitachi High-Tech Science) to be 49 nm.

In an activating step, the resist layer was irradiated with an electron beam at an irradiation current of 10 pA and an acceleration voltage of 75 kV using a patterning device ELS-7700T (vector scanning) of ELIONIX INC. as an activating device.

After the activating step was performed, the sample was maintained in vacuo. Subsequently, a latent pattern image forming step was performed in vacuo. In the latent pattern image forming step, whole-area ultraviolet exposure was performed for 10 minutes and 30 minutes using a light source with 0.8 mW/h through a quartz window of SLUV-6 (365 nm), product of AS ONE Corporation, as a latent pattern image forming section.

A thermal treatment was performed at 100° C. for 1 minute under a nitrogen stream after the latent image forming step, and the resist layer was developed at 25° C. for 1 minute with 2.38% TMAH as a developing solution in a developing step.

One or more samples were subjected to a thermal treatment at 100° C. for 1 minute after the activating step, and the resist layer thereof was developed at 25° C. for 1 minute with 2.38% TMAH as a developing solution in the developing step.

Figure 51:
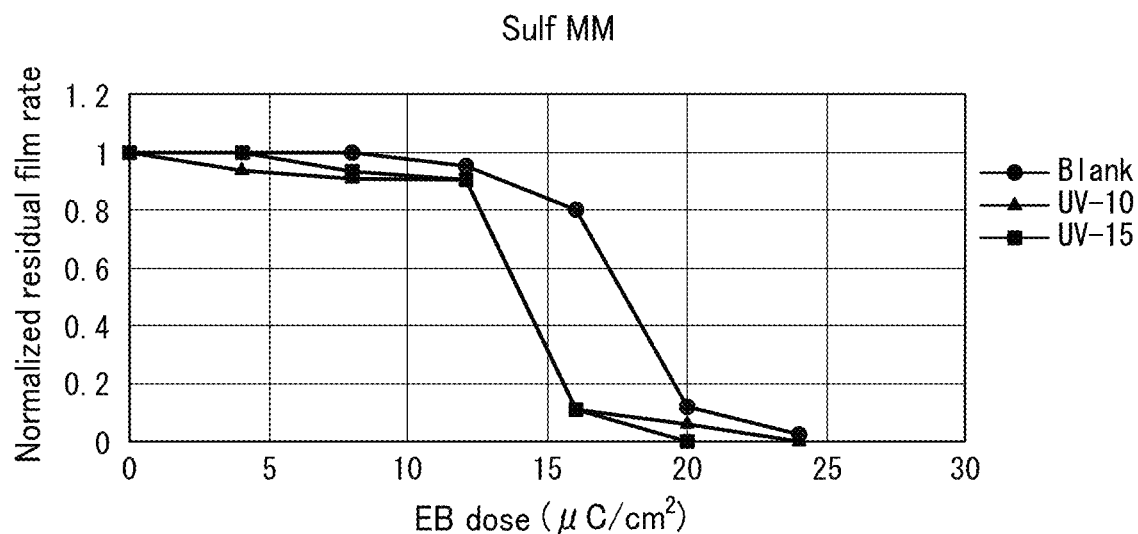
FIG. 51 is a graph showing sensitivity curves in Example 27.

FIG. 51 shows curves of the sensitivity to the electron beam in the case where the whole-area ultraviolet exposure was performed. FIG. 51 indicates that the dose representing the sensitivity $E_0$ of the resist material to the electron beam decreases with increase in the ultraviolet exposure dose.

Example 29

A mixture obtained by adding 0.05 M of DOBzMM and 0.05 M of TetraMeBzH as sensitizer precursors to a system obtained by adding 0.05 M of DPI-PFBS as a PAG to a methyl methacrylate-based polymer (hereinafter, referred to as "MMA") dissolved in cyclohexanone was prepared as a resist material of Example 29.

The resist material thus prepared was applied onto a HMDS-treated silicon substrate by spin coating at 4000 rpm for 120 seconds using a spin coater (Mikasa Co., Ltd.). The spin coating was followed by a thermal treatment at 100° C. for 1 minute.

The film thickness after the spin coating was measured using an AFM (NanoNavi II/SPA-300HV, Hitachi High-Tech Science) to be 60 nm.

In an activating step, the resist layer was irradiated with an electron beam at an irradiation current of 20 pA and an acceleration voltage of 30 keV using a patterning device JSM-6500F (with a beam blanker, raster scanning), product of JEOL Ltd., as an activating device.

After the activating step was performed, the resist layer was maintained in the atmosphere for 30 seconds as an interval. Subsequently, a latent pattern image forming step was performed. In the latent pattern image forming step, whole-area ultraviolet exposure was performed in the atmosphere for 3 minutes, 5 minutes, and 10 minutes using a light source with 0.7 mW/h and SLUV-6 (365 nm), product of AS ONE Corporation, as a latent pattern image forming section.

A thermal treatment was performed at 110° C. for 1 minute in the atmosphere after the latent image forming step, and the resist layer was developed at 24° C. for 1 minute with 2.38% TMAH as a developing solution in a developing step.

One or more samples were subjected to a thermal treatment at 100° C. for 1 minute after the activating step, and the resist layer thereof was developed at 24° C. for 1 minute with 2.38% TMAH as a developing solution in the developing step.

Figure 52:
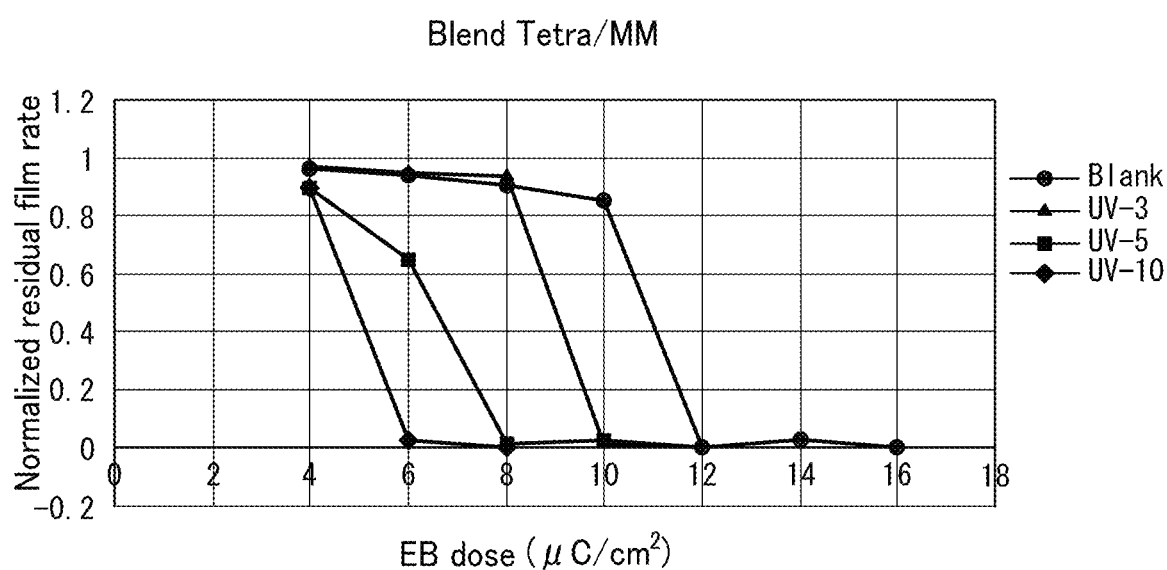
FIG. 52 is a graph showing sensitivity curves in Example 28.

FIG. 52 shows curves of the sensitivity to the electron beam in the case where the whole-area ultraviolet exposure was performed. FIG. 52 indicates that the dose representing the sensitivity $E_0$ of the resist material to the electron beam decreases with increase in the ultraviolet exposure dose.

Example 30

ZEP520A (product of Zeon Corporation) was employed for a resist layer. The film thickness of the resist layer (ZEP520A) was measured using an AFM to be 300 nm. In an activating step, the resist layer was irradiated with an electron beam at an irradiation current of 28 pA and an acceleration voltage of 30 kV using a patterning device JSM-6500F (with a beam blanker, raster scanning), product of JEOL Ltd., as an activating device.

After the activating step was performed, a latent pattern image forming step was performed. In the latent pattern image forming step, whole-area UV irradiation was performed for 15 minutes, 20 minutes, 30 minutes, and 60 minutes in the atmosphere only with light having a wavelength that is not absorbed by the resist (365 nm) obtained through a filter and using a light source with 0.7 mW/h, a black light SLUV-6, product of AS ONE Corporation, as a latent pattern image forming section. A sample that was not subjected to the UV exposure was also prepared in the same manner.

In a developing step, the resist layer was developed at 24° C. for 60 seconds with a developing solution ZED-N50 (product of Zeon Corporation).

Figure 53:
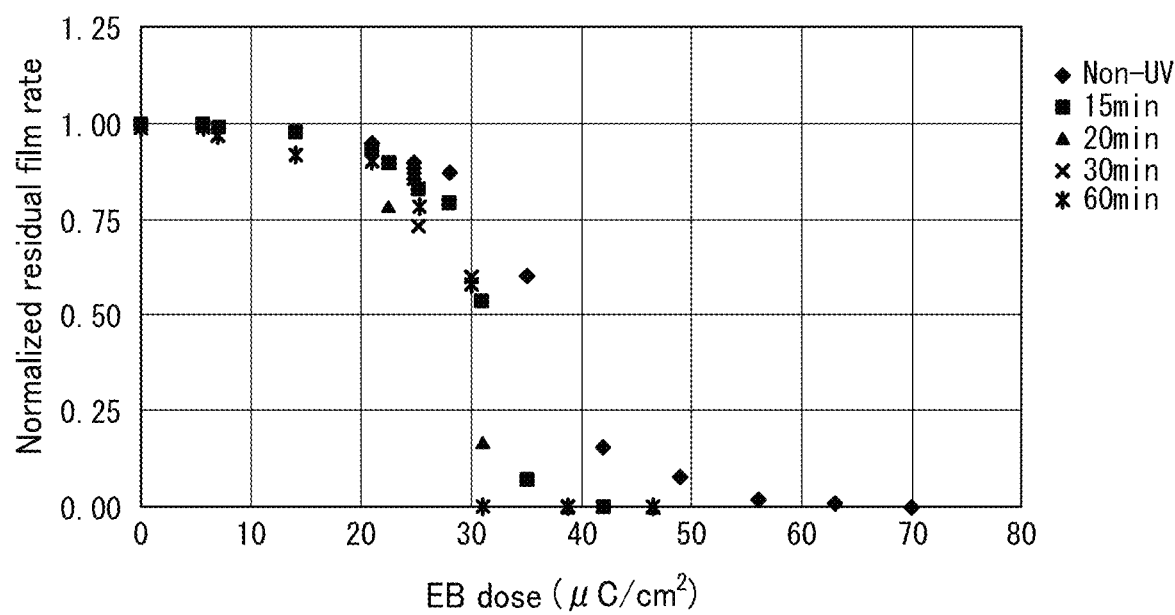
FIG. 53 is a graph showing sensitivity curves in Example 29.

FIG. 53 shows sensitivity curves in Example 30. The results of Example 30 indicate that the sensitivity was increased by approximately 30% by the UV exposure for approximately 15 minutes compared to the patterning by a single patterned exposure although the UV light had a wavelength that does not induce a reaction in the conventional art.

Example 31

ZEP520A (product of Zeon Corporation) was employed for a resist layer. The film thickness of the resist layer (ZEP520A) was measured using an AFM to be 50 nm. In an activating step, the resist layer was irradiated with an electron beam at an irradiation current of 30 pA and an acceleration voltage of 30 kV using a patterning device JSM-6500F (with a beam blanker, raster scanning), product of JEOL Ltd., as an activating device.

After the activating step was performed, a latent pattern image forming step was performed. In the latent pattern image forming step, whole-area UV irradiation was performed in the atmosphere for 15 minutes only with light having a wavelength that is not absorbed by the resist (365 nm) obtained through a filter and using a light source with 0.7 mW/h, a black light SLUV-6, product of AS ONE Corporation, as a latent pattern image forming section. A sample that was not subjected to the UV exposure was also prepared in the same manner.

Figure 54A:
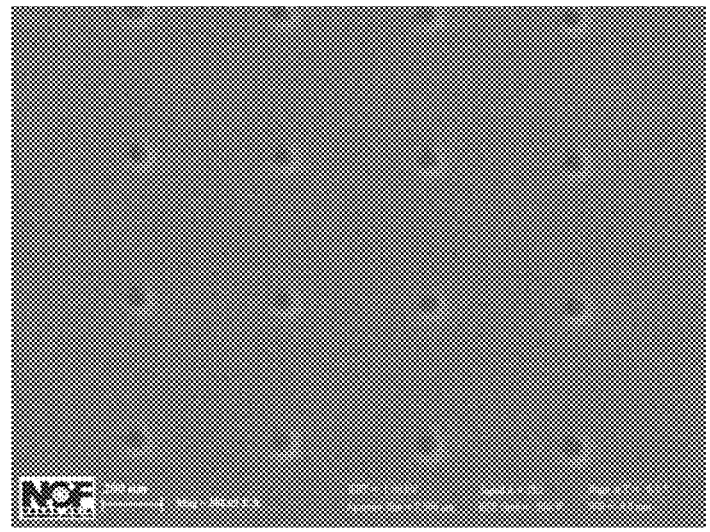
FIGS. 54A and 54B are diagrams showing results of developing in Example 30.
Figure 54B:
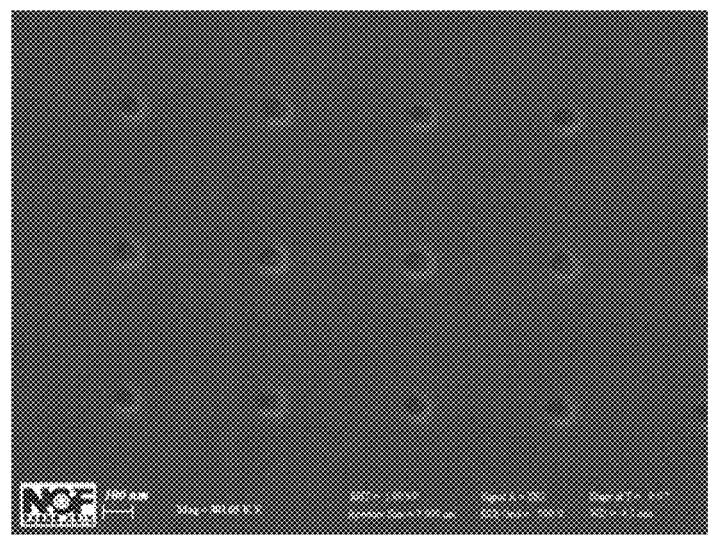

In a developing step, the resist layer was developed at 13° C. for 60 seconds with a developing solution ZED-N50 (product of Zeon Corporation). FIGS. 54A and 54B show SEM images of resulting processed patterns.

Example 32

ZEP520A (product of Zeon Corporation) was employed for a resist layer. The film thickness of the resist layer (ZEP520A) was measured using an AFM to be 50 nm. In an activating step, the resist layer was irradiated with an electron beam at an irradiation current of 100 pA and an acceleration voltage of 75 kV using a patterning device ELS-7700T (vector scanning) of ELIONIX INC. as an activating device.

After the activating step was performed, a latent pattern image forming step was performed. In the latent pattern image forming step, whole-area UV irradiation was performed in the atmosphere for 15 minutes only with light having a wavelength that is not absorbed by the resist (365 nm) obtained through a filter and using a light source with 0.7 mW/h, a black light SLUV-6, product of AS ONE Corporation, as a latent pattern image forming section. A sample that was not subjected to the UV exposure was also prepared in the same manner.

Figure 55A:
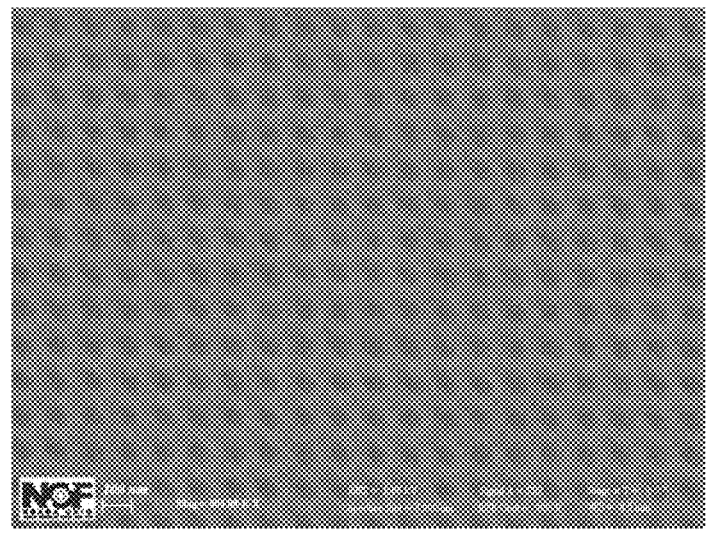
FIGS. 55A and 55B are diagrams showing results of developing in Example 31.
Figure 55B:
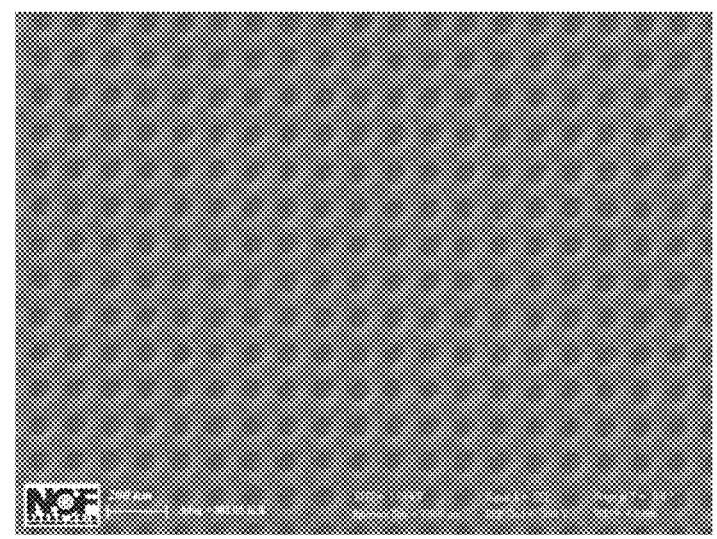

In a developing step, the resist layer was developed at 13° C. for 60 seconds with a developing solution ZED-N50 (product of Zeon Corporation). FIGS. 55A and 55B show SEM images of resulting processed patterns.

Example 33

A system obtained by adding 0.05 M of an acid generator to a methyl methacrylate-based polymer was prepared as a resist material for the novel process. The film thickness of the resulting resist layer was measured with an AFM to be 70 nm. An LED light element was incorporated into a vacuum/inert-gas-environment irradiation chamber in an electron beam exposure device (EB-engine) of Hamamatsu Photonics, and thus the device was modified into a combined exposure device capable of simultaneous irradiation with 365-nm light and an electron beam.

The resist layer was irradiated with an electron beam at an irradiation current of 5 pA/cm$^2$ and an acceleration voltage of 100 kV, and further irradiated with 365-nm UV light at a power of 0.91 mW/h through a stencil mask (72 μm square) in vacuo using the above-mentioned electron beam as an activating device in an activating step and the 365-nm LED light as a latent pattern image forming device. Thus, the activating step and a latent pattern image forming step were performed.

In a developing step, the resist layer was developed at 24° C. for 60 seconds with 2.38% TMAH as a developing solution. The dose of the electron beam and the film thickness in Example 33 are shown in a table.

TABLE 3

| | Exposure dose (μC/cm²) | | | | | | | |
|---|---|---|---|---|---|---|---|---|
| | 1 | 2 | 3 | 4 | 5 | 6 | 7 | 8 |
| Normalized thickness | 1 | 1 | 0.99 | 0.82 | 0.13 | 0 | 0 | 0 |

A sample that was not subjected to the irradiation with the 365-nm UV light was also prepared for reference. The exposure dose of the electron beam and the film thickness thereof is shown.

TABLE 4

| | Exposure dose (μC/cm²) | | | | | | | |
|---|---|---|---|---|---|---|---|---|
| | 4 | 8 | 10 | 12 | 14 | 16 | 18 | 20 |
| Normalized thickness | 1 | 1 | 0.93 | 0.91 | 0.77 | 0.21 | 0.13 | 0 |

The results of Example 33 indicate that the sensitivity of the sample that was subjected to the simultaneous UV irradiation was approximately four times as high as that of the sample (reference) that was not subjected to the simultaneous UV irradiation.

So far, the embodiments according to the present invention have been described with reference to FIGS. 1A-55B. According to the embodiments of the present invention, the throughput in the exposure process can be improved, and significant cost reduction for the exposure system can be achieved while maintaining the pattern resolution. Furthermore, since a low-power light source can be used, the lives of consumable parts of the light source device and the exposure device can be extended, and the maintenance cost and the operation cost can be significantly reduced.

INDUSTRIAL APPLICABILITY

The resist patterning methods, the latent resist image forming devices, the resist patterning devices, and the resist materials according to the present invention are suitably used in an exposure process of forming a resist pattern on a substrate. According to the resist patterning methods, the latent resist image forming devices, the resist patterning devices, and the resist materials according to the present invention, increased resist sensitivity can be achieved.

REFERENCE SIGNS LIST

11 Substrate
12 Resist layer
121 First exposed portion
122 Second exposed portion
21 Activating energy source
22 Latent image forming energy source

The invention claimed is:

1. A resist patterning method comprising:
    forming a resist layer on a substrate, the resist layer including a resist composition containing a sensitizer precursor;
    irradiating the resist layer with an activating energy beam to produce a sensitizer from the sensitizer precursor;
    forming a latent pattern image in the resist layer by promoting a resist reaction in a manner to cause both a first transition from a non-excited state to an excited state and a second transition from the excited state to the non-excited state through irradiation of the resist layer containing the produced sensitizer with a latent image forming energy beam, the excited state being a state in which the sensitizer is excited by the latent image forming energy beam; and
    developing the resist layer having the latent pattern image formed therein.

2. The resist patterning method of claim 1, wherein
    the latent image forming energy beam is set such that irradiation with the latent image forming energy beam does not produce the sensitizer unless preceded by the irradiating the resist layer with the activating energy beam.

3. The resist patterning method of claim 1, wherein
    in the forming a resist layer, the sensitizer precursor includes at least one selected from the group consisting of bis(4-methoxyphenyl)methanol (DOMeBzH), a dimethoxy benzhydrol derivative (DOBzMM), and trimethoxy benzhydrol (TriOMeBzH).

4. The resist patterning method of claim 1, wherein
    in the forming a latent pattern image, the latent image forming energy beam has a longer wavelength than the activating energy beam.

5. The resist patterning method of claim 1, wherein
    in the irradiating the resist layer, the activating energy beam is an electron beam, an ion beam, or electromagnetic waves including ultraviolet rays, deep ultraviolet rays, extreme ultraviolet rays, or X-rays, and
    in the forming a latent pattern image, the latent image forming energy beam is visible light or ultraviolet light.

6. The resist patterning method of claim 1, wherein
    in the irradiating the resist layer with the activating energy beam, an acid and the sensitizer are produced.

7. The resist patterning method of claim 1, wherein
    in the irradiating the resist layer with the activating energy beam, the sensitizer is produced without production of an acid.

8. The resist patterning method of claim 1, wherein
    in the forming a latent pattern image through irradiation with the latent image forming energy beam, an acid is produced.

9. The resist patterning method of claim 1, wherein
    in the forming a latent pattern image through irradiation with the latent image forming energy beam, an acid and the sensitizer are produced.

10. The resist patterning method of claim 1, wherein
    in the forming a latent pattern image through irradiation with the latent image forming energy beam, an acid is produced without production of the sensitizer.

11. The resist patterning method of claim 1, wherein
    the irradiating the resist layer with the activating energy beam includes producing an active species in the resist layer, and
    the resist patterning method further comprises inhibiting decay of the active species produced in the resist layer.

12. The resist patterning method of claim 1, wherein
    in the forming a latent pattern image, the latent pattern image is formed in the resist layer through irradiation with the latent image forming energy beam in presence of an active species produced in the resist layer.

13. The resist patterning method of claim 1, wherein in the irradiating the resist layer with the activating energy beam, the sensitizer precursor functions as an acid generator.

14. The resist patterning method of claim 1, wherein
the sensitizer precursor functions as an acid generator,
in the irradiating the resist layer with the activating energy beam, an electron is produced, and
the sensitizer precursor reacts with the electron to produce the sensitizer and an acid.

15. The resist patterning method of claim 1, wherein
the resist composition further contains an acid generator,
in the irradiating the resist layer with the activating energy beam, an electron is produced,
the acid generator reacts with the electron to produce a radical, and
the radical reacts with the sensitizer precursor to produce the sensitizer.

16. The resist patterning method of claim 1, wherein
the resist composition further contains an acid generator,
in the irradiating the resist layer with the activating energy beam, an acid from the acid generator is produced, and
the acid reacts with the sensitizer precursor to produce the sensitizer.

17. The resist patterning method of claim 1, wherein
the irradiating the resist layer with the activating energy beam and the forming a latent pattern image through irradiation with the latent image forming energy beam are performed at the same time.

18. The resist patterning method of claim 1, wherein
a latent image forming energy source of the latent image forming energy beam in the forming a latent pattern image is the same as an activating energy source of the activating energy beam in the irradiating a resist layer.

19. The resist patterning method of claim 1, wherein
a latent image forming energy source of the latent image forming energy beam in the forming a latent pattern image is different from an activating energy source of the activating energy beam in the irradiating a resist layer.

* * * * *